United States Patent
Kamuro et al.

(10) Patent No.: US 9,447,277 B2
(45) Date of Patent: Sep. 20, 2016

(54) CURABLE RESIN COMPOSITION AND CURED PRODUCT THEREOF, ENCAPSULATING AGENT, AND OPTICAL SEMICONDUCTOR DEVICE

(71) Applicant: DAICEL CORPORATION, Osaka-shi, Osaka (JP)

(72) Inventors: Shigeaki Kamuro, Himeji (JP); Akihiro Kuwana, Himeji (JP); Nobuhiko Harada, Himeji (JP)

(73) Assignee: DAICEL CORPORATION, Osaka (JP)

( * ) Notice: Subject to any disclaimer, the term of this patent is extended or adjusted under 35 U.S.C. 154(b) by 0 days.

(21) Appl. No.: 14/395,016

(22) PCT Filed: May 17, 2013

(86) PCT No.: PCT/JP2013/064425
§ 371 (c)(1),
(2) Date: Oct. 16, 2014

(87) PCT Pub. No.: WO2013/176238
PCT Pub. Date: Nov. 28, 2013

(65) Prior Publication Data
US 2015/0126700 A1    May 7, 2015

(30) Foreign Application Priority Data
May 25, 2012   (JP) ................. 2012-120315

(51) Int. Cl.
| | |
|---|---|
| C08L 83/04 | (2006.01) |
| H01L 23/29 | (2006.01) |
| C09K 3/10 | (2006.01) |
| H01L 33/56 | (2010.01) |
| C08K 5/5425 | (2006.01) |
| C08G 77/12 | (2006.01) |
| C08G 77/20 | (2006.01) |
| C08K 5/3492 | (2006.01) |
| C08G 77/50 | (2006.01) |

(52) U.S. Cl.
CPC ............... *C08L 83/04* (2013.01); *C09K 3/10* (2013.01); *H01L 23/296* (2013.01); *H01L 33/56* (2013.01); *C08G 77/12* (2013.01); *C08G 77/20* (2013.01); *C08G 77/50* (2013.01); *C08G 2190/00* (2013.01); *C08K 5/34924* (2013.01); *C08K 5/5425* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,910,563 | A * | 6/1999 | Jones ................. | C08G 18/4236 428/480 |
| 2005/0238898 | A1* | 10/2005 | Wind .................... | C08G 63/48 428/480 |
| 2011/0297209 | A1 | 12/2011 | Yamakawa et al. | |
| 2012/0083572 | A1* | 4/2012 | Klots ....................... | C08F 8/04 524/576 |
| 2013/0131264 | A1 | 5/2013 | Nishimiya et al. | |
| 2013/0131265 | A1 | 5/2013 | Inoue et al. | |
| 2013/0237663 | A1* | 9/2013 | Tanaka et al. ............... | 524/588 |
| 2014/0332987 | A1* | 11/2014 | Kamuro .................. | C08L 83/06 257/791 |

FOREIGN PATENT DOCUMENTS

| | | |
|---|---|---|
| EP | 2 392 626 A1 | 12/2011 |
| JP | 2002-314140 A | 10/2002 |
| JP | 2007-31619 A | 2/2007 |
| JP | 2011-254009 A | 12/2011 |
| JP | 2012/12556 A | 1/2012 |
| JP | 2012-77142 A | 4/2012 |
| JP | 2012-97225 A | 5/2012 |
| JP | 2013-144757 A | 7/2013 |
| WO | WO 2012/039322 | * 3/2012 |
| WO | WO 2012/060322 | * 5/2012 |

OTHER PUBLICATIONS

International Search Report, mailed Aug. 27, 2013, issued in PCT/JP2013/064425.

* cited by examiner

*Primary Examiner* — Marc Zimmer
(74) *Attorney, Agent, or Firm* — Birch, Stewart, Kolasch & Birch, LLP

(57) ABSTRACT

Provided is a curable resin composition capable of forming a cured product that excels in heat resistance, transparency, and flexibility and particularly excels in barrier properties against a corrosive gas (e.g., sulfur oxide).
The curable resin composition includes a compound (U) containing an aliphatic carbon-carbon unsaturated bond and a compound (H) containing a hydrosilyl group and includes at least one of a ladder-type silsesquioxane [A1] and a ladder-type silsesquioxane [A2], where the ladder-type silsesquioxane [A1] contains an aliphatic carbon-carbon unsaturated bond and has a number-average molecular weight of 500-1500 and a molecular weight dispersity (Mw/Mn) of 1.00-1.40 as determined by gel permeation chromatography and calibrated with a polystyrene standard, and the ladder-type silsesquioxane [A2] contains a hydrosilyl group and has a number-average molecular weight of 500-1500 and a molecular weight dispersity (Mw/Mn) of 1.00-1.40 as determined by gel permeation chromatography and calibrated with a polystyrene standard.

23 Claims, 3 Drawing Sheets

| GRADE | ELECTRODE APPEARANCE (MODEL) |
|---|---|
| A (NO COLOR CHANGE) |  |
| B (VERY SLIGHT COLOR CHANGE) |  |
| C (SLIGHT COLOR CHANGE) |  |
| D (COLOR CHANGE) |  |

CURABLE RESIN COMPOSITION AND CURED PRODUCT THEREOF, ENCAPSULATING AGENT, AND OPTICAL SEMICONDUCTOR DEVICE

TECHNICAL FIELD

The present invention relates to curable resin compositions and cured products thereof, encapsulating agents including the curable resin compositions, and optical semiconductor devices including optical semiconductor elements encapsulated with the encapsulating agents.

BACKGROUND ART

Materials that are resistant to heat at 150° C. or higher are demanded for covering or encapsulating semiconductor elements to form semiconductor devices of high heat resistance and high breakdown voltage. Among them, materials (encapsulants) for encapsulating optical materials such as optical semiconductor elements are demanded to excel also in properties such as transparency and flexibility, in addition to the heat resistance. Silicon-containing materials such as phenylsilicones are currently more and more used as encapsulants typically in backlight units of liquid crystal displays.

Patent Literature (PTL) 1 discloses a resin composition for optical element encapsulation, where the resin composition excels in transparency, ultraviolet resistance, and thermal coloration resistance. The resin composition contains, as a resin component, at least one silsesquioxane selected from the group consisting of liquid silsesquioxanes having a cage-like structure, containing an aliphatic carbon-carbon unsaturated bond, and being devoid of H—Si bonds; and liquid silsesquioxanes having a cage-like structure, containing a H—Si bond, and being devoid of aliphatic carbon-carbon unsaturated bonds. Unfortunately, however, the resin composition containing such a cage-like silsesquioxane gives a cured product that is relatively hard, has poor flexibility, and is susceptible to cracking or fracture.

PTL 2 discloses a curable composition that contains, as essential components, triallyl isocyanurate or another organic compound containing at least two carbon-carbon double bonds per molecule, where the carbon-carbon double bonds are reactive with a SiH group; a compound containing at least two SiH groups per molecule, such as a chain and/or cyclic polyorganosiloxane; and a hydrosilylation catalyst. These materials, however, are still insufficient in properties such as cracking resistance.

CITATION LIST

Patent Literature

PTL 1: Japanese Unexamined Patent Application Publication (JP-A) No. 2007-031619
PTL 2: JP-A No. 2002-314140

SUMMARY OF INVENTION

Technical Problem

Encapsulants for optical semiconductor elements further require high barrier properties against corrosive gases such as SOx gases. This is because metal materials such as electrodes in optical semiconductor devices are readily corroded by the corrosive gases, and such corrosion disadvantageously cause the optical semiconductor devices to deteriorate in electrical properties (e.g., electrical properties in high-temperature environments) with time. Disadvantageously, the phenylsilicone encapsulants widely used as encapsulants for optical semiconductor elements are insufficient particularly in the barrier properties against corrosive gases.

Accordingly, an object of the present invention is to provide a curable resin composition capable of forming a cured product that is a material (silicon-based material) excellent in heat resistance, transparency, and flexibility and particularly excellent in barrier properties against a corrosive gas (e.g., a sulfur oxide).

Another object of the present invention is to provide a material (cured product) that excels in heat resistance, transparency, and flexibility and excels particularly in barrier properties against a corrosive gas (e.g., a sulfur oxide).

Yet another object of the present invention is to provide: an encapsulating agent including the curable resin composition; and an optical semiconductor device including an optical semiconductor element encapsulated with the encapsulating agent.

Solution to Problem

The inventors have found that a specific curable resin composition can form a cured product particularly excellent in barrier properties against a corrosive gas (particularly a sulfur oxide), where the curable resin composition includes, as an essential component, a polyorganosilsesquioxane having a specific structure and having a molecular weight and a molecular weight dispersity controlled within specific ranges. The present invention has been made based on these findings.

Specifically, the present invention provides, in an aspect, a curable resin composition including: a compound (U) containing an aliphatic carbon-carbon unsaturated bond; and a compound (H) containing a hydrosilyl group, in which:

the compound (U) is at least one compound selected from the group consisting of: a ladder-type silsesquioxane [A1] containing an aliphatic carbon-carbon unsaturated bond and having a number-average molecular weight from 500 to 1500 and a molecular weight dispersity (Mw/Mn) from 1.00 to 1.40 as determined by gel permeation chromatography and calibrated with a polystyrene standard; a ladder-type silsesquioxane [B1] containing an aliphatic carbon-carbon unsaturated bond, other than the ladder-type silsesquioxane [A1]; a linear or branched silicone [C1] containing an aliphatic carbon-carbon unsaturated bond; and a cyclic siloxane [E1] containing an aliphatic carbon-carbon unsaturated bond;

the compound (H) is at least one compound selected from the group consisting of: a ladder-type silsesquioxane [A2] containing a hydrosilyl group and having a number-average molecular weight from 500 to 1500 and a molecular weight dispersity (Mw/Mn) from 1.00 to 1.40 as determined by gel permeation chromatography and calibrated with a polystyrene standard; a ladder-type silsesquioxane [B2] containing a hydrosilyl group, other than the ladder-type silsesquioxane [A2]; a linear or branched silicone [C2] containing a hydrosilyl group; and a cyclic siloxane [E2] containing a hydrosilyl group; and the composition includes at least one of the ladder-type silsesquioxane [A1] and the ladder-type silsesquioxane [A2].

The ladder-type silsesquioxane [B1] in the curable resin composition may be a ladder-type silsesquioxane containing a polyorganosilsesquioxane residue in part or all of molecular chain terminals of the ladder-type silsesquioxane, where the polyorganosilsesquioxane residue includes a unit structure represented by Formula (b-1) and a unit structure represented by formula (b-2):

[Chem. 1]

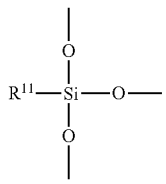

(b-1)

wherein $R^{11}$ represents a monovalent group containing an aliphatic carbon-carbon double bond;

[Chem. 2]

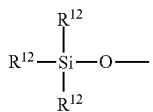

(b-2)

wherein $R^{12}$ represents, in each occurrence identically or differently, a monovalent hydrocarbon group.

The ladder-type silsesquioxane [B2] in the curable resin composition may be a ladder-type silsesquioxane containing a polyorganosilsesquioxane residue in part or all of molecular chain terminals of the ladder-type silsesquioxane, where the polyorganosilsesquioxane residue includes a unit structure represented by Formula (b-3) and a unit structure represented by Formula (b-4):

[Chem. 3]

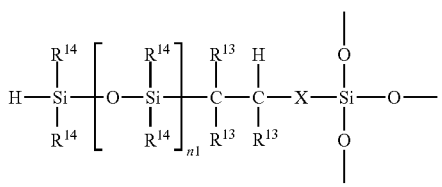

(b-3)

wherein X is selected from a single bond and a linkage group; $R^{13}$ is, in each occurrence identically or differently, selected from a hydrogen atom, a halogen atom, a monovalent organic group, a monovalent oxygen-containing group, a monovalent nitrogen-containing group, and a monovalent sulfur-containing group; $R^{14}$ is, in each occurrence identically or differently, selected from a hydrogen atom, a halogen atom, a monovalent organic group, a monovalent oxygen-containing group, a monovalent nitrogen-containing group, and a monovalent sulfur-containing group; and n1 represents an integer from 1 to 100;

[Chem. 4]

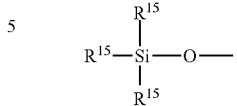

(b-4)

wherein $R^{15}$ represents, in each occurrence identically or differently, a monovalent hydrocarbon group.

The silicone [C1] in the curable resin composition may be a silicone including a structure represented by Formula (c-1a)

[Chem. 5]

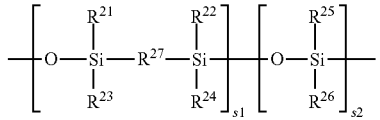

(c-1a)

wherein $R^{21}$ to $R^{26}$ are, in each occurrence identically or differently, selected from a hydrogen atom, a monovalent hydrocarbon group, and a monovalent heterocyclic group, where at least one occurrence of at least one of $R^{21}$ to $R^{26}$ is a monovalent group containing an aliphatic carbon-carbon unsaturated bond; $R^{27}$ represents, in each occurrence independently, a divalent hydrocarbon group; and s1 and s2 independently represent an integer of 1 or more.

The silicone [C2] in the curable resin composition may be a silicone including a structure represented by Formula (c-1b):

[Chem. 6]

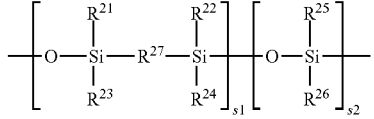

(c-1b)

wherein $R^{21}$ to $R^{26}$ are, in each occurrence identically or differently, selected from a hydrogen atom, a monovalent hydrocarbon group, and a monovalent heterocyclic group, where at least one occurrence of at least one of $R^{21}$ to $R^{26}$ is a hydrogen atom; $R^{27}$ represents, in each occurrence independently, a divalent hydrocarbon group; and s1 and s2 independently represent an integer of 1 or more.

The curable resin composition may further contain a condensation compound [F] of a compound represented by Formula (f-1) with a compound represented by Formula (f-2):

[Chem. 7]

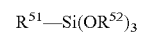

$R^{51}$—Si(OR$^{52}$)$_3$ (f-1)

wherein $R^{51}$ and $R^{52}$ represent, in each occurrence identically or differently, a monovalent hydrocarbon group;

[Chem. 8]

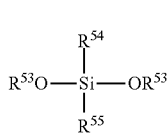
(f-2)

wherein $R^{53}$ and $R^{54}$ represent, in each occurrence identically or differently, a monovalent hydrocarbon group; and $R^{55}$ represents a monovalent group containing an aliphatic carbon-carbon unsaturated bond.

The curable resin composition may further contain a hydrosilylation catalyst.

The curable resin composition may further contain an isocyanuric acid compound [D] represented by Formula (d-1):

[Chem. 9]

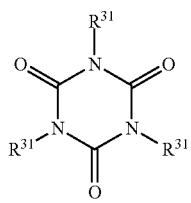
(d-1)

wherein $R^{31}$ represents, in each occurrence identically or differently, a monovalent organic group having a carbon atom at a bonding site with the nitrogen atom indicated in the formula.

The isocyanuric acid compound [D] in the curable resin composition may be at least one compound selected from the group consisting of:

compounds represented by Formula (d-2):

[Chem. 10]

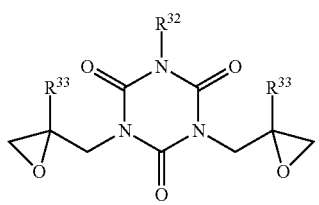
(d-2)

wherein $R^{32}$ represents a monovalent group containing an aliphatic carbon-carbon unsaturated bond; and $R^{33}$ is, in each occurrence identically or differently, selected from a hydrogen atom and a $C_1$-$C_8$ linear or branched alkyl group; compounds represented by Formula (d-3):

[Chem. 11]

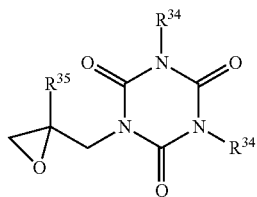
(d-3)

wherein $R^{34}$ represents, in each occurrence identically or differently, a monovalent group containing an aliphatic carbon-carbon unsaturated bond; and $R^{35}$ is selected from a hydrogen atom and a $C_1$-$C_8$ linear or branched alkyl group; and compounds represented by Formula (d-4):

[Chem. 12]

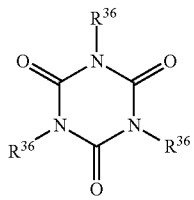
(d-4)

wherein $R^{36}$ represents, in each occurrence identically or differently, a monovalent group containing an aliphatic carbon-carbon unsaturated bond.

The isocyanuric acid compound [D] in the curable resin composition may be at least one compound selected from the group consisting of: monoallyl diglycidyl isocyanurate, 1-allyl-3,5-bis(2-methylepoxypropyl)-isocyanurate, 1-(2-methylpropenyl)-3,5-diglycidyl-isocyanurate, 1-(2-methylpropenyl)-3,5-bis(2-methylepoxypropyl)-isocyanurate, diallyl monoglycidyl isocyanurate, 1,3-diallyl-5-(2-methylepoxypropyl)-isocyanurate, 1,3-bis(2-methylpropenyl)-5-glycidyl-isocyanurate, 1,3-bis(2-methylpropenyl)-5-(2-methylepoxypropyl)-isocyanurate, triallyl isocyanurate, tris(2-methylpropenyl) isocyanurate, triglycidyl isocyanurate, dimethyl allyl isocyanurate, methyl diallyl isocyanurate, ethyl diallyl isocyanurate, propyl diallyl isocyanurate, butyl diallyl isocyanurate, phenyl diallyl isocyanurate, and a compound represented by Formula (d-9):

[Chem. 13]

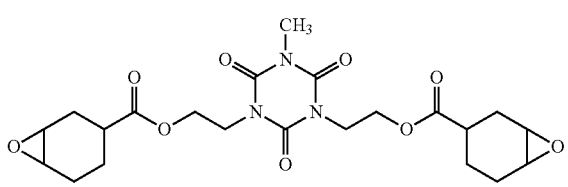
(d-9)

The curable resin composition may further contain a silane coupling agent.

The curable resin composition may be a resin composition for optical semiconductor encapsulation.

The present invention provides, in another aspect, a cured product of the curable resin composition.

The present invention provides, in yet another aspect, an encapsulating agent including the curable resin composition.

In addition and advantageously, the present invention provides an optical semiconductor device including an optical semiconductor element encapsulated with the encapsulating agent.

Advantageous Effects of Invention

The curable resin composition according to an embodiment of the present invention has the configuration and can form a cured product (silicon-based material) that excels in heat resistance, transparency, and flexibility. Particularly, the cured product offers excellent barrier properties against a corrosive gas (e.g., a $SO_X$ gas). The curable resin composition according to the present invention is preferably usable as a resin composition for optical semiconductor encapsulation, specifically, as an encapsulating agent for encapsulation of an optical semiconductor element (light-emitting diode (LED)). An optical semiconductor device obtained by encapsulating the optical semiconductor element using the encapsulating agent has excellent quality and durability. In particular, the curable resin composition according to the present invention is useful typically as an encapsulating agent for a next-generation light source that requires resistance to heat at an unprecedentedly high temperature (e.g., 180° C. or higher). In an embodiment, the curable resin composition according to the present invention has a specific configuration. A cured product obtained by curing this curable resin composition exhibits excellent thermal shock resistance. The "thermal shock resistance" refers to a property that resists cracking upon the application of a thermal shock such as a temperature cycle.

DESCRIPTION OF EMBODIMENTS

Curable Resin Composition

Figure 1:
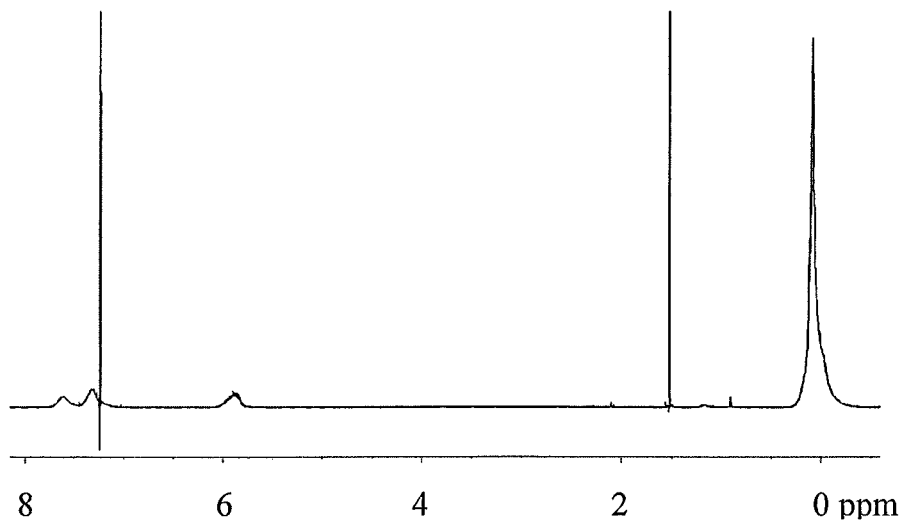
FIG. 1 depicts a $^1$H-NMR spectrum chart of a ladder-type phenylmethylvinylsilsesquioxane containing a vinyl group and a terminal trimethylsilyl group, where this compound was used to produce a ladder-type silsesquioxane containing a terminal SiH-containing group and a terminal TMS group in Production Example 1.

The curable resin composition according to the present invention is a composition including at least a compound (H) and a compound (U). The "compound (H)" refers to a compound containing a hydrosilyl group. The "compound (U)" refers to a compound containing an aliphatic carbon-carbon unsaturated bond. In the curable resin composition according to the present invention, the compound (U) is at least one compound selected from the group consisting of an after-mentioned ladder-type silsesquioxane [A1], a ladder-type silsesquioxane [B1] containing an aliphatic carbon-carbon unsaturated bond, other than the ladder-type silsesquioxane [A1], a linear or branched silicone [C1] containing an aliphatic carbon-carbon unsaturated bond, and a cyclic siloxane [E1] containing an aliphatic carbon-carbon unsaturated bond; and the compound (H) is at least one compound selected from the group consisting of an after-mentioned ladder-type silsesquioxane [A2], a ladder-type silsesquioxane [B2] containing a hydrosilyl group, other than the ladder-type silsesquioxane [A2], a linear or branched silicone [C2] containing a hydrosilyl group, and a cyclic siloxane [E2] containing a hydrosilyl group. The curable resin composition according to the present invention essentially includes at least one of (either one or both of) the ladder-type silsesquioxane [A1] and the ladder-type silsesquioxane [A2] as follows.

The ladder-type silsesquioxane [A1] is a ladder-type silsesquioxane containing an aliphatic carbon-carbon unsaturated bond and having a number-average molecular weight from 500 to 1500 and a molecular weight dispersity (Mw/Mn) from 1.00 to 1.40 as determined by gel permeation chromatography and calibrated with a polystyrene standard.

The ladder-type silsesquioxane [A2] is a ladder-type silsesquioxane containing a hydrosilyl group and having a number-average molecular weight from 500 to 1500 and a molecular weight dispersity (Mw/Mn) from 1.00 to 1.40 as determined by gel permeation chromatography and calibrated with a polystyrene standard.

Preferred embodiments of the curable resin composition according to the present invention will be illustrated below. It should be noted, however, the curable resin composition according to the present invention is not limited to the specific embodiments.

First Embodiment

Curable resin compositions containing at least the ladder-type silsesquioxanes [A1] and [A2] as the compounds (U) and (H), respectively.

Second Embodiment

Curable resin compositions containing at least the ladder-type silsesquioxanes [B1] and [A2] as the compounds (U) and (H), respectively.

Third Embodiment

Curable resin compositions containing at least the ladder-type silsesquioxane [A1] and [B2] as the compounds (U) and (H), respectively.

Fourth Embodiment

Curable resin compositions containing at least the silicone [C1] and the ladder-type silsesquioxane [A2] as the compounds (U) and (H), respectively.

Fifth Embodiment

Curable resin compositions containing at least the ladder-type silsesquioxane [A1] and the silicone [C2] as the compounds (U) and (H), respectively.

Sixth Embodiment

Curable resin compositions containing at least the cyclic siloxane [E1] and the ladder-type silsesquioxane [A2] as the compounds (U) and (H), respectively.

Seventh Embodiment

Curable resin compositions containing at least the ladder-type silsesquioxane [A1] and the cyclic siloxane [E2] as the compounds (U) and (H), respectively.

As used herein, the ladder-type silsesquioxanes [A1] and [A2] are also generically referred to as a "polyorganosilsesquioxane [A]". The ladder-type silsesquioxanes [B1] and [B2] are also generically referred to as a "ladder-type silsesquioxane [B]". The silicones [C1] and [C2] are also generically referred to as a "silicone [C]". The cyclic siloxanes [E1] and [E2] are also generically referred to as a "cyclic siloxane [E]".

Polyorganosilsesquioxane [A]

The polyorganosilsesquioxane [A] for use in the curable resin composition according to the present invention is a ladder-type silsesquioxanes (the ladder-type silsesquioxane [A1] and/or the ladder-type silsesquioxane [A2]) that contains at least one of an aliphatic carbon-carbon unsaturated bond and a hydrosilyl group in the molecule and has a number-average molecular weight from 500 to 1500 and a molecular weight dispersity (Mw/Mn) from 1.00 to 1.40 as determined by gel permeation chromatography and calibrated with a polystyrene standard.

The polyorganosilsesquioxane [A] is a polyorganosilsesquioxane containing at least a ladder-type polyorganosilsesquioxane skeleton (ladder-type Si—O—Si structure) generally represented by the empirical formula (basic structural formula): $R^A SiO_{1.5}$ as a silsesquioxane skeleton. In the empirical formula, $R^A$ is selected from a hydrogen atom and a monovalent organic group. The monovalent organic group is exemplified by monovalent hydrocarbon groups and monovalent heterocyclic groups illustrated as $R^{1a}$ to $R^{1f}$ in after-mentioned Formula (a-1). The presence of the ladder-type polyorganosilsesquioxane skeleton in the polyorganosilsesquioxane [A] may be verified by that the polyorganosilsesquioxane [A] gives intrinsic absorption peaks at around 1050 cm$^{-1}$ (e.g., from 1000 to 1100 cm$^{-1}$) and at around 1150 cm$^{-1}$ (e.g., from greater than 1100 cm$^{-1}$ to 1200 cm$^{-1}$) respectively (i.e., has at least two absorption peaks at 1000 to 1200 cm$^{-1}$) in an FT-IR spectrum [reference: R. H. Raney, M. Itoh, A. Sakakibara, and T. Suzuki, Chem. Rev. 95, 1409 (1995)]. The FT-IR spectrum of the polyorganosilsesquioxane [A] may be measured typically with an apparatus under conditions as follows.

Measuring apparatus: FT-720 (trade name, supplied by HORIBA, Ltd.)
Measuring method: Transmission technique
Resolution: 4 cm$^{-1}$
Measurement wave number range: 400 to 4000 cm$^{-1}$
Number of scans: 16

In addition to the ladder-type silsesquioxane skeleton, the polyorganosilsesquioxane [A] may further include another silsesquioxane skeleton such as a silsesquioxane skeleton of a cage structure or a random structure.

The polyorganosilsesquioxane [A] has a number-average molecular weight (Mn) from 500 to 1500, preferably from 550 to 1450, and more preferably from 600 to 1400, as determined by gel permeation chromatography and calibrated with a polystyrene standard. A polyorganosilsesquioxane having a number-average molecular weight less than 500 may readily cause the cured product to have inferior properties (e.g., heat resistance and/or gas barrier properties). In contrast, a polyorganosilsesquioxane having a number-average molecular weight greater than 1500 may readily become solid at room temperature to invite inferior handleability and/or may offer inferior compatibility with another component.

The polyorganosilsesquioxane [A] has a molecular weight dispersity (Mw/Mn) from 1.00 to 1.40, preferably 1.35 or less (e.g., from 1.05 to 1.35), and more preferably 1.30 or less (e.g., from 1.10 to 1.30) as determined by gel permeation chromatography and calibrated with a polystyrene standard. A polyorganosilsesquioxane having a molecular weight dispersity greater than 1.40 may include a low-molecular-weight siloxane moiety in a large amount to cause the cured product to have inferior properties such as adhesion and/or gas barrier properties. In contrast, the polyorganosilsesquioxane [A], when adapted to have a molecular weight dispersity of 1.05 or more, may be liable to be liquid at room temperature and to offer better handleability.

The number-average molecular weight and the molecular weight dispersity of the polyorganosilsesquioxane [A] may be measured typically with an apparatus under conditions as follows:

Measuring apparatus: LC-20AD (trade name, supplied by Shimadzu Corporation)
Column: Two Shodex KF-801 columns, one KF-802 column, and one KF-803 column (supplied by Showa Denko K.K.)
Measurement temperature: 40° C.
Eluent: THF
Sample concentration: 0.1 to 0.2 percent by weight
Flow rate: 1 mL/min.
Detector: UV-VIS detector SPD-20A (trade name, supplied by Shimadzu Corporation)
Molecular weight: Calibrated with a polystyrene standard The polyorganosilsesquioxane [A] may have a 5% weight loss temperature ($T_{d5}$) in a nitrogen atmosphere not critical, but preferably 150° C. or higher, more preferably 240° C. or higher, furthermore preferably from 260° C. to 500° C., particularly preferably 262° C. or higher, and most preferably 265° C. or higher. The polyorganosilsesquioxane [A], if having a 5% weight loss temperature lower than 150° C. (particularly lower than 240° C.), may cause the resulting article (cured product) to fail to meet a heat resistance requirement in some uses. The "5% weight loss temperature" refers to a temperature determined by heating a sample at a constant rate of temperature rise, measuring a temperature at which the sample loses its weight by 5% of the weight before heating, and defining the temperature as the 5% weight loss temperature. The 5% weight loss temperature may serve as an index for heat resistance. The 5% weight loss temperature may be measured typically by thermogravimetric analysis (TGA) in a nitrogen atmosphere at a rate of temperature rise of 20° C./min.

The polyorganosilsesquioxane [A] is preferably, but not limited to, one that is liquid at room temperature (25° C.). Specifically, the polyorganosilsesquioxane [A] may have a viscosity of preferably 30000 Pa·s or less (e.g., from 1 to 30000 Pa·s), more preferably 25000 Pa·s or less, and furthermore preferably 10000 Pa·s or less at 25° C. The viscosity may be measured typically with the viscometer MCR301 (trade name, supplied by Anton Paar GmbH) at an oscillation angle of 5%, a frequency from 0.1 to 100 (1/s), and a temperature of 25° C.

The polyorganosilsesquioxane [A] is exemplified by ladder-type silsesquioxanes (ladder-type silsesquioxane [A1] and the ladder-type silsesquioxane [A2]) that are represented by Formula (a-1) below, contain a hydrosilyl group or an aliphatic carbon-carbon unsaturated bond in the molecule, and have a number-average molecular weight (Mn) from 500 to 1500 and a molecular weight dispersity (Mw/Mn) from 1.00 to 1.40 as determined by gel permeation chromatography and calibrated with a polystyrene standard.

[Chem. 14]

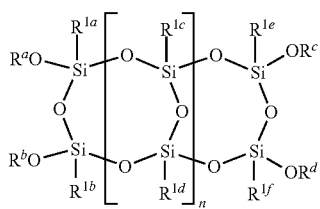

(a-1)

In Formula (a-1), $R^{1a}$ to $R^{1f}$ ($R^{1a}R^{1b}$, $R^{1c}$, $R^{1d}$, $R^{1e}$, and $R^{1f}$) are independently selected from a hydrogen atom, a monovalent hydrocarbon group, and a monovalent heterocyclic group. $R^{1a}$ to $R^{1f}$ may be an identical group or different groups. The monovalent hydrocarbon group is exemplified by monovalent aliphatic hydrocarbon groups; monovalent alicyclic hydrocarbon groups; monovalent aromatic hydrocarbon groups; and monovalent groups each including two or more groups selected from an aliphatic hydrocarbon group, an alicyclic hydrocarbon group, and an aromatic hydrocarbon group bonded to each other. The monovalent heterocyclic group is exemplified by pyridyl, furyl, and thienyl groups.

The monovalent aliphatic hydrocarbon groups are exemplified by alkyl groups, alkenyl groups, and alkynyl groups. The alkyl groups are exemplified by linear or branched $C_1$-$C_{20}$ alkyl groups such as methyl, ethyl, propyl, isopropyl, butyl, hexyl, octyl, isooctyl, decyl, and dodecyl groups, of which $C_1$-$C_{10}$ alkyl groups are preferred, and $C_1$-$C_4$ alkyl groups are more preferred. The alkenyl groups are exemplified by $C_2$-$C_{20}$ alkenyl groups such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl groups, of which $C_2$-$C_{10}$ alkenyl groups are preferred, and $C_2$-$C_4$ alkenyl groups are more preferred. The alkynyl groups are exemplified by $C_2$-$C_{20}$ alkynyl groups such as ethynyl and propynyl groups, of which $C_2$-$C_{10}$ alkynyl groups are preferred, and $C_2$-$C_4$ alkynyl groups are more preferred.

The monovalent alicyclic hydrocarbon groups are exemplified by $C_3$-$C_{12}$ cycloalkyl groups such as cyclopropyl, cyclobutyl, cyclopentyl, cyclohexyl, and cyclododecyl groups; $C_3$-$C_{12}$ cycloalkenyl groups such as cyclohexenyl group; and $C_4$-$C_{15}$ bridged hydrocarbon groups such as bicycloheptyl and bicycloheptenyl groups.

The monovalent aromatic hydrocarbon groups are exemplified by $C_6$-$C_{14}$ aryl groups such as phenyl, naphthyl, and anthryl groups, of which $C_6$-$C_{10}$ aryl groups are preferred.

The groups each including an aliphatic hydrocarbon group and an alicyclic hydrocarbon group bonded to each other are exemplified by cyclohexylmethyl and methylcyclohexyl groups. The groups each including an aliphatic hydrocarbon group and an aromatic hydrocarbon group bonded to each other are exemplified by $C_7$-$C_{18}$ aralkyl groups such as benzyl and phenethyl groups, of which $C_7$-$C_{10}$ aralkyl groups are preferred; $C_6$-$C_{10}$ aryl-$C_2$-$C_6$ alkenyl groups such as cinnamyl group; ($C_1$-$C_4$ alkyl)-substituted aryl groups such as tolyl group; and ($C_2$-$C_4$ alkenyl)-substituted aryl groups such as styryl group.

The monovalent hydrocarbon group may have one or more substituents. Specifically, the monovalent hydrocarbon group may be a monovalent hydrocarbon group corresponding to any of the above-exemplified monovalent hydrocarbon groups, except with at least one hydrogen atom substituted by a substituent. The substituent has preferably 0 to 20 carbon atoms, and more preferably 0 to 10 carbon atoms. Specifically, the substituent is exemplified by halogen atoms; hydroxyl group; alkoxy groups; alkenyloxy groups; aryloxy groups; aralkyloxy groups; acyloxy groups; mercapto group; alkylthio groups; alkenylthio groups; arylthio groups; aralkylthio groups; carboxy group; alkoxycarbonyl groups; aryloxycarbonyl groups; aralkyloxycarbonyl groups; amino group; mono- or di-alkylamino groups; mono- or di-phenylamino groups; acylamino groups; epoxy-containing groups; oxetanyl-containing groups; acyl groups; oxo group; isocyanate groups; groups each including two or more of them bonded to each other, where necessary, via a $C_1$-$C_6$ alkylene group.

The alkoxy groups are exemplified by $C_1$-$C_6$ alkoxy groups such as methoxy, ethoxy, propoxy, isopropyloxy, butoxy, and isobutyloxy groups, of which preferred are $C_1$-$C_4$ alkoxy groups. The alkenyloxy groups are exemplified by $C_2$-$C_6$ alkenyloxy groups such as allyloxy group, of which preferred are $C_2$-$C_4$ alkenyloxy groups. The aryloxy groups are exemplified by $C_6$-$C_{14}$ aryloxy groups optionally having one or more substituents on the aromatic ring, such as phenoxy, tolyloxy, and naphthyloxy groups, where the substituents are exemplified by $C_1$-$C_4$ alkyl groups, $C_2$-$C_4$ alkenyl groups, halogen atoms, and $C_1$-$C_4$ alkoxy groups. The aralkyloxy groups are exemplified by $C_7$-$C_{18}$ aralkyloxy groups such as benzyloxy and phenethyloxy groups. The acyloxy groups are exemplified by $C_1$-$C_{12}$ acyloxy groups such as acetyloxy, propionyloxy, (meth)acryloyloxy, and benzoyloxy groups.

The alkylthio groups are exemplified by $C_1$-$C_6$ alkylthio groups such as methylthio and ethylthio groups, of which preferred are $C_1$-$C_4$ alkylthio groups. The alkenylthio groups are exemplified by $C_2$-$C_6$ alkenylthio groups such as allylthio group, of which preferred are $C_2$-$C_4$ alkenylthio groups. The arylthio groups are exemplified by $C_6$-$C_{14}$ arylthio groups optionally having one or more substituents on the aromatic ring, such as phenylthio, tolylthio, and naphthylthio groups, where the substituents are exemplified by $C_1$-$C_4$ alkyl groups, $C_2$-$C_4$ alkenyl groups, halogen atoms, and $C_1$-$C_4$ alkoxy groups. The aralkylthio groups are exemplified by $C_7$-$C_{18}$ aralkylthio groups such as benzylthio and phenethylthio groups. The alkoxycarbonyl groups are exemplified by $C_1$-$C_6$ alkoxy-carbonyl groups such as methoxycarbonyl, ethoxycarbonyl, propoxycarbonyl, and butoxycarbonyl groups. The aryloxycarbonyl groups are exemplified by $C_6$-$C_{14}$ aryloxy-carbonyl groups such as phenoxycarbonyl, tolyloxycarbonyl, and naphthyloxycarbonyl groups. The aralkyloxycarbonyl groups are exemplified by $C_7$-$C_{18}$ aralkyloxy-carbonyl groups such as benzyloxycarbonyl group. The mono- or di-alkylamino groups are exemplified by mono- or di-($C_1$-$C_6$ alkylamino groups such as methylamino, ethylamino, dimethylamino, and diethylamino groups. The mono- or di-phenylamino groups are exemplified by phenylamino group. The acylamino groups are exemplified by $C_1$-$C_{11}$ acyl-amino groups such as acetylamino, propionylamino, and benzoylamino groups. The epoxy-containing groups are exemplified by glycidyl, glycidyloxy, and 3,4-epoxycyclohexyl groups. The oxetanyl-containing groups are exemplified by ethyloxetanyloxy group. The acyl groups are exemplified by acetyl, propionyl, and benzoyl groups. The halogen atoms are exemplified by chlorine, bromine, and iodine atoms.

The monovalent heterocyclic group may have one or more substituents. The substituents are as with the substituents which the monovalent hydrocarbon group may have.

More specific examples of the monovalent hydrocarbon group and the monovalent heterocyclic group include methyl, ethyl, propyl, isopropyl, butyl, hexyl, octyl, decyl, phenyl, naphthyl, anthryl, benzyl, phenethyl, pyridyl, furyl, thienyl, vinyl, allyl, and styryl groups (e.g., p-styryl group); and substituted hydrocarbon groups such as 2-(3,4-epoxycyclohexyl)ethyl, 3-glycidylpropyl, 3-methacryloxypropyl, 3-acryloxypropyl, N-2-(aminoethyl)-3-aminopropyl, 3-aminopropyl, N-phenyl-3-aminopropyl, 3-mercaptopropyl, and 3-isocyanatopropyl groups.

Among them, preferred as the polyorganosilsesquioxane [A] are ladder-type silsesquioxanes of Formula (a-1) containing, as $R^{1a}$ to $R^{1f}$, at least one group selected from the group consisting of aromatic hydrocarbon groups (monovalent aromatic hydrocarbon groups) and aliphatic hydrocarbon groups (monovalent aliphatic hydrocarbon groups); more preferably containing, as $R^{1a}$ to $R^{1f}$, at least one group selected from the group consisting of alkyl, aryl, and alkenyl groups; and furthermore preferably containing, as $R^{1a}$ to $R^{1f}$, at least one group selected from the group consisting of phenyl, vinyl, and methyl groups.

In the above-mentioned preferred embodiment, the polyorganosilsesquioxane [A] may include phenyl, vinyl, and methyl groups as $R^{1a}$ to $R^{1f}$ in a percentage (total content) not critical, but preferably from 50 to 100 percent by weight, more preferably from 70 to 100 percent by weight, and furthermore preferably from 80 to 100 percent by weight, based on the total amount (100 percent by weight) of $R^{1a}$ to $R^{1f}$ (each selected from a hydrogen atom, a monovalent hydrocarbon group, and a monovalent heterocyclic group) in Formula (a-1).

The polyorganosilsesquioxane [A] may include the phenyl group as $R^{1a}$ to $R^{1f}$ in a percentage (content) not critical, but preferably from 0 to 100 percent by weight, more preferably from 1 to 100 percent by weight, and furthermore preferably from 5 to 100 percent by weight, based on the total amount (100 percent by weight) of $R^{1a}$ to $R^{1f}$ (each selected from a hydrogen atom, a monovalent hydrocarbon group, and a monovalent heterocyclic group) in Formula (a-1). The polyorganosilsesquioxane [A] may include the vinyl group as $R^{1a}$ to $R^{1f}$ in a percentage (content) not critical, but preferably from 0 to 100 percent by weight, more preferably from 1 to 100 percent by weight, furthermore preferably from 5 to 90 percent by weight, and particularly preferably from 10 to 80 percent by weight, based on the total amount (100 percent by weight) of $R^{1a}$ to $R^{1f}$ (each selected from a hydrogen atom, a monovalent hydrocarbon group, and a monovalent heterocyclic group) in Formula (a-1). The polyorganosilsesquioxane [A] may include the methyl group as $R^{1a}$ to $R^{1f}$ in a percentage (content) not critical, but preferably from 0 to 100 percent by weight, more preferably from 1 to 100 percent by weight, and furthermore preferably from 5 to 100 percent by weight, based on the total amount (100 percent by weight) of $R^{1a}$ to $R^{1f}$ (each selected from a hydrogen atom, a monovalent hydrocarbon group, and a monovalent heterocyclic group) in Formula (a-1).

The formulation (e.g., percentages of phenyl groups, vinyl groups, and methyl groups) of $R^{1a}$ to $R^{1f}$ (each selected from a hydrogen atom, a monovalent hydrocarbon group, and a monovalent heterocyclic group) in the polyorganosilsesquioxane [A] of Formula (a-1) may be calculated typically by NMR spectrum (e.g., $^1$H-NMR spectrum) measurement.

In Formula (a-1), $R^a$ to $R^d$ ($R^a$, $R^b$, $R^c$ and $R^d$) are independently selected from a hydrogen atom, a linear or branched alkyl group, a monovalent group represented by Formula (a-2), a monovalent group represented by Formula (a-3), and a monovalent group represented by Formula (a-4):

[Chem. 15]

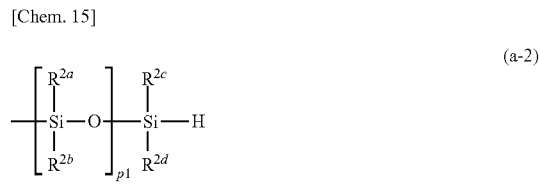

(a-2)

[Chem. 16]

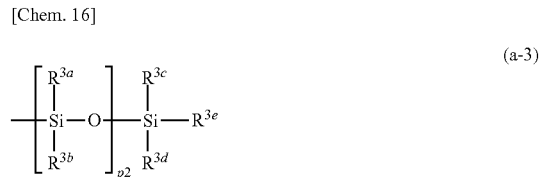

(a-3)

[Chem. 17]

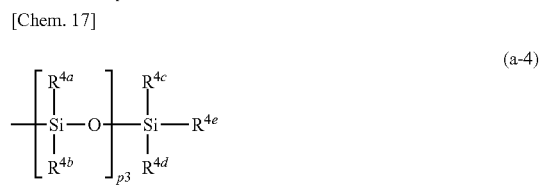

(a-4)

In Formula (a-2), $R^{2a}$ and $R^{2b}$ are, in each occurrence independently, selected from a hydrogen atom and a monovalent hydrocarbon group. The monovalent hydrocarbon groups as $R^{2a}$ and $R^{2b}$ is exemplified as with the monovalent hydrocarbon groups as $R^{1a}$ to $R^{1f}$. Among them, preferred as $R^{2a}$ and $R^{2b}$ are monovalent aliphatic hydrocarbon groups, of which alkyl groups are more preferred. $R^{2a}$ and $R^{2b}$, in each occurrence, may be an identical group or different groups. In Formula (a-2), $R^{2c}$ and $R^{2d}$ independently represent a monovalent hydrocarbon group. The monovalent hydrocarbon groups as $R^{2c}$ and $R^{2d}$ are exemplified as with the monovalent hydrocarbon groups as $R^{1a}$ to $R^{1f}$. Among them, preferred as $R^{2c}$ and $R^{2d}$ are monovalent aliphatic hydrocarbon groups, of which alkyl groups are more preferred. $R^{2c}$ and $R^{2d}$ may be an identical group or different groups. In Formula (a-2), p1 represents an integer of 0 or more. The number p1 is preferably from 0 to 5, more preferably from 0 to 3, and furthermore preferably 0.

In Formula (a-3), $R^{3a}$ and $R^{3b}$ are, in each occurrence independently, selected from a hydrogen atom and a monovalent hydrocarbon group. The monovalent hydrocarbon groups as $R^{3a}$ and $R^{3b}$ are exemplified as with the monovalent hydrocarbon groups as $R^{1a}$ to $R^{1f}$. Among them, preferred as $R^{3a}$ and $R^{3b}$ are monovalent aliphatic hydrocarbon groups, of which alkyl groups are more preferred. $R^{3a}$ and $R^{3b}$, in each occurrence, may be an identical group or different groups. In Formula (a-3), $R^{3c}$ and $R^{3d}$ independently represent a monovalent hydrocarbon group. The monovalent hydrocarbon groups as $R^{3c}$ and $R^{3d}$ is exemplified as with the monovalent hydrocarbon groups as $R^{1a}$ to $R^{1f}$. Among them, preferred as $R^{3c}$ and $R^{3d}$ are monovalent aliphatic hydrocarbon groups, of which alkyl groups are more preferred. $R^{3c}$ and $R^{3d}$ may be an identical group or different groups. In Formula (a-3), $R^{3e}$ represents a monovalent group containing an aliphatic carbon-carbon unsaturated bond; and p2 represents an integer of 0 or more. The number p2 is preferably from 0 to 5, more preferably from 0 to 3, and furthermore preferably 0.

The monovalent group containing an aliphatic carbon-carbon unsaturated bond is exemplified by alkenyl groups such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl groups; alkynyl groups such as ethynyl and propynyl groups; cycloalkenyl groups such as cyclohexenyl group; and other groups each containing any of the alkenyl, alkynyl, and cycloalkenyl groups, such as acryloyl, methacryloyl, 2-allylphenyl, 3-allylphenyl, 4-allylphenyl, 2-(allyloxy)phenyl, 3-(allyloxy) phenyl, 4-(allyloxy)phenyl, 2-(allyloxy)ethyl, 3-(allyloxy) propyl, 2,2-bis(allyloxymethyl)butyl, and 3-allyloxy-2,2-bis (allyloxymethyl)propyl groups.

In Formula (a-4), $R^{4a}$ and $R^{4b}$ are, in each occurrence independently, selected from a hydrogen atom and a monovalent hydrocarbon group. The monovalent hydrocarbon groups as $R^{4a}$ and $R^{4b}$ are exemplified as with the monovalent hydrocarbon groups as $R^{1a}$ to $R^{1f}$. Among them, preferred as $R^{4a}$ and $R^{4b}$ are monovalent aliphatic hydrocarbon groups, of which alkyl groups are more preferred. $R^{4a}$ and $R^{4b}$, in each occurrence, may be an identical group or different groups. In Formula (a-4), $R^{4c}$ to $R^{4e}$ ($R^{4c}$, $R^{4d}$, and $R^{4e}$) independently represent a monovalent saturated aliphatic hydrocarbon group. The monovalent saturated aliphatic hydrocarbon groups as $R^{4c}$ to $R^{4e}$ are exemplified as with the monovalent saturated aliphatic hydrocarbon groups as $R^{1a}$ to $R^{1f}$ (e.g., alkyl groups and cycloalkyl groups). Among them, preferred as $R^{4c}$ to $R^{4e}$ are alkyl groups. $R^{4c}$ to $R^{4e}$ may be an identical group or different groups. In Formula (a-4), p3 represents an integer of 0 or more. The number p3 is preferably from 0 to 5, more preferably from 0 to 3, and furthermore preferably 0.

In Formula (a-1), n represents an integer of 0 or more. The number n is generally an even number of 0 or more (e.g., an even number of 2 or more). The number n is not critical, as long as the polyorganosilsesquioxane [A] is adapted to have a number-average molecular weight from 500 to 1500 and a molecular weight dispersity from 1.00 to 1.40. A polyorganosilsesquioxane [A], when having a molecular weight dispersity greater than 1.00, is generally a mixture of two or more different polyorganosilsesquioxanes represented by Formula (a-1) and having different numbers "n". In particular, the polyorganosilsesquioxane [A] preferably contains a component having a number "n" of 1 or more (more preferably having a number "n" of 2 or more) as an essential component.

Of such polyorganosilsesquioxanes [A] represented by Formula (a-1), examples of the ladder-type silsesquioxane [A1] include those of Formula (a-1) in which at least one occurrence of at least one of $R^{1a}$ to $R^{1f}$ is a group containing an aliphatic carbon-carbon unsaturated bond (e.g., an alkenyl group, an alkynyl group, or an cycloalkenyl group); those containing the monovalent group represented by Formula (a-2) in which at least one occurrence of at least one of $R^{2a}$ to $R^{2d}$ is a group containing an aliphatic carbon-carbon unsaturated bond; those containing the monovalent group represented by Formula (a-3); and those containing the monovalent group represented by Formula (a-4) in which at least one occurrence of at least one of $R^{4a}$ and $R^{4b}$ is a group containing an aliphatic carbon-carbon unsaturated bond.

The ladder-type silsesquioxane [A1] includes an aliphatic carbon-carbon unsaturated bond and thereby has excellent reactivity (reactivity in a hydrosilylation reaction) with the compound containing a hydrosilyl group (the compound (H)). The ladder-type silsesquioxane [A1] may have the group containing an aliphatic carbon-carbon unsaturated bond (e.g., alkenyl group) in a number per molecule not critical, as long as being one or more, but preferably two or more (e.g., from two to fifty), and more preferably from two to thirty. The number of the group containing an aliphatic carbon-carbon unsaturated bond in the ladder-type silsesquioxane [A1] may be calculated typically by $^1$H-NMR spectrum measurement. The ladder-type silsesquioxane [A1] may have a hydrosilyl group in the molecule. In this case, the ladder-type silsesquioxane [A1] may be usable also as the ladder-type silsesquioxane [A2].

Of the polyorganosilsesquioxanes [A] represented by Formula (a-1), examples of the ladder-type silsesquioxane [A2] include those of Formula (a-1) in which at least one occurrence of at least one of $R^{1a}$ to $R^{1f}$ is a hydrogen atom; those containing the monovalent group represented by Formula (a-2); those containing the monovalent group represented by Formula (a-3) in which at least one occurrence of at least one of $R^{3a}$ and $R^{3b}$ is a hydrogen atom; and those containing the monovalent group represented by Formula (a-4) in which at least one occurrence of at least one of $R^{4a}$ and $R^{4b}$ is a hydrogen atom.

The ladder-type silsesquioxane [A2] has excellent reactivity (reactivity in the hydrosilylation reaction) with the compound containing an aliphatic carbon-carbon unsaturated bond (the compound (U)). The ladder-type silsesquioxane [A2] may have the hydrosilyl group in a number per molecule not critical, as long as being one or more, but preferably two or more (e.g., two to fifty), and more preferably from two to thirty. The number of the hydrosilyl group in the ladder-type silsesquioxane [A2] may be calculated typically by $^1$H-NMR spectrum measurement. The ladder-type silsesquioxane [A2] may have an aliphatic carbon-carbon unsaturated bond. In this case, the ladder-type silsesquioxane [A2] may be usable also as the ladder-type silsesquioxane [A1].

Though not limited, the polyorganosilsesquioxane [A] can be produced by any of known or customary methods including methods disclosed in literature such as JP-A No. H04-28722, JP-A No. 2010-518182, JP-A No. H05-39357, JP-A No. 2004-99872, PCT International Publication Number WO1997/007156, JP-A No. H011-246662, JP-A No. H09-20826, POT International Publication Number WO2006/033147, and JP-A No. 2005-239829.

More specifically, the polyorganosilsesquioxane [A] can be produced typically by a production method including a first step as an essential step and, where necessary, further including a second step as follows:

First step: the step of subjecting a compound represented by Formula (a-I) to a hydrolysis reaction and a condensation reaction; and Second step: the step of further performing a reaction with a silylating agent after the first step.

[Chem. 18]

$$R^1-Si(OR^5)_3 \quad\quad (a-I)$$

In Formula (a-I), $R^1$ is selected from a hydrogen atom and an organic group (monovalent organic group). The organic group is exemplified by the monovalent hydrocarbon groups and monovalent heterocyclic groups illustrated as $R^{1a}$ to $R^{1f}$ in Formula (a-1).

Among them, $R^1$ is preferably an aromatic hydrocarbon group or an aliphatic hydrocarbon group, more preferably alkyl, aryl, or alkenyl; and furthermore preferably methyl, phenyl, or vinyl group.

In Formula (a-I), $R^5$ represents, in each occurrence independently, a monovalent hydrocarbon group. The monovalent hydrocarbon group is exemplified by the monovalent hydrocarbon groups and monovalent heterocyclic groups illustrated as $R^{1a}$ to $R^{1f}$ in Formula (a-1), of which alkyl groups are preferred. The alkyl groups are exemplified by $C_1$-$C_{20}$ alkyl groups such as methyl, ethyl, propyl, isopropyl, butyl, isobutyl, s-butyl, t-butyl, pentyl, hexyl, heptyl, octyl, 2-ethylhexyl, nonyl, decyl, undecyl, dodecyl, tridecyl, tetradecyl, pentadecyl, hexadecyl, heptadecyl, octadecyl, nonadecyl, and icosyl groups. Among them, preferred as $R^5$ are $C_1$-$C_6$ alkyl groups, of which methyl and ethyl groups are more preferred. These are preferred from the viewpoint of reactivity in the first step. $R^5$ in three occurrences in the compound represented by Formula (a-I) may be identical or different.

Specifically, the compound represented by Formula (a-I) is exemplified by methyltrimethoxysilane, methyltriethoxysilane, ethyltrimethoxysilane, propyltriethoxysilane, isopropyltrimethoxysilane, butyltriethoxysilane, hexyltrimethoxysilane, hexyltriethoxysilane, octyltrimethoxysilane, decyltriethoxysilane, phenyltrimethoxysilane, phenyltriethoxysilane, naphthyltrimethoxysilanes, anthryltrimethoxysilanes, benzyltrimethoxysilane, phenethyltrimethoxysilanes, pyridyltrimethoxysilanes, furyltriethoxysilanes, thienyltrimethoxysilanes, vinyltrimethoxysilane, vinyltriethoxysilane, allyltrimethoxysilane, allyltriethoxysilane, 2-(3,4-epoxycyclohexyl)ethyltrimethoxysilane, 3-glycidylpropyltrimethoxysilane, 3-glycidylpropyltriethoxysilane, p-styryltriethoxysilane, 3-methacryloyloxypropyltrimethoxysilane, 3-methacryloyloxypropyltriethoxysilane, 3-acryloyloxypropyltrimethoxysilane, N-2-(aminoethyl)-3-aminopropyltrimethoxysilane, 3-aminopropyltrimethoxysilane, 3-aminopropyltriethoxysilane, N-phenyl-3-aminopropyltrimethoxysilane, 3-mercaptopropyltrimethoxysilane, 3-mercaptopropyltriethoxysilane, 3-isocyanatopropyltriethoxysilane, trimethoxysilane, and triethoxysilane.

Each of different compounds represented by Formula (a-I) may be used alone or in combination as a material to form the polyorganosilsesquioxane [A]. Specifically, the type(s), percentage(s) (formulation), and other factors of the compound(s) represented by Formula (a-I) may be appropriately selected according to the type(s) and percentage(s) (formulation) of organic groups of the polyorganosilsesquioxane [A] to be produced.

The first step in the production method to form the polyorganosilsesquioxane [A] is the step of forming a polyorganosilsesquioxane that includes at least a ladder-type silsesquioxane skeleton and is adapted to have a number-average molecular weight and a molecular weight dispersity as controlled. Specifically, the first step is the step of performing the hydrolysis reaction and condensation reaction of the compound represented by Formula (a-I) to form a ladder-type silsesquioxane skeleton.

Control of the number-average molecular weight and molecular weight dispersity may be achieved typically by suitably adjusting process conditions of the reactions of the compound represented by Formula (a-I) in the first step. The process conditions are exemplified by reaction temperature, reaction time, use (addition) of water, water amount, use (addition) of a catalyst, catalyst type, catalyst amount, solvent type, and solvent amount. In a preferred embodiment, the first step includes two or more steps (substeps) performed under different process conditions. For example, the first step may include three substeps (first, second, and third (last) substeps). In this case, the first, second, and third substeps may be performed at low, moderate, and high reaction temperatures, respectively. Alternatively but not limitatively, the reaction temperature may be appropriately adjusted so as to give a polyorganosilsesquioxane [A] of Formula (a-1) in which n is 0 in the first substep; to give a polyorganosilsesquioxane [A] of Formula (a-1) in which n is 1 in the second substep; and to give a polyorganosilsesquioxane [A] of Formula (a-1) in which n is 2 in the third substep. The two or more substeps may be performed continuously or stepwise. In addition, the handleability of the polyorganosilsesquioxane [A] may be adjusted typically by appropriately adjusting the reaction temperature(s) and/or reaction time(s). Typically, the polyorganosilsesquioxane [A], even when including a phenyl group as the organic group, can achieve a viscosity equivalent to those including a vinyl group and/or a methyl group as the organic group, by appropriately adjusting the reaction temperature(s) and/or the reaction time(s).

The reactions in the first step may be performed in the presence of, or in the absence of, a solvent. The solvent is exemplified by aromatic hydrocarbons such as benzene, toluene, xylenes, and ethylbenzene; ethers such as diethyl ether, dimethoxyethane, tetrahydrofuran, and dioxane; ketones such as acetone, methyl ethyl ketone, and methyl isobutyl ketone; esters such as methyl acetate, ethyl acetate, isopropyl acetate, and butyl acetate; amides such as N,N-dimethylformamide and N,N-dimethylacetamide; nitriles such as acetonitrile, propionitrile, and benzonitrile; and alcohols such as methanol, ethanol, isopropyl alcohol, and butanol. Among them, ketones (ketone solvents) are preferred as the solvent. Each of different solvents may be used alone or in combination.

Though not critical, the amount of the solvent may be appropriately adjusted according to the desired reaction time and other factors within the range from 0 to 50 parts by weight per 100 parts by weight of the compound represented by Formula (a-I).

Though not critical, the amount of water, when used (added) in the first step, may be appropriately adjusted within the range from 0.5 to 6.0 moles per 1 mole of the compound represented by Formula (a-I).

The water may be added in any manner not limited and may be added at once in the whole quantity (total amount) to be used, or sequentially. Upon the sequential addition, the water may be added continuously or intermittently.

The first step may be performed in the presence of a catalyst according to necessity. The catalyst may be an acid catalyst or an alkaline catalyst. The acid catalyst is exemplified by mineral acids such as hydrochloric acid, sulfuric acid, nitric acid, phosphoric acid, and boric acid; phosphoric esters; carboxylic acids such as acetic acid, formic acid, and trifluoroacetic acid; sulfonic acids such as methanesulfonic acid, trifluoromethanesulfonic acid, and p-toluenesulfonic acid; solid acids such as activated clay; and Lewis acids such as iron chloride. Each of different acid catalysts may be used alone or in combination. The acid catalyst may be used in the form of a solution or dispersion in a solvent such as water. The alkaline catalyst is exemplified by alkali metal hydroxides such as lithium hydroxide, sodium hydroxide, potassium hydroxide, and cesium hydroxide; alkaline earth metal hydroxides such as magnesium hydroxide, calcium hydroxide, and barium hydroxide; alkali metal carbonates such as lithium carbonate, sodium carbonate, potassium carbonate, and cesium carbonate; alkaline earth metal carbonates such as magnesium carbonate; alkali metal hydrogencarbonates such as lithium hydrogencarbonate, sodium hydrogencarbonate, sodium hydrogencarbonate, potassium hydrogencarbonate, and cesium hydrogencarbonate; alkali metal organic acid salts (e.g., acetates), such as lithium acetate, sodium acetate, potassium acetate, and cesium acetate; alkaline earth metal organic acid salts (e.g., acetates), such as magnesium acetate; alkali metal alkoxides such as lithium methoxide, sodium methoxide, sodium ethoxide, sodium isopropoxide, potassium ethoxide, and potassium t-butoxide; alkali metal phenoxides such as sodium phenoxide; amines (e.g., tertiary amines), such as triethylamine, N-methylpiperidine, 1,8-diazabicyclo[5.4.0]undec-7-ene, and 1,5-diazabicyclo[4.3.0]non-5-ene; and nitrogen-containing heteroaromatic compounds such as pyridine, 2,2'-bipyridyl, and 1,10-phenanthroline. Each of different alkaline catalysts may be used alone or in combination. The alkaline catalyst may be used in the form of a solution or dispersion in a solvent such as water.

Though not critical, the amount of the catalyst may be appropriately adjusted within the range from 0.002 to 0.200 moles per 1 mole of the compound represented by Formula (a-I).

The reaction temperature in the first step is not critical, but may be appropriately adjusted typically within the range from 0° C. to 80° C. For example in an embodiment, the first step includes two or more substeps performed under different process conditions. In this embodiment, the reaction temperatures are appropriately adjustable typically such as to be from 0° C. to 20° C. in a first substep; and to be from 40° C. to 80° C. in a subsequent step.

Though not critical, the reaction time in the first step may be appropriately adjusted typically within the range from 10 to 720 minutes. For example in an embodiment, the first step includes two or more substeps performed under different process conditions. In this embodiment, the reaction time may be appropriately adjusted typically such as to be from 30 to 180 minutes in a first step; and to be from 60 to 360 minutes in a subsequent step.

The atmosphere in the first step is not critical and may be any atmosphere such as nitrogen atmosphere or argon atmosphere.

The compound represented by Formula (a-I) is subjected to a hydrolysis reaction and a condensation reaction in, the first step and thereby yields a polyorganosilsesquioxane including at least a ladder-type silsesquioxane skeleton, as described above. The polyorganosilsesquioxane obtained in the first step may be employed as intact as the polyorganosilsesquioxane [A]. Namely, the polyorganosilsesquioxane [A] may be the polyorganosilsesquioxane obtained in the first step. Alternatively, the polyorganosilsesquioxane may be further subjected to the second step to give a product to be employed as the polyorganosilsesquioxane [A].

The polyorganosilsesquioxane obtained in the first step generally includes unit structures T2 and T3, where the structure T2 refers to a unit structure represented by Formula (a-i); and the structure T3 refers to a unit structure represented by Formula (a-ii). In Formula (a-i) or (a-ii), $R^1$ is selected from a hydrogen atom and an organic group (monovalent organic group). The organic group is exemplified by, but not limited to, the monovalent hydrocarbon groups and monovalent heterocyclic groups illustrated as $R^{1a}$ to $R^{1f}$ in Formula (a-1).

[Chem. 19]

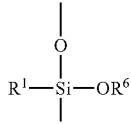

(a-i)

[Chem. 20]

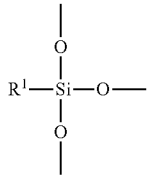

(a-ii)

In Formula (a-i), $R^6$ is selected from a hydrogen atom and a monovalent hydrocarbon group. The monovalent hydrocarbon group is exemplified by the monovalent hydrocarbon groups and monovalent heterocyclic groups illustrated as $R^{1a}$ to $R^{1f}$ in Formula (a-1), of which linear or branched alkyl groups are preferred. The linear or branched alkyl groups are exemplified by linear or branched $C_1$-$C_{20}$ alkyl groups such as methyl, ethyl, propyl, isopropyl, butyl, hexyl, octyl, isooctyl, decyl, and dodecyl groups, of which preferred are $C_1$-$C_{10}$ alkyl groups, and more preferred are $C_1$-$C_4$ alkyl groups.

In the polyorganosilsesquioxane obtained in the first step, the ratio [T3/T2] of the unit structure T3 represented by Formula (a-ii) to the unit structure T2 represented by Formula (a-i) is not critical, but preferably from 0.4 to 1.5, more preferably from 0.5 to 1.5, furthermore preferably from 0.6 to 1.4, and particularly preferably from 0.7 to 1.3. The two oxygen atoms indicated above and below the silicon atom in the unit structure T2 of Formula (a-i) are respectively bonded to other silicon atoms (silicon atoms not indicated in Formula (a-i)). The three oxygen atoms indicated in the unit structure T3 of Formula (a-ii) are respectively bonded to other silicon atoms (silicon atoms not indicated in Formula (a-ii)). The polyorganosilsesquioxane, if having a ratio T3/T2 of less than 0.4, may be liable to cause the cured product of the polyorganosilsesquioxane to be inferior in properties such as heat resistance, flexibility, transparency, and/or gas barrier properties. In contrast, the polyorganosilsesquioxane, if having a ratio T3/T2 greater than 1.5, may be liable to be solid at room temperature and to offer inferior handleability and may have inferior compatibility with another component.

The ratio [T3/T2] of the unit structure T3 represented by Formula (a-ii) to the unit structure T2 represented by Formula (a-i) in the polyorganosilsesquioxane obtained in the first step may be determined typically by $^{29}$Si-NMR spectrum measurement. Specifically, the silicon atom in the unit structure T2 represented by Formula (a-i) and the silicon atom in the unit structure T3 represented by Formula (a-ii) give signals (peaks) at different positions (chemical shifts) in a $^{29}$Si—NMR spectrum. Calculations of integrals of these peaks and the ratio between the two integrals give the ratio

[T3/T2]. Specifically, assume that the polyorganosilsesquioxane obtained in the first step contains one or two selected from the group consisting of a phenyl group and a vinyl group as organic groups. In this case, the silicon atom in the unit structure T2 represented by Formula (a-i) gives a signal appearing at −65 to −74 ppm; whereas the silicon atom in the unit structure T3 represented by Formula (a-ii) gives a signal appearing at −75 to −82 ppm. The ratio [T3/T2] in this case can be determined by calculating integrals of the signal at −75 to −82 ppm (T3) and the signal at −65 to −74 ppm (T2), respectively; and calculating the ratio between the two integrals. Assume that the polyorganosilsesquioxane obtained in the first step contains a methyl group as the organic group. In this case, the silicon atom in the unit structure T2 represented by Formula (a-i) gives a signal appearing at −50 to −60 ppm; whereas the silicon atom in the unit structure T3 represented by Formula (a-ii) gives a signal appearing at −60 to −70 ppm. The ratio [T3/T2] in this case can be determined by calculating integrals of the signal at −60 to −70 ppm (T3) and the signal at −50 to −60 ppm (T2), respectively; and calculating the ratio between the two integrals. The ratio [T3/T2] may act as a general indicator as follows. The polyorganosilsesquioxane, when having a ratio [T3/T2] around 0.5, may be judged as mainly including a component of Formula (a-1) in which n=1; when having a ratio [T3/T2] around 1.0, may be judged as mainly including a component of Formula (a-1) in which n=2; and when having a ratio [T3/T2] around 1.5, may be judged as mainly including a component of Formula (a-1) in which n=3. The judgments may also be affected typically by shapes of peaks obtained in the gel permeation chromatography measurement.

The $^{29}$Si—NMR spectrum of the polyorganosilsesquioxane obtained in the first step may be measured typically with an apparatus under conditions as follows:

Measuring apparatus: JNM-ECA500NMR (trade name, supplied by JEOL Ltd.)
Solvent: deuterated chloroform
Number of scans: 1800
Measurement temperature: 25° C.

The polyorganosilsesquioxane obtained in the first step preferably, but not limitatively, includes a polyorganosilsesquioxane component represented by Formula (a-1) in which $R^a$ to $R^d$ are independently selected from a hydrogen atom and a monovalent hydrocarbon group, and more preferably includes the polyorganosilsesquioxane component mainly (e.g., in a content of 50 percent by weight or more based on the total amount of the polyorganosilsesquioxane). Typically, assume that the polyorganosilsesquioxane obtained in the first step has a ratio [T3/T2] of the unit structure T3 represented by Formula (a-ii) to the unit structure T2 represented by Formula (a-i) of from 0.4 to 1.5. In this case, it can be said that the polyorganosilsesquioxane mainly includes the polyorganosilsesquioxane component represented by Formula (a-1) in which $R^a$ to $R^d$ are independently selected from a hydrogen atom and a monovalent hydrocarbon group.

Second Step

The silylating agent for use in the second step of the polyorganosilsesquioxane [A] production method can be any of known or customary silylating agents without limitation. Among them, a compound represented by Formula (a-II) and/or a compound represented by Formula (a-III) is particularly preferably used as the silylating agent. The use of the compound represented by Formula (a-II) introduces the monovalent group represented by Formula (a-2) into the resulting polyorganosilsesquioxane [A]; whereas the use of the compound represented by Formula (a-III) introduces the monovalent group represented by Formula (a-3) into the resulting polyorganosilsesquioxane [A].

[Chem. 21]

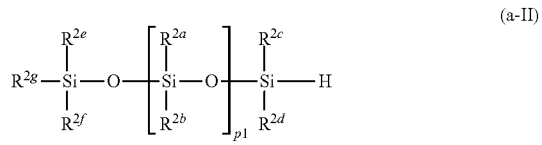

(a-II)

[Chem. 22]

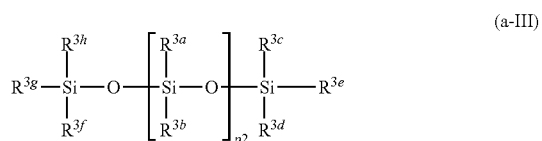

(a-III)

In Formula (a-II), $R^{2a}$ and $R^{2b}$ are, in each occurrence identically or differently, selected from a hydrogen atom and a monovalent hydrocarbon group, as in Formula (a-2); $R^{2e}$ to $R^{2g}$ are, identically or differently, selected from a hydrogen atom and a monovalent hydrocarbon group; $R^{2c}$ and $R^{2d}$ represent, identically or differently, a monovalent hydrocarbon group, as in Formula (a-2); and p1 represents an integer of 0 or more, as in Formula (a-2).

Specifically, the compound represented by Formula (a-II) is exemplified by tetramethyldihydrosiloxanes (e.g., 1,1,3,3-tetramethyldisiloxane), 1,1,1,3,3-pentamethyldisiloxane, 1,1,3,3,5,5-hexamethyltrisiloxane, 1,1,3,3,5,5,7,7-octamethyltetrasiloxane, and 1,1,3,3,5,5,7,7,9,9-decamethylpentasiloxane.

In Formula (a-III), $R^{3a}$ and $R^{3b}$ are, in each occurrence identically or differently, selected from a hydrogen atom and a monovalent hydrocarbon group, as in Formula (a-3); $R^{3f}$ to $R^{3h}$ are, identically or differently, selected from a hydrogen atom and a monovalent hydrocarbon group; $R^{3c}$ and $R^{3d}$ represent, identically or differently, a monovalent hydrocarbon group, as in Formula (a-3); $R^{3e}$ represents a monovalent group containing an aliphatic carbon-carbon unsaturated bond, as in Formula (a-3); and p2 represents an integer of 0 or more, as in Formula (a-3).

Specifically, the compound represented by Formula (a-III) is exemplified by tetramethyldivinyldisiloxanes (e.g., 1,1,3,3-tetramethyldivinyldisiloxane), 1,1,1,3,3-pentamethyldivinyldisiloxane, 1,1,3,3,5,5-hexamethyldivinyltrisiloxane, 1,1,3,3,5,5,7,7-octamethyldivinyltetrasiloxane, and 1,1,3,3,5,5,7,7,9,9-decamethyldivinylpentasiloxane.

In addition to or instead of the compound represented by Formula (a-II) and/or the compound represented by Formula (a-III), another silylating agent (hereinafter also referred to as "other silylating agent") may be used as the silylating agent for use in the second step. The other silylating agent can be any of known or customary silylating agents such as hexamethyldisiloxane, 1,1,1,3,3,3-hexamethyldisilazane, octamethyltrisiloxane, decamethyltetrasiloxane, and chlorotrimethylsilane. Typically, the use of a compound as the other silylating agent can introduce the monovalent group represented by Formula (a-4) into the polyorganosilsesquioxane [A], where the compound is represented by the formula:

[Chem. 23]

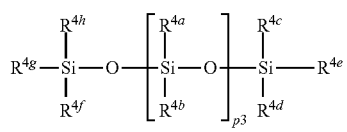

In the formula, $R^{4a}$ and $R^{4b}$ are, in each occurrence identically or differently, selected from a hydrogen atom and a monovalent hydrocarbon group, as in Formula (a-4); $R^{4f}$ to $R^{4h}$ are, in each occurrence identically or differently, selected from a hydrogen atom and a monovalent hydrocarbon group; $R^{4c}$ to $R^{4e}$ represent, identically or differently, a monovalent saturated aliphatic hydrocarbon group, as in Formula (a-4); and p3 represents an integer of 0 or more, as in Formula (a-4).

The amount of the silylating agent (at least one of the compound represented by Formula (a-II), the compound represented by Formula (a-III), and the other silylating agent) may be appropriately adjusted according to the structure of the polyorganosilsesquioxane [A] to be produced. Each of different silylating agents may be used alone or in combination.

The reaction of the polyorganosilsesquioxane obtained in the first step with the silylating agent may be performed in a solvent. The solvent is exemplified by, but not limited to, alicyclic hydrocarbons such as cyclohexane; aromatic hydrocarbons such as benzene, toluene, xylenes, and ethylbenzene; ethers such as diethyl ether, dimethoxyethane, tetrahydrofuran, and dioxane; ketones such as acetone, methyl ethyl ketone, and methyl isobutyl ketone; esters such as methyl acetate, ethyl acetate, isopropyl acetate, and butyl acetate; amides such as N,N-dimethylformamide and N,N-dimethylacetamide; nitriles such as acetonitrile, propionitrile, and benzonitrile; and alcohols such as methanol, ethanol, isopropyl alcohol, and butanol. The solvent is preferably one capable of dissolving both the polyorganosilsesquioxane obtained in the first step and the silylating agent therein, and more preferably a ketone (ketone solvent). Each of different solvents may be used alone or in combination.

The reaction of the polyorganosilsesquioxane obtained in the first step with the silylating agent may be performed under any of known or customary conditions without limitation. Typically, a reaction temperature is preferably from 40° C. to 80° C., more preferably from 45° C. to 80° C., and furthermore preferably from 50° C. to 80° C. A reaction time is not critical, but preferably from 10 to 720 minutes, more preferably from 60 to 480 minutes, and furthermore preferably from 120 to 300 minutes. A reaction atmosphere is not limited, as long as not adversely affecting the reaction, but is exemplified by nitrogen atmosphere and argon atmosphere.

The reaction of the polyorganosilsesquioxane obtained in the first step with the silylating agent may be performed in one stage or in multiple stages including two or more stages. Typically, in an embodiment, the reaction is performed in multiple stages and employs two or more different silylating agents in the respective stages. This can introduce two or more different structures into the structure (e.g., a terminal structure; such as $R^a$ to $R^d$ in Formula (a-1)) of the polyorganosilsesquioxane obtained in the first step. The two or more different structures are exemplified by two or more of the monovalent groups represented by Formulae (a-2) to (a-4). The reaction of the polyorganosilsesquioxane obtained in the first step with the silylating agent(s) can also introduce any of the monovalent groups represented by Formula (a-2) to (a-4) into not all but part of the structure (e.g., a terminal structure; such as $R^a$ to $R^d$ in Formula (a-1)) of the polyorganosilsesquioxane obtained in the first step.

The second step allows the polyorganosilsesquioxane obtained in the first step to react with the silylating agent, thereby forms a polyorganosilsesquioxane in which the silanol group and/or alkoxysilyl group of the polyorganosilsesquioxane obtained in the first step is silylated, and yields this as the polyorganosilsesquioxane [A]. Specifically, the polyorganosilsesquioxane [A] may have a structure corresponding to that of the polyorganosilsesquioxane obtained in the first step, except for part or all of Si—$OR^6$ groups being replaced by a group or groups derived from the silylating agent(s), where $R^6$ is as defined above and is selected from a hydrogen atom and a monovalent hydrocarbon group. The group or groups derived from the silylating agent(s) are exemplified by the monovalent groups represented by Formulae (a-2), (a-3), and (a-4), respectively. The polyorganosilsesquioxane [A] preferably essentially contains the monovalent group represented by Formula (a-2) and/or the monovalent group represented by Formula (a-3), as described above.

The polyorganosilsesquioxane [A] production method may further include one or more steps other than the first and second steps. Specifically, the polyorganosilsesquioxane [A] production method may include, for example, one or more of the steps of purifying a material; purifying a product typically by removing the solvent and/or another component from a solution after the completion of reaction; and recovering an unreacted material.

The polyorganosilsesquioxane [A] may be present in the curable resin composition according to the present invention in a content (total amount) not critical, but preferably 0.01 percent by weight or more (e.g., from 0.1 percent by weight to less than 100 percent by weight), more preferably from 1 to 99 percent by weight, and furthermore preferably from 5 to 95 percent by weight, based on the total amount (100 percent by weight) of the curable resin composition. The polyorganosilsesquioxane [A], if present in a content less than 0.01 percent by weight, may fail to help the cured product to have sufficiently better barrier properties against a corrosive gas. In an embodiment, the curable resin composition includes two or more polyorganosilsesquioxanes (e.g., both the ladder-type silsesquioxane [A1] and the ladder-type silsesquioxane [A2]) as the polyorganosilsesquioxane [A]. In this embodiment, the term "content" of the polyorganosilsesquioxane [A] refers to a total sum of their contents (total content).

Based on the total amount (100 percent by weight) of the compound(s) containing an aliphatic carbon-carbon unsaturated bond (the compound(s) (U)) in the curable resin composition, the ladder-type silsesquioxane [A1] may be present in a content not critical, but preferably 0.1 percent by weight or more (e.g., from 0.1 percent by weight to less than 100 percent by weight), more preferably 0.5 percent by weight or more, furthermore preferably 1 percent by weight or more, and particularly preferably 5 percent by weight or more. The ladder-type silsesquioxane [A1], if present in a content less than 0.1 percent by weight, may fail to help the cured product to have sufficiently better barrier properties against a corrosive gas. The curable resin composition according to the present invention, when containing the ladder-type silsesquioxane [A2], does not have to necessarily include the ladder-type silsesquioxane [A1].

Based on the total amount (100 percent by weight) of the compound(s) containing a hydrosilyl group (the compound (s) (H)) in the curable resin composition, the ladder-type silsesquioxane [A2] may be present in a content not critical, but preferably 0.1 percent by weight or more (e.g., from 0.1 percent by weight to less than 100 percent by weight), more preferably 0.5 percent by weight or more, furthermore preferably 1 percent by weight or more, and particularly preferably 5 percent by weight or more. The ladder-type silsesquioxane [A2], if present in a content less than 0.1 percent by weight, may fail to help the cured product to have sufficiently better barrier properties against a corrosive gas. The curable resin composition according to the present invention, when containing the ladder-type silsesquioxane [A1], does not have to necessarily include the ladder-type silsesquioxane [A2].

Ladder-Type Silsesquioxane [B]

The ladder-type silsesquioxane [B] for use in the curable resin composition according to the present invention is a silsesquioxane other than the polyorganosilsesquioxanes [A] and is a ladder-type silsesquioxane containing at least one of a hydrosilyl group and an aliphatic carbon-carbon unsaturated bond (the ladder-type silsesquioxane [B1] and/or the ladder-type silsesquioxane [B2]). The ladder-type silsesquioxane [B1] corresponds to a ladder-type silsesquioxane [B] containing an aliphatic carbon-carbon unsaturated bond in the molecule; and the ladder-type silsesquioxane [B2] corresponds to a ladder-type silsesquioxane [B] containing a hydrosilyl group in the molecule, as described above.

The ladder-type silsesquioxane [B1] is exemplified by a ladder-type silsesquioxane [B1-1]. The ladder-type silsesquioxane [B1-1] refers to a ladder-type silsesquioxane corresponding to a polyorganosilsesquioxane having a ladder structure (ladder-type silsesquioxane) and containing a polyorganosilsesquioxane residue (a) in part or all of molecular chain terminals of the polyorganosilsesquioxane. The polyorganosilsesquioxane residue (a) refers to a polyorganosilsesquioxane residue including the unit structures represented by Formulae (b-1) and (b-2).

The polyorganosilsesquioxane in the ladder-type silsesquioxane [B1-1] is a polysiloxane represented by the empirical formula (basic structural formula): $RSiO_{1.5}$, where R is selected from a hydrogen atom, a halogen atom, a monovalent organic group, a monovalent oxygen-containing group, a monovalent nitrogen-containing group, and a monovalent sulfur-containing group, where at least part of R in plural occurrences (R in the polyorganosilsesquioxane) is a monovalent organic group. R in plural occurrences in the polyorganosilsesquioxane may be identical or different.

The halogen atom as R is exemplified by fluorine, chlorine, bromine, and iodine atoms. The monovalent organic group as R is exemplified by substituted or unsubstituted hydrocarbon groups (monovalent hydrocarbon groups), alkoxy, alkenyloxy, aryloxy, aralkyloxy, acyloxy, alkylthio, alkenylthio, arylthio, aralkylthio, carboxy, alkoxycarbonyl, aryloxycarbonyl, aralkyloxycarbonyl, epoxy, cyano, isocyanato, carbamoyl, and isothiocyanato groups.

The hydrocarbon groups as R are exemplified by aliphatic hydrocarbon groups, alicyclic hydrocarbon groups, aromatic hydrocarbon groups, and groups each including two or more of them bonded to each other.

The aliphatic hydrocarbon groups as R are exemplified by alkyl, alkenyl, and alkynyl groups. The alkyl groups are exemplified by $C_1$-$C_{20}$ alkyl groups such as methyl, ethyl, propyl, isopropyl, butyl, hexyl, octyl, isooctyl, decyl, and dodecyl groups, of which preferred are $C_1$-$C_{10}$ alkyl groups, and more preferred are $C_1$-$C_4$ alkyl groups. The alkenyl groups are exemplified by $C_2$-$C_{20}$ alkenyl groups such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl groups, of which preferred are $C_2$-$C_{10}$ alkenyl groups, and more preferred are $C_2$-$C_4$ alkenyl groups. The alkynyl groups are exemplified by $C_2$-$C_{20}$ alkynyl groups such as ethynyl and propynyl groups, of which preferred are $C_2$-$C_{10}$ alkynyl groups, and more preferred are $C_2$-$C_4$ alkynyl groups.

The alicyclic hydrocarbon groups as R are exemplified by $C_3$-$C_{12}$ cycloalkyl groups such as cyclopropyl, cyclobutyl, cyclopentyl, cyclohexyl, and cyclododecyl groups; $C_3$-$C_{15}$ cycloalkenyl groups such as cyclohexenyl group; and $C_4$-$C_{15}$ bridged hydrocarbon groups such as bicycloheptyl and bicycloheptenyl groups.

The aromatic hydrocarbon groups as R are exemplified by $C_6$-$C_{14}$ aryl groups such as phenyl and naphthyl groups, of which $C_6$-$C_{10}$ aryl groups are preferred.

As R, the groups including an aliphatic hydrocarbon group and an alicyclic hydrocarbon group bonded to each other are exemplified by cyclohexylmethyl and methylcyclohexyl groups. The groups including an aliphatic hydrocarbon group and an aromatic hydrocarbon group bonded to each other are exemplified by $C_7$-$C_{18}$ aralkyl groups such as benzyl and phenethyl groups, of which preferred are $C_7$-$C_{10}$ aralkyl groups; $C_6$-$C_{10}$ aryl-$C_2$-$C_6$ alkenyl groups such as cinnamyl group; ($C_1$-$C_4$ alkyl)-substituted aryl groups such as tolyl group; and ($C_2$-$C_4$ alkenyl)-substituted aryl groups such as styryl group.

The hydrocarbon groups as R may each have one or more substituents. The substituents in the hydrocarbon groups have preferably 0 to 20 carbon atoms, and more preferably 0 to 10 carbon atoms. The substituents are exemplified by halogen atoms such as fluorine, chlorine, bromine, and iodine atoms; hydroxyl group; alkoxy groups such as methoxy, ethoxy, propoxy, isopropyloxy, butoxy, and isobutyloxy groups, of which preferred are $C_1$-$C_6$ alkoxy groups, and more preferred are $C_1$-$C_4$ alkoxy groups; alkenyloxy groups such as allyloxy group, of which preferred are $C_2$-$C_6$ alkenyloxy groups, and more preferred are $C_2$-$C_4$ alkenyloxy groups; aryloxy groups optionally having one or more substituents on the aromatic ring, such as phenoxy, tolyloxy, and naphthyloxy groups, of which preferred are $C_6$-$C_{14}$ aryloxy groups, where the substituents are selected typically from $C_1$-$C_4$ alkyl groups, $C_2$-$C_4$ alkenyl groups, halogen atoms, and $C_1$-$C_4$ alkoxy groups; aralkyloxy groups such as benzyloxy and phenethyloxy groups, of which preferred are $C_7$-$C_{18}$ aralkyloxy groups; acyloxy groups such as acetyloxy, propionyloxy, (meth)acryloyloxy, and benzoyloxy groups, of which preferred are $C_1$-$C_{12}$ acyloxy groups; mercapto group; alkylthio groups such as methylthio and ethylthio groups, of which preferred are $C_1$-$C_6$ alkylthio groups, and more preferred are $C_1$-$C_4$ alkylthio groups; alkenylthio groups such as allylthio group, of which preferred are $C_2$-$C_6$ alkenylthio groups, and more preferred are $C_2$-$C_4$ alkenylthio groups; arylthio groups optionally having one or more substituents on the aromatic ring, such as phenylthio, tolylthio, and naphthylthio groups, of which preferred are $C_6$-$C_{14}$ arylthio groups, where the substituents are selected typically from $C_1$-$C_4$ alkyl groups, $C_2$-$C_4$ alkenyl groups, halogen atoms, and $C_1$-$C_4$ alkoxy groups; aralkylthio groups such as benzylthio and phenethylthio groups, of which preferred are $C_7$-$C_{18}$ aralkylthio groups; carboxy group; alkoxycarbonyl groups such as methoxycarbonyl, ethoxycarbonyl, propoxycarbonyl, and butoxycarbonyl groups, of which preferred are $C_1$-$C_6$ alkoxy-carbonyl groups; aryloxycarbonyl groups such as phenoxycarbonyl, tolyloxycarbonyl, and naphthyloxycarbonyl groups, of which preferred are $C_6$-$C_{14}$ aryloxy-carbonyl groups;

aralkyloxycarbonyl groups such as benzyloxycarbonyl group, of which preferred are $C_7$-$C_{18}$ aralkyloxy-carbonyl groups; amino group; mono- or di-alkylamino groups such as methylamino, ethylamino, dimethylamino, and diethylamino groups, of which preferred are mono- or di-($C_1$-$C_6$ alkyl)amino groups; acylamino groups such as acetylamino, propionylamino, and benzoylamino groups, of which preferred are $C_1$-$C_{11}$ acylamino groups; epoxy-containing groups such as glycidyloxy group; oxetanyl-containing groups such as ethyloxetanyloxy group; acyl groups such as acetyl, propionyl, and benzoyl groups; oxo group; groups including two or more of them bonded to each other, where necessary, via a $C_1$-$C_6$ alkylene group.

The monovalent oxygen-containing group as R is exemplified by hydroxyl, hydroperoxy, alkenyloxy, aryloxy, aralkyloxy, acyloxy, isocyanato, sulfo, and carbamoyl groups. The monovalent nitrogen-containing group is exemplified by amino group and substituted amino groups (e.g., mono- or di-alkylamino groups and acylamino groups), cyano, isocyanato, isothiocyanato, and carbamoyl groups. The monovalent sulfur-containing group is exemplified by mercapto (thiol), sulfo, alkylthio, alkenylthio, arylthio, aralkylthio, and isothiocyanato groups. The monovalent organic groups, monovalent oxygen-containing groups, monovalent nitrogen-containing groups, and monovalent sulfur-containing groups may be mutually overlapped.

The group R is also exemplified by a group represented by Formula (b-s):

[Chem. 24]

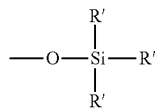

(b-s)

In Formula (b-s), R' is, in each occurrence identically or differently, selected from a hydrogen atom, a halogen atom, a monovalent organic group, a monovalent oxygen-containing group, a monovalent nitrogen-containing group, and a monovalent sulfur-containing group. These groups are exemplified by the groups illustrated as R.

In the group represented by Formula (b-s), preferred as R' in each occurrence are hydrogen atom; $C_1$-$C_{10}$ alkyl groups (of which $C_1$-$C_4$ alkyl groups are more preferred); $C_2$-$C_{10}$ alkenyl groups (of which $C_2$-$C_4$ alkyl groups are more preferred); $C_3$-$C_{12}$ cycloalkyl groups; $C_3$-$C_{12}$ cycloalkenyl groups; $C_6$-$C_{14}$ aryl groups optionally having one or more substituents on the aromatic ring, where the substituents are selected typically from $C_1$-$C_4$ alkyl groups, $C_2$-$C_4$ alkenyl groups, halogen atoms, and $C_1$-$C_4$ alkoxy groups; $C_7$-$C_{18}$ aralkyl groups; $C_6$-$C_{10}$ aryl-$C_2$-$C_6$ alkenyl groups; hydroxyl group; $C_1$-$C_6$ alkoxy groups; and halogen atoms.

Among them, R is preferably hydrogen or a substituted or unsubstituted hydrocarbon group; more preferably a substituted or unsubstituted hydrocarbon group; furthermore preferably an aliphatic hydrocarbon group (of which alkyl is particularly preferred) or an aromatic hydrocarbon group (of which phenyl is particularly preferred).

Polyorganosilsesquioxanes generally have structures such as a ladder-type Si—O—Si structure (ladder structure), a cage-like Si—O—Si structure (cage structure), and a random Si—O—Si structure (random structure). The polyorganosilsesquioxane in the ladder-type silsesquioxane [B1-1] is a polyorganosilsesquioxane including at least the ladder structure (polyorganosilsesquioxane having the ladder structure).

The polyorganosilsesquioxane in the ladder-type silsesquioxane [B1-1] is represented typically by Formula (b-L):

[Chem. 25]

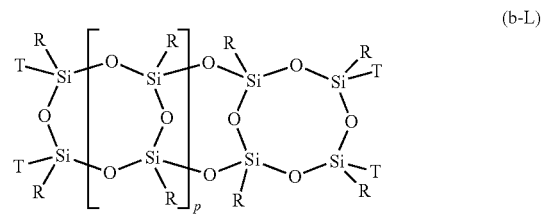

(b-L)

In Formula (b-L), p represents an integer of 1 or more (e.g., from 1 to 5000) and is preferably an integer from 1 to 2000, and more preferably an integer from 1 to 1000; R is, in each occurrence, as defined above; and T represents, in each occurrence, a terminal group.

The ladder-type silsesquioxane [B1-1] includes groups directly bonded to silicon atoms in the polyorganosilsesquioxane. These groups are hereinafter also referred to as "Si-bonded groups". The Si-bonded groups are represented by R in the empirical formula, such as R in Formula (b-L). The Si-bonded groups may include substituted or unsubstituted hydrocarbon groups in a percentage (content) not critical, but preferably 50 mole percent or more, more preferably 80 mole percent or more, and furthermore preferably 90 mole percent or more, based on the total amount (100 mole percent) of the Si-bonded groups. Particularly, the Si-bonded groups may include specific groups in a total content preferably 50 mole percent or more, more preferably 80 mole percent or more, and furthermore preferably 90 mole percent or more, based on the total amount (100 mole percent) of the Si-bonded groups, where the specific groups are substituted or unsubstituted $C_1$-$C_{10}$ alkyl groups (of which $C_1$-$C_4$ alkyl groups such as methyl and ethyl groups are preferred), substituted or unsubstituted $C_6$-$C_{10}$ aryl groups (of which phenyl group is preferred), and substituted or unsubstituted $C_7$-$C_{10}$ aralkyl groups (of which benzyl group is preferred).

The ladder-type silsesquioxane [B1-1] contains the polyorganosilsesquioxane residue (a) in part or all of molecular chain terminals of the polyorganosilsesquioxane having the ladder structure. When the polyorganosilsesquioxane is represented by Formula (b-L), the ladder-type silsesquioxane [B1-1] has a structure corresponding to Formula (b-L) in which part or all of T are replaced by the polyorganosilsesquioxane residue (a).

The polyorganosilsesquioxane residue (a) is a residue including at least the unit structure represented by Formula (b-1) and the unit structure represented by Formula (b-2), as described above.

In Formula (b-1), $R^{11}$ represents a group containing an aliphatic carbon-carbon double bond (a monovalent group containing an aliphatic carbon-carbon double bond). The group containing an aliphatic carbon-carbon double bond is exemplified by $C_2$-$C_{20}$ alkenyl groups such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl groups, of which preferred are $C_2$-$C_{10}$ alkenyl groups, and more preferred are $C_2$-$C_4$ alkenyl groups; $C_3$-$C_{12}$ cycloalkenyl groups such as cyclohexenyl group;

$C_4$-$C_{15}$ bridged unsaturated hydrocarbon groups such as bicycloheptenyl group; ($C_2$-$C_4$ alkenyl)-substituted aryl groups such as styryl group; and cinnamyl group. Examples of the group containing an aliphatic carbon-carbon double bond also include the groups represented by Formula (b-s), in which at least one occurrence of R' in three occurrences is any of the aforementioned groups such as $C_2$-$C_{20}$ alkenyl groups, $C_3$-$C_{12}$ cycloalkenyl groups, $C_4$-$C_{15}$ bridged unsaturated hydrocarbon groups, ($C_2$-$C_4$ alkenyl)-substituted aryl groups, and cinnamyl group. Among them, $R^{11}$ is preferably alkenyl, more preferably $C_2$-$C_{20}$ alkenyl, and furthermore preferably vinyl.

In Formula (b-2), $R^{12}$ represents in three occurrences, in each occurrence independently, a hydrocarbon group (monovalent hydrocarbon group). The hydrocarbon group is exemplified by the hydrocarbon groups illustrated as R. Among them, $R^{12}$ is, in each occurrence, preferably $C_1$-$C_{20}$ alkyl, more preferably $C_1$-$C_{10}$ alkyl, furthermore preferably $C_1$-$C_4$ alkyl, and particularly preferably methyl. $R^{12}$ in Formula (b-2) is particularly preferably methyl at every occurrence. $R^{12}$ in three occurrences may be identical or different.

In addition to the unit structures represented by Formulae (b-1) and Formula (b-2), the polyorganosilsesquioxane residue (a) may have one or more unit structures such as a unit structure represented by Formula (b-1'):

[Chem. 26]

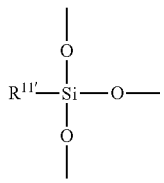

(b-1')

In Formula (b-1'), $R^{11'}$ represents a monovalent group other than the groups containing an aliphatic carbon-carbon double bond. Specifically, $R^{11'}$ is exemplified by hydrogen atom; halogen atoms; and monovalent organic groups, monovalent oxygen-containing groups, monovalent nitrogen-containing groups, and monovalent sulfur-containing groups, other than the groups containing an aliphatic carbon-carbon double bond.

In Formula (b-1), the indicated silicon atom is bonded to three oxygen atoms. The polyorganosilsesquioxane residue (a) may contain the specific silicon atom in a content not critical, but preferably from 20 to 80 mole percent, and more preferably from 25 to 60 mole percent, based on the total amount (100 mole percent) of silicon atoms constituting the polyorganosilsesquioxane residue (a). The polyorganosilsesquioxane residue (a), if having a content of the specific silicon atom of less than 20 mole percent, may cause the ladder-type silsesquioxane [B1-1] to have aliphatic carbon-carbon double bonds in an insufficient amount and may cause the cured product to have insufficient hardness. In contrast, the polyorganosilsesquioxane residue (a), if having a content of the specific silicon atom of greater than 80 mole percent, may cause the ladder-type silsesquioxane [B1-1] to readily include large amounts of residual silanol groups and/or hydrolyzable silyl groups and to fail to be obtained as a liquid. In addition, the silsesquioxane [B1-1] in this case may offer inferior storage stability, because a condensation reaction may proceed in the resulting product to cause the product to have a varying molecular weight.

In Formula (b-2), the indicated silicon atom is bonded to one oxygen atom. The polyorganosilsesquioxane residue (a) may contain the specific silicon atom in a content not critical, but preferably from 20 to 85 mole percent, and more preferably from 30 to 75 mole percent, based on the total amount (100 mole percent) of silicon atoms constituting the polyorganosilsesquioxane residue (a). The polyorganosilsesquioxane residue (a), if having a content of the specific silicon atom of less than 20 mole percent, may cause the ladder-type silsesquioxane [B1-1] to readily include larger amounts of residual silanol groups and/or hydrolyzable silyl groups and to fail to be obtained as a liquid. In addition, the silsesquioxane [B1-1] in this case may offer inferior storage stability, because a condensation reaction may proceed in the resulting product to cause the product to have a varying molecular weight. In contrast, the polyorganosilsesquioxane residue (a), if having a content of the specific silicon atom of greater than 85 mole percent, may cause the ladder-type silsesquioxane [B1-1] to include aliphatic carbon-carbon double bonds in an insufficient amount and to fail to help the cured product to have sufficient hardness.

The polyorganosilsesquioxane residue (a) may have any Si—O—Si structure (skeleton) not limited, such as a ladder structure, cage structure, or random structure.

The polyorganosilsesquioxane [B1-1] may be represented typically by Formula (b-$L^a$) below. In Formula (b-$L^a$), p and R are as defined in Formula (b-L); A is, in each occurrence independently, selected from a polyorganosilsesquioxane residue (a), a hydroxyl group, a halogen atom, an alkoxy group, and an acyloxy group, wherein part or all of "A" are polyorganosilsesquioxane residues (a). "A" in four occurrences may be identical or different. In Formula (b-$L^a$), "A" in two or more occurrences (two to four occurrences), when independently being a polyorganosilsesquioxane residue (a), may be bonded to each other via one or more Si—O—Si bonds.

[Chem. 27]

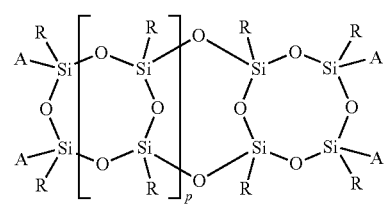

(b-$L^a$)

The polyorganosilsesquioxane residue(s) (a) in the ladder-type silsesquioxane [B1-1] may further contain a unit structure represented by Formula (b-3) as in the after-mentioned ladder-type silsesquioxane [B2-1]. In this case, the ladder-type silsesquioxane [B1-1] may be also usable as the ladder-type silsesquioxane [B2-1].

The ladder-type silsesquioxane [B1-1] may be produced by any method not limited, such as a method of forming the silsesquioxane residue (a) in part or all of molecular chain terminals of a material ladder polymer. The "material ladder polymer" refers to a polyorganosilsesquioxane containing a ladder structure and containing at least one of a silanol group and a hydrolyzable silyl group (either one or both of silanol group and hydrolyzable silyl group) in the molecular chain terminals.

The hydrolyzable silyl group in the material ladder polymer is exemplified by halogenated silyl groups, alkoxysilyl groups, and acyloxysilyl groups. The halogen atoms (halogen moieties) in the halogenated silyl groups are exemplified by fluorine, chlorine, bromine, and iodine atoms. The alkoxy groups (alkoxy moieties) in the alkoxysilyl groups are exemplified by $C_1$-$C_{10}$ alkoxy groups such as methoxy, ethoxy, propoxy, isopropyloxy, butoxy, and isobutyloxy groups. The acyloxy groups (acyloxy moieties) in the acyloxysilyl groups are exemplified by $C_1$-$C_{10}$ acyloxy groups such as acetyloxy, propionyloxy, and benzoyloxy groups.

The material ladder polymer is exemplified by polyorganosilsesquioxanes represented by Formula (b-L) in which part or all of the terminal groups T are independently selected from a hydroxyl group, a halogen atom, an alkoxy group, and an acyloxy group.

The material ladder polymer may have a silanol group and a hydrolyzable silyl group in a number (total number) not critical, but preferably one or more (e.g., one to ten), and more preferably from two to six per molecule. The number (total number) of the silanol group and hydrolyzable silyl group in the material ladder polymer may be determined typically by $^1$H-NMR spectrum measurement.

The material ladder polymer may have a molecular weight not critical, but preferably from 100 to 800000, more preferably from 200 to 100000, furthermore preferably from 300 to 30000, particularly preferably from 1000 to 20000, and most preferably from 1500 to 10000. The material ladder polymer, if having a molecular weight less than 100, may cause the cured product to have inferior heat resistance. In contrast, the material ladder polymer, if having a molecular weight greater than 800000, may cause the resulting ladder-type silsesquioxane [B1-1] (or [B2-1]) to have inferior compatibility with another component. The material ladder polymer may also be a mixture of those having different molecular weights within the range. The molecular weight can be calculated typically as a molecular weight determined by gel permeation chromatography and calibrated with a polystyrene standard.

The material ladder polymer may have a weight-average molecular weight (Mw) not critical, but preferably from 100 to 800000, more preferably from 200 to 100000, furthermore preferably from 300 to 30000, particularly preferably from 1000 to 20000, and most preferably from 1500 to 10000. The material ladder polymer, if having a weight-average molecular weight less than 100, may cause the cured product to have inferior heat resistance. In contrast, the material ladder polymer, if having a weight-average molecular weight greater than 800000, may cause the resulting ladder-type silsesquioxane [B1-1] (or [B2-1]) to have inferior compatibility with another component. The weight-average molecular weight may be calculated typically from the molecular weight as determined by gel permeation chromatography and calibrated with a polystyrene standard.

The material ladder polymer may be produced by any of known or customary methods for producing polyorganosilsesquioxanes having a ladder structure, without limitation. Specifically, the material ladder polymer may be produced typically by a hydrolysis-condensation reaction (sol-gel reaction) of a trifunctional silane compound.

The material ladder polymer may be produced by the hydrolysis-condensation reaction of the trifunctional silane compound. This may be achieved by any method such as a method of subjecting at least one trifunctional silane compound to a hydrolysis-condensation reaction (sol-gel reaction), where the trifunctional silane compound is represented by Formula (b-i):

[Chem. 28]

$$RSiY_3 \quad \text{(b-i)}$$

wherein R is as defined above; Y is, in each occurrence independently, selected from a hydroxyl group, a halogen atom, an alkoxy group, and an acyloxy group, where Y in three occurrences may be identical or different.

The hydrolysis-condensation reaction may be performed typically by subjecting at least one trifunctional silane compound represented by Formula (b-i) to silanol condensation in the presence of a silanol-condensation catalyst in water alone or in combination with an organic solvent as a solvent mixture; and distilling off the solvent and/or a by-product (e.g., an alcohol) during or after the reaction. A reaction temperature is not critical, but preferably from −78° C. to 150° C., and more preferably from −20° C. to 100° C. The amount of water is not critical, but preferably 1 mole or more (e.g., from 1 to 20 moles), and more preferably from 1 to 10 moles, per 1 mole of the total amount of the at least one trifunctional silane compound represented by Formula (b-i).

The organic solvent is exemplified by aliphatic hydrocarbons such as hexane, heptane, and octane; alicyclic hydrocarbons such as cyclohexane; aromatic hydrocarbons such as benzene, toluene, xylenes, and ethylbenzene; halogenated hydrocarbons such as chloroform, dichloromethane, and 1,2-dichloroethane; ethers such as diethyl ether, dimethoxyethane, tetrahydrofuran, and dioxane; ketones such as acetone, methyl ethyl ketone, and methyl isobutyl ketone; esters such as methyl acetate, ethyl acetate, isopropyl acetate, and butyl acetate; amides such as N,N-dimethylformamide and N,N-dimethylacetamide; nitriles such as acetonitrile, propionitrile, and benzonitrile; alcohols such as methanol, ethanol, isopropyl alcohol, and butanol; and solvent mixtures of them. The organic solvent may be used in an amount not critical, but typically from 0.5 to 30 parts by volume per 1 part by volume of the material trifunctional silane compound(s).

The silanol-condensation catalyst usable herein is exemplified by acid catalysts and base catalysts. The acid catalysts are exemplified by mineral acids such as hydrochloric acid, sulfuric acid, nitric acid, phosphoric acid, and boric acid; phosphoric esters; carboxylic acids such as acetic acid and trifluoroacetic acid; sulfonic acids such as methanesulfonic acid, trifluoromethanesulfonic acid, and p-toluenesulfonic acid; solid acids such as activated clay; and Lewis acids such as iron chloride. The base catalysts are exemplified by alkali metal hydroxides such as sodium hydroxide and potassium hydroxide; alkaline earth metal hydroxides such as barium hydroxide and magnesium hydroxide; alkali metal carbonates such as sodium carbonate; alkaline earth metal carbonates such as barium carbonate and magnesium carbonate; alkali metal hydrogencarbonates such as sodium hydrogencarbonate; alkali metal alkoxides such as sodium methoxide and sodium ethoxide; alkaline earth metal alkoxides such as barium methoxide; alkali metal phenoxides such as sodium phenoxide; quaternary ammonium hydroxides including tetraalkylammonium hydroxides such as tetramethylammonium hydroxide and tetrabutylammonium hydroxide; quaternary phosphonium hydroxides including tetraalkylphosphonium hydroxides such as tetramethylphosphonium hydroxide and tetrabutylphosphonium hydroxide; amines including tertiary amines such as triethylamine, N-methylpiperidine, 4-dimethylaminopyridine, and 1,8-diazabicyclo[5.4.0]-7-undecene (DBU); and nitrogen-containing heteroaromatic compounds such as pyridine. Exemplary silanol-condensation catalysts usable herein further include fluorine compounds such as tetrabutylammonium fluoride, potassium fluoride, and sodium fluoride.

The resulting material ladder polymer may be separated and purified by a separation means such as water washing, acid washing, alkali washing, filtration, concentration, distillation, extraction, crystallization, recrystallization, or column chromatography; or a separation means as any combination of them.

Next, the polysilsesquioxane residue (a) is formed in molecular chain terminal(s) of the material ladder polymer to form the ladder-type silsesquioxane [B1-1]. This may be achieved by any method which is exemplified by, but not limited to, a method of subjecting the material ladder polymer to a first reaction (condensation, or hydrolysis and condensation) with a trifunctional silane compound represented by Formula (b-I):

[Chem. 29]

$$R^{11}SiY_3 \qquad (b\text{-}I)$$

wherein $R^{11}$ is as defined above; Y is, in each occurrence independently, selected from a hydroxyl group, a halogen atom, an alkoxy group, and an acyloxy group;
and subsequently to a second reaction (condensation, or hydrolysis and condensation) with a monofunctional silane compound represented by Formula (b-II):

[Chem. 30]

$$R^{12}{}_3SiY \qquad (b\text{-}II)$$

wherein $R^{12}$ is as defined above; and Y is selected from a hydroxyl group, a halogen atom, an alkoxy group, and an acyloxy group.

Upon the reaction with the material ladder polymer, the amount of the trifunctional silane compound represented by Formula (b-I) is not critical, but preferably from 0.2 to 50 moles, more preferably from 0.25 to 10 moles, and furthermore preferably from 1 to 5 moles, per 1 mole of the total amount of silanol groups and hydrolyzable silyl groups of the material ladder polymer. The trifunctional silane compound, if used in an amount less than 0.2 mole, may fail to introduce a sufficient amount of aliphatic carbon-carbon double bonds into the material ladder polymer. In contrast, the trifunctional silane compound, if used in an amount greater than 50 moles, may form a condensate between molecules thereof and may cause the presence of a low-molecular-weight condensate in a larger amount.

Another trifunctional silane compound may be used in combination with the trifunctional silane compound represented by Formula (b-I) in the reaction. Such other trifunctional silane compound is hereinafter also referred to as "other trifunctional silane compound". Specifically, the material ladder polymer may be subjected to the reaction (co-condensation reaction) with the trifunctional silane compound represented by Formula (b-I) and the other trifunctional silane compound. The other trifunctional silane compound is exemplified by trifunctional silane compounds of Formula (b-I) in which $R^{11}$ is a monovalent organic group other than the group containing an aliphatic carbon-carbon double bond, such as a saturated aliphatic hydrocarbon group or an aromatic hydrocarbon group. The amount of the other trifunctional silane compound upon the combined use is not critical, but preferably from 0.2 to 50 parts by weight, and more preferably from 0.25 to 10 parts by weight, per 100 parts by weight of the trifunctional silane compound represented by Formula (b-I).

The reaction (condensation, or hydrolysis and condensation) of the material ladder polymer with the trifunctional silane compound(s) (the trifunctional silane compound represented by Formula (b-I) alone or in combination with the other trifunctional silane compound) is preferably allowed to proceed in an organic solvent. The organic solvent is exemplified by aliphatic hydrocarbons such as hexane, heptane, and octane; alicyclic hydrocarbons such as cyclohexane; aromatic hydrocarbons such as benzene, toluene, xylenes, and ethylbenzene; halogenated hydrocarbons such as chloroform, dichloromethane, and 1,2-dichloroethane; ethers such as diethyl ether, dimethoxyethane, tetrahydrofuran, and dioxane; ketones such as acetone, methyl ethyl ketone, and methyl isobutyl ketone; esters such as methyl acetate, ethyl acetate, isopropyl acetate, and butyl acetate; amides such as N,N-dimethylformamide and N,N-dimethylacetamide; nitriles such as acetonitrile, propionitrile, and benzonitrile; and alcohols such as methanol, ethanol, isopropyl alcohol, and butanol. Each of different organic solvents may be used alone or in combination. Among them, methyl isobutyl ketone is preferred.

The reaction of the material ladder polymer with the trifunctional silane compound(s) may be allowed to proceed in the presence of water. The water may be used in an amount not critical, but preferably from 1 to 10 moles, more preferably from 1.5 to 6 moles, and furthermore preferably from 2 to 4 moles, per 1 mole of the total amount of hydrolyzable silyl groups present in the system. The water, if used in an amount less than 1 mole, may fail to help the hydrolysis as well as the condensation reaction to proceed sufficiently. In contrast, the water, if used in an amount greater than 10 moles, may lower the reaction rate due to a lower concentration of the silane compound(s) and may thereby fail to help the reaction to proceed sufficiently.

The reaction of the material ladder polymer with the trifunctional silane compound(s) is preferably allowed to proceed further in the presence of a silanol-condensation catalyst (of which an acid catalyst is preferred). The silanol-condensation catalyst is exemplified by as with the silanol-condensation catalysts for use in the material ladder polymer production. The silanol-condensation catalyst may be used in an amount not critical, but preferably from 0.001 to 0.5 mole, more preferably from 0.005 to 0.3 mole, and furthermore preferably from 0.01 to 0.1 mole, per 1 mole of the total amount of silanol groups and hydrolyzable silyl groups present in the system. The silanol-condensation catalyst, if used in an amount less than 0.001 mole, may fail to help the condensation reaction to proceed sufficiently. In contrast, the silanol-condensation catalyst, if used in an amount greater than 0.5 mole, may cause a side reaction and/or a decomposition reaction to occur concurrently, thus resulting in a lower yield.

The reaction of the material ladder polymer with the trifunctional silane compound(s) may be performed at a temperature (reaction temperature) not critical, but preferably from 50° C. to 100° C., more preferably from 60° C. to 90° C., and furthermore preferably from 70° C. to 80° C. The reaction, if performed at a temperature lower than 50° C., may fail to proceed sufficiently as a condensation reaction. In contrast, the reaction, if performed at a temperature higher than 100° C., may cause a side reaction and/or a decomposition reaction to occur concurrently, thus resulting in a lower yield.

The reaction of the material ladder polymer with the trifunctional silane compound(s) may be performed for a time (reaction time) not critical, but preferably from 15 to 720 minutes, more preferably from 30 to 360 minutes, and furthermore preferably from 60 to 240 minutes. The reaction, if performed for a time shorter than 15 minutes, may fail to proceed sufficiently as a condensation reaction. In contrast, the reaction, if performed for a time longer than 720 minutes, may cause a side reaction and/or a decomposition reaction to occur concurrently, thus resulting in a lower yield.

The reaction of the material ladder polymer with the trifunctional silane compound(s) gives a condensate between the material ladder polymer and the trifunctional silane compound(s). This condensate is hereinafter also simply referred to as "condensate". The condensate obtained in the above manner may be subjected to a subsequent reaction as intact without purification, or after purification. The subsequent reaction is a reaction with the monofunctional silane compound represented by Formula (b-II). The purification may employ a known or customary process including a separation means such as water washing, acid washing, alkali washing, filtration, concentration, distillation, extraction, crystallization, recrystallization, or column chromatography, or a separation means as any combination of them.

Next, the condensate between the material ladder polymer and the trifunctional silane compound(s) is allowed to react with the monofunctional silane compound (unifunctional silane compound) represented by Formula (b-II). More specifically, silanol groups and hydrolyzable silyl groups of the condensate between the material ladder polymer and the trifunctional silane compound are end-capped with the monofunctional silane compound represented by Formula (b-II) to form the ladder-type silsesquioxane [B1-1]. Specifically, the ladder-type silsesquioxane [B1-1] has a structure in which silanol groups and hydrolyzable silyl groups in the condensate are end-capped with the monofunctional silane compound represented by Formula (b-II).

The monofunctional silane compound represented by Formula (b-II) may be used in an amount not critical, but preferably from 1 to 10 moles, more preferably from 1 to 5 moles, and furthermore preferably from 1 to 3 moles, per 1 mole of the total amount of silanol groups and hydrolyzable silyl groups of the condensate. The monofunctional silane compound, if used in an amount less than 1 mole, may cause silanol groups and/or hydrolyzable silyl groups to remain in a large amount in the ladder-type silsesquioxane [B1-1] and in the cured product, and this may adversely affect the storage stability. In contrast, the monofunctional silane compound, if used in an amount greater than 10 moles, may invite a disadvantageously high cost.

The reaction of the condensate with the monofunctional silane compound represented by Formula (b-II) is preferably allowed to proceed in an organic solvent. The organic solvent is exemplified as with the organic solvents for use in the condensation reaction of the material ladder polymer with the trifunctional silane compound.

The reaction of the condensate with the monofunctional silane compound represented by Formula (b-II) may be allowed to proceed in the presence of water. The water may be used in an amount not critical, but preferably from 1 to 10 moles, more preferably from 1 to 5 moles, and furthermore preferably from 1 to 3 moles, per 1 mole of the total amount of hydrolyzable silyl groups present in the system. The water, if used in an amount less than 1 mole, may fail to help the hydrolysis as well as the condensation reaction to proceed sufficiently. In contrast, the water, if used in an amount greater than 10 moles, may cause the reaction rate to be lowered due to a lower substrate concentration.

The reaction of the condensate with the monofunctional silane compound represented by Formula (b-II) is preferably allowed to proceed in the coexistence of a silanol-condensation catalyst (of which an acid catalyst is preferred). The silanol-condensation catalyst may be used in an amount not critical, but preferably from 0.0001 to 1.0 mole, more preferably from 0.001 to 0.1 mole, and furthermore preferably from 0.005 to 0.03 mole, per 1 mole of the total amount of silanol groups and hydrolyzable silyl groups present in the system. The silanol-condensation catalyst, if used in an amount less than 0.0001 mole, may fail to contribute to a sufficiently high reaction rate and may fail to help the condensation reaction to proceed sufficiently. In contrast, the silanol-condensation catalyst, if used in an amount greater than 1.0 mole, may readily cause a side reaction to proceed.

The reaction of the condensate with the monofunctional silane compound represented by Formula (b-II) may be performed at a temperature (reaction temperature) not critical, but preferably from 50° C. to 100° C., more preferably from 60° C. to 80° C., and furthermore preferably from 65° C. to 75° C. The reaction, if performed at a temperature lower than 50° C., may fail to proceed sufficiently as a condensation reaction. In contrast, the reaction, if performed at a temperature higher than 100° C., may cause a side reaction and/or a decomposition reaction to occur concurrently, thus resulting in a lower yield.

The reaction of the condensate with the monofunctional silane compound represented by Formula (b-II) may be performed for a time (reaction time) not critical, but preferably from 60 to 600 minutes, more preferably from 90 to 360 minutes, and furthermore preferably from 120 to 240 minutes. The reaction, if performed for a time shorter than 60 minutes, may fail to proceed sufficiently as a condensation reaction. In contrast, the reaction, if performed for a time longer than 600 minutes, may cause a side reaction and/or a decomposition reaction to occur concurrently, thus resulting in a lower molecular weight.

The resulting ladder-type silsesquioxane [B1-1] may be purified by a known or customary process including a separation means such as water washing, acid washing, alkali washing, filtration, concentration, distillation, extraction, crystallization, recrystallization, or column chromatography, or a separation means as any combination of them.

The ladder-type silsesquioxane [B1-1] may include the aliphatic carbon-carbon double bond in a number not critical, but preferably two or more (e.g., two to fifty), and more preferably from two to thirty in the molecule (per molecule). The ladder-type silsesquioxane [B1-1], when including the aliphatic carbon-carbon double bond in a number within the range, may readily help the cured product to excel in heat resistance and other properties, cracking resistance, and barrier properties against a corrosive gas. The number of the aliphatic carbon-carbon double bond may be calculated typically by $^1$H-NMR spectrum measurement.

The ladder-type silsesquioxane [B1-1] may include the aliphatic carbon-carbon double bond in a content not critical, but preferably from 0.7 to 5.5 mmol/g, and more preferably from 1.1 to 4.4 mmol/g. The ladder-type silsesquioxane [B1-1] may include the aliphatic carbon-carbon double bond in a percentage (in weight percent) not critical, but preferably from 2.0 to 15.0 percent by weight, and more preferably from 3.0 to 12.0 percent by weight, in terms of vinyl group.

The ladder-type silsesquioxane [B1-1] may have a molecular weight not critical, but preferably from 100 to 800000, more preferably from 200 to 100000, furthermore preferably from 300 to 10000, particularly preferably from 500 to 8000, and most preferably from 1500 to 7000. The ladder-type silsesquioxane [B1-1], when having a molecular weight within the range, may readily become liquid at room temperature, have a relatively low viscosity, and be handled easily. The ladder-type silsesquioxane [B1-1] may be a mixture of those having different molecular weights within the range. The molecular weight may be measured typically as a molecular weight determined by gel permeation chromatography and calibrated with a polystyrene standard.

The ladder-type silsesquioxane [B1-1] may have a weight-average molecular weight (Mw) not critical, but preferably from 100 to 800000, more preferably from 200 to 100000, furthermore preferably from 300 to 10000, particularly preferably from 500 to 8000, and most preferably from 1700 to 7000. The ladder-type silsesquioxane [B1-1], if having a weight-average molecular weight less than 100, may cause the cured product to have inferior heat resistance. In contrast, the ladder-type silsesquioxane [B1-1], if having a weight-average molecular weight greater than 800000, may offer inferior compatibility with another component. The weight-average molecular weight may be calculated typically from the molecular weight as determined by gel permeation chromatography and calibrated with a polystyrene standard.

The ladder-type silsesquioxane [B1-1] may have a number-average molecular weight (Mn) not critical, but preferably from 80 to 800000, more preferably from 150 to 100000, furthermore preferably from 250 to 10000, particularly preferably from 400 to 8000, and most preferably from 1500 to 7000. The ladder-type silsesquioxane [B1-1], if having a number-average molecular weight less than 80, may cause the cured product to have inferior heat resistance. In contrast, the ladder-type silsesquioxane [B1-1], if having a number-average molecular weight greater than 800000, may offer inferior compatibility with another component. The number-average molecular weight may be calculated typically from the molecular weight as determined by gel permeation chromatography and calibrated with a polystyrene standard.

The ladder-type silsesquioxane [B1-1] is preferably but not limitatively, liquid at room temperature (about 25° C.) More specifically, the ladder-type silsesquioxane [B1-1] may have a viscosity preferably from 100 to 100000 mPa·s, more preferably from 500 to 10000 mPa·s, and furthermore preferably from 1000 to 8000 mPa·s at 23° C. The ladder-type silsesquioxane [B1-1], if having a viscosity less than 100 mPa·s at 23° C., may cause the cured product to have inferior heat resistance. In contrast, the ladder-type silsesquioxane [B1-1], if having a viscosity greater than 100000 mPa·s at 23° C., may cause the curable resin composition to be prepared and/or to be handled difficultly. The viscosity at 23° C. may be measured typically with a rheometer (trade name Physica UDS-200, supplied by Anton Paar GmbH) and a cone and a plate (cone diameter: 16 mm, at a taper angle of 0°) at a temperature of 23° C. and a number of revolutions of 20 rpm.

The ladder-type silsesquioxane [B2] is exemplified by a ladder-type silsesquioxane [B2-1]. The ladder-type silsesquioxane [B2-1] is a polyorganosilsesquioxane having a ladder structure (ladder-type silsesquioxane) and containing a polyorganosilsesquioxane residue (b) in part or all of molecular chain terminals of the polyorganosilsesquioxane. The polyorganosilsesquioxane residue (b) is a polyorganosilsesquioxane residue including the unit structure represented by Formula (b-3) and the unit structure represented by Formula (b-4).

The polyorganosilsesquioxane in the ladder-type silsesquioxane [B2-1] is a polysiloxane represented by the empirical formula (basic structural formula): $RSiO_{1.5}$. The polyorganosilsesquioxane in the ladder-type silsesquioxane [B2-1] is exemplified as with the polyorganosilsesquioxanes (e.g., the polyorganosilsesquioxane represented by Formula (b-L)) in the ladder-type silsesquioxane [B1-1].

Specifically, when the polyorganosilsesquioxane is one represented by Formula (b-L), the ladder-type silsesquioxane [B2-1] has a structure represented by Formula (b-L), except with part or all of T being replaced by the polyorganosilsesquioxane residue (b).

The polyorganosilsesquioxane residue (b) is a residue including at least the unit structure represented by Formula (b-3) and the unit structure represented by Formula (b-4), as described above. The organic group ($—X—CHR^{13}—CR^{13}_2—[SiR^{14}_2—O—]_{n1}SiHR^{14}_2$) in the unit structure represented by Formula (b-3) is hereinafter also referred to as a "SiH-containing group".

In Formula (b-3), X is selected from a single bond and a linkage group (divalent group having one or more atoms). The linkage group is exemplified by divalent hydrocarbon groups, carbonyl group, ether group (ether bond), thioether group (thioether bond), ester group (ester bond), carbonate group (carbonate bond), amido group (amide bond), and groups each including two or more of them linked to each other.

The divalent hydrocarbon groups are exemplified by $C_1$-$C_{18}$ linear or branched alkylene groups and divalent alicyclic hydrocarbon groups. The $C_1$-$C_{18}$ linear or branched alkylene groups are exemplified by methylene, methylmethylene, dimethylmethylene, ethylene, propylene, and trimethylene groups. The divalent alicyclic hydrocarbon groups are exemplified by divalent cycloalkylene groups (including cycloalkylidene groups), such as 1,2-cyclopentylene, 1,3-cyclopentylene, cyclopentylidene, 1,2-cyclohexylene, 1,3-cyclohexylene, 1,4-cyclohexylene, and cyclohexylidene groups. In Formula (b-3), $R^{13}$ is, in each occurrence independently, selected from a hydrogen atom, a halogen atom, a monovalent organic group, a monovalent oxygen-containing group, a monovalent nitrogen-containing group, and a monovalent sulfur-containing group. Specifically, $R^{13}$ in plural occurrences may be identical or different. $R^{13}$ is exemplified by the groups illustrated as R. Among them, $R^{13}$ is, in each occurrence, preferably selected from a hydrogen atom and a substituted or unsubstituted hydrocarbon group; and is more preferably a hydrogen atom.

In Formula (b-3), $R^{14}$ is, in each occurrence independently, selected from a hydrogen atom, a halogen atom, a monovalent organic group, a monovalent oxygen-containing group, a monovalent nitrogen-containing group, and a monovalent sulfur-containing group. Specifically, $R^{14}$ in plural occurrences may be identical or different. The halogen atom, monovalent organic group, monovalent oxygen-containing group, monovalent nitrogen-containing group, and monovalent sulfur-containing group are exemplified by the groups illustrated as R. When n1 in Formula (b-3) is an integer of 2 or more, $R^{10}$ in the brackets with n1, in each occurrence, may be identical or different.

Among them, $R^{14}$ is, in each occurrence, preferably hydrogen or a substituted or unsubstituted hydrocarbon group; more preferably a substituted or unsubstituted hydrocarbon group; and furthermore preferably an aliphatic hydrocarbon group (of which methyl is preferred) or an aromatic hydrocarbon group (of which phenyl is preferred).

In Formula (b-3), n1 represents an integer from 1 to 100 and is preferably an integer from 1 to 30, more preferably an integer from 1 to 10, and furthermore preferably an integer from 1 to 5. The unit structure, if having an excessively large number n1, may cause the cured product to be liable to have inferior barrier properties against a gas (particularly against a corrosive gas) and may cause the curable resin composition to be unsuitable as an encapsulating agent typically for an optical semiconductor element.

In Formula (b-4), $R^{15}$ represents, in three occurrences, independently a hydrocarbon group (monovalent hydrocarbon group), as with $R^{12}$ in Formula (b-2). The hydrocarbon group is exemplified by the hydrocarbon groups illustrated as R. Among them, $R^{15}$ is, independently in each occurrence, preferably $C_1$-$C_{20}$ alkyl, more preferably $C_1$-$C_{10}$ alkyl, furthermore preferably $C_1$-$C_4$ alkyl, and particularly preferably methyl. $R^{15}$ in Formula (b-4) is particularly preferably methyl at every occurrence.

In addition to the unit structures represented by Formulae (b-3) and (b-4), the polyorganosilsesquioxane residue (b) may further have another unit structure such as a unit structure represented by Formula (b-1').

In Formula (b-3), there is a silicon atom bonded to three oxygen atoms. The polyorganosilsesquioxane residue (b) may contain the specific silicon atom (excluding silicon atom in the SiH-containing group) in a content not critical, but preferably from 20 to 80 mole percent, and more preferably from 25 to 60 mole percent, based on the total amount (100 mole percent) of silicon atoms constituting the polyorganosilsesquioxane residue (b). The polyorganosilsesquioxane residue (b), if having a content of the specific silicon atoms of less than 20 mole percent, may cause the ladder-type silsesquioxane [B2-1] to contain an insufficient amount of hydrosilyl groups and to fail to impart sufficient hardness to the cured product. In contrast, the polyorganosilsesquioxane residue (b), if having a content of the specific silicon atoms of greater than 80 mole percent, may cause the ladder-type silsesquioxane [B2-1] to include large amounts of residual silanol groups and/or hydrolyzable silyl groups and to fail to be obtained as a liquid. The ladder-type silsesquioxane [B2-1] in this case may also offer inferior storage stability, because a condensation reaction may proceed in the resulting product to cause the product to have a varying molecular weight.

In Formula (b-4), the indicated silicon atom is bonded to one oxygen atom. The polyorganosilsesquioxane residue (b) may include the specific silicon atom in a content not critical, but preferably from 20 to 85 mole percent, more preferably from 30 to 75 mole percent, based on the total amount (100 mole percent) of silicon atoms constituting the polyorganosilsesquioxane residue (b). The polyorganosilsesquioxane residue (b), if having a content of the specific silicon atom of less than 20 mole percent, may cause the ladder-type silsesquioxane [B2-1] to readily include residual silanol groups and/or hydrolyzable silyl and to fail to be obtained as a liquid. The ladder-type silsesquioxane [B2-1] in this case may also offer inferior storage stability, because a condensation reaction may proceed in the resulting product to cause the product to have a varying molecular weight. In contrast, the polyorganosilsesquioxane residue (b), if having a content of the specific silicon atom of greater than 85 mole percent, may cause the ladder-type silsesquioxane [B2-1] to contain an insufficient amount of hydrosilyl groups and to fail to help the cured product to have sufficient hardness.

The polyorganosilsesquioxane residue (b) may have any Si—O—Si structure (skeleton) not limited, such as a ladder structure, cage structure, or random structure.

The polyorganosilsesquioxane [B2-1] may be represented typically by Formula (b-$L^b$) below. In Formula (b-$L^b$), p and R are exemplified as in Formula (b-L); and B is, in each occurrence, selected from a polyorganosilsesquioxane residue (b), a hydroxyl group, a halogen atom, an alkoxy group, and an acyloxy group, where part or all of B in Formula (b-$L^b$) is the polyorganosilsesquioxane residue (b). "B" in four occurrences may be identical or different. In Formula (b-$L^b$), "B" in plural occurrences (two to four occurrences), when independently being a polyorganosilsesquioxane residue (b), may be bonded to each other via one or more Si—O—Si bonds.

[Chem. 31]

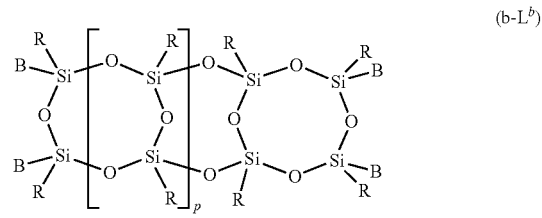

(b-$L^b$)

The polyorganosilsesquioxane residue (b) in the ladder-type silsesquioxane [B2-1] may further have the unit structure represented by Formula (b-1) as in the ladder-type silsesquioxane [B1-1]. In this case, the ladder-type silsesquioxane [B2-1] may be usable also as the ladder-type silsesquioxane [B1-1].

The ladder-type silsesquioxane [B2-1] may be produced by any method which is exemplified by, but not limited to, a method of forming the polyorganosilsesquioxane residue (b) in molecular chain terminal(s) of a material ladder polymer. The material ladder polymer is a polyorganosilsesquioxane having a ladder structure and containing a silanol group and/or a hydrolyzable silyl group in the molecular chain terminal(s).

The material ladder polymer to form the ladder-type silsesquioxane [B2-1] is exemplified as with the material ladder polymer to form the ladder-type silsesquioxane [B1-1].

The polysilsesquioxane residue (b) is formed in the molecular chain terminal(s) of the material ladder polymer to form the ladder-type silsesquioxane [B2-1]. This may be achieved by any process which is exemplified by, but not limited to, a process of producing the ladder-type silsesquioxane [B1-1] from the material ladder polymer; and allowing the ladder-type silsesquioxane [B1-1] to react with a compound represented by Formula (b-5) in the presence of a hydrosilylation catalyst, where Formula (b-5) is expressed as follows:

[Chem. 32]

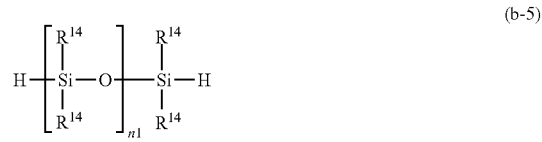

(b-5)

wherein $R^{14}$ and n1 are as defined above.

Specifically, the compound represented by Formula (b-5) is exemplified by linear polydimethylsiloxanes containing hydrosilyl groups at both terminals and containing one to ten (preferably two to five) Si—O units, such as 1,1,3,3-tetramethyldisiloxane, 1,1,3,3,5,5-hexamethyltrisiloxane, 1,1,3,3, 5,5,7,7-octamethyltetrasiloxane, and 1,1,3,3,5,5,7,7,9,9-decamethylpentasiloxane; and linear poly-dialkylsiloxanes containing SiH groups at both terminals, of which linear poly-di-($C_1$-$C_{10}$ alkyl)siloxanes are preferred.

The compound represented by Formula (b-5) upon the reaction with the ladder-type silsesquioxane [B1-1] may be used in an amount not critical, but preferably in such an amount that hydrosilyl group (Si—H) of the compound represented by Formula (b-5) is present in an amount of preferably 3 moles or more (e.g., from 3 to 500 moles), more preferably from 5 to 300 moles, furthermore preferably from 8 to 100 moles, and particularly preferably from 8 to 20 moles, per 1 mole of the total amount of aliphatic carbon-carbon double bonds of the ladder-type silsesquioxane [B1-1]. The compound represented by Formula (b-5), if used in an amount in terms of the hydrosilyl group of less than 3 moles, may cause a curing reaction of the ladder-type silsesquioxane [B1-1] and the compound represented by Formula (b-5) to proceed to thereby invite gelation. In contrast, the compound represented by Formula (b-5), if used in an amount in terms of the hydrosilyl group of greater than 500 moles, may invite a disadvantageously high cost.

The hydrosilylation catalyst is exemplified by well-known catalysts for hydrosilylation reactions, such as platinum-based, rhodium-based, and palladium-based catalysts. Specifically, such catalysts are exemplified by platinum-based catalysts including platinum fine powders, platinum black, platinum supported on silica fine powders, platinum supported on activated carbon, chloroplatinic acid, complexes of chloroplatinic acid typically with an alcohol, aldehyde, or ketone, platinum olefin complexes, platinum-carbonyl complexes (e.g., platinum-carbonyl vinyl methyl complex), platinum-vinylmethylsiloxane complexes (e.g., platinum-divinyltetramethyldisiloxane complex and platinum-cyclovinylmethylsiloxane complex), platinum-phosphine complexes, and platinum-phosphite complexes; and palladium-based catalysts and rhodium-based catalysts corresponding to the platinum-based catalysts, except for containing a palladium atom and a rhodium atom, respectively, instead of a platinum atom. Each of different hydrosilylation catalysts may be used alone or in combination. Among them, preferred for a good reaction rate are platinum-vinylmethylsiloxane complexes; platinum-carbonyl vinyl methyl complexes; and complexes of chloroplatinic acid with an alcohol or aldehyde.

The hydrosilylation catalyst may be used in an amount not critical, but preferably from $1 \times 10^{-3}$ to $1 \times 10^{-2}$ mole, and more preferably from $1.0 \times 10^{-6}$ to $1.0 \times 10^{-3}$ mole, per 1 mole of the total amount of aliphatic carbon-carbon double bonds of the ladder-type silsesquioxane [B1-1]. The hydrosilylation catalyst, if used in an amount less than $1 \times 10^{-8}$ mole, may fail to allow the reaction to proceed sufficiently. In contrast, the hydrosilylation catalyst, if used in an amount greater than $1 \times 10^2$ mole, may cause the cured product to readily undergo coloring.

The hydrosilylation reaction is performed between the ladder-type silsesquioxane [B1-1] and the compound represented by Formula (b-5) to form the ladder-type silsesquioxane [B2-1]. This reaction may be performed in the presence of one or more other additives added to the reaction system according to necessity. The hydrosilylation reaction may also be performed in a solvent according to necessity. The solvent is exemplified by the organic solvents as above. An atmosphere for the hydrosilylation reaction is not limited, as long as not adversely affecting the reaction, such as air, nitrogen, or argon atmosphere. The hydrosilylation reaction may be performed according to any system such as a batch, semi-batch, or continuous system.

The hydrosilylation reaction may be performed at a temperature (reaction temperature) not critical, but preferably from 0° C. to 200° C., more preferably from 20° C. to 150° C., and furthermore preferably from 30° C. to 100° C. The hydrosilylation reaction, if performed at a reaction temperature lower than 0° C., may proceed slowly, thus causing inferior productivity. In contrast, the hydrosilylation reaction, if performed at a reaction temperature higher than 200° C., may cause reactant decomposition and/or a side reaction to occur concurrently and may cause a lower yield. The reaction temperature may be controlled to be constant or be varied sequentially (stepwise) or continuously during the reaction.

The hydrosilylation reaction may be performed for a time (reaction time) not critical, but preferably from 10 to 1400 minutes, and more preferably from 60 to 720 minutes. The hydrosilylation reaction, if performed for a reaction time shorter than 10 minutes, may fail to proceed sufficiently, resulting in a lower yield. In contrast, the hydrosilylation reaction, if performed for a reaction time longer than 1400 minutes, may cause reactant decomposition and/or a side reaction to occur concurrently, resulting in a lower yield and/or dense coloration.

The hydrosilylation reaction may be performed at a pressure (reaction pressure) not critical and can be performed under normal atmospheric pressure, under pressure (under a load), or under reduced pressure.

The ladder-type silsesquioxane [B2-1] produced in the above manner may be purified by a known or customary process including a separation means such as water washing, acid washing, alkali washing, filtration, concentration, distillation, extraction, crystallization, recrystallization, or column chromatography, and a separation means of any combination of them.

The ladder-type silsesquioxane [B2-1] may contain the SiH-containing group in a number not critical, but preferably two or more (e.g., two to fifty), and more preferably from two to thirty in the molecule (per molecule). The ladder-type silsesquioxane [B2-1], when containing the SiH-containing group in a number within the range, may help the cured product of the curable resin composition to have better heat resistance. The number of the SiH-containing group may be calculated typically by $^1$H-NMR spectrum measurement.

The ladder-type silsesquioxane [B2-1] may contain the hydrosilyl group (SiH group) in a content not critical, but preferably from 0.01 to 0.5 mmol/g, and more preferably from 0.08 to 0.28 mmol/g. The ladder-type silsesquioxane [B2-1] may contain the hydrosilyl group (SiH group) in a content (percentage) by weight of not critical, but preferably from 0.01 to 0.50 percent by weight, and more preferably from 0.08 to 0.28 percent by weight, in terms of weight of H (hydrido) in the SiH group (in terms of hydrido). The ladder-type silsesquioxane [B2-1], if containing the hydrosilyl group in an excessively low content (e.g., in a content less than 0.01 mmol/g, or less than 0.01 percent by weight in terms of hydrido), may cause the curable resin composition to fail to be cured. In contrast, the ladder-type silsesquioxane [B2-1], if containing the hydrosilyl group in an excessively high content (e.g., in a content greater than 0.50 mmol/g, or greater than 0.50 percent by weight in terms of hydrido), may cause the cured product to have excessively high hardness and to be susceptible to breakage (cracking). The hydrosilyl content in the ladder-type silsesquioxane [B2-1] may be measured typically by $^1$H-NMR.

The ladder-type silsesquioxane [B2-1] may contain the SiH-containing group in a content not critical, but preferably from 50 to 100 mole percent, and more preferably from 80 to 100 mole percent, based on the total amount (100 mole percent) of hydrosilyl groups of the ladder-type silsesquioxane [B2-1]. The range is preferred from the viewpoint of degree of cure.

The ladder-type silsesquioxane [B2-1] may have a molecular weight not critical, but preferably from 100 to 800000, more preferably from 200 to 100000, furthermore preferably from 300 to 10000, particularly preferably from 500 to 9000, and most preferably from 2500 to 7000. The ladder-type silsesquioxane [B2-1], when having a molecular weight within the range, may readily be liquid at room temperature, have a relatively low viscosity, and be easily handled. The ladder-type silsesquioxane [B2-1] may also be a mixture of those having different molecular weights within the range. The molecular weight may be measured typically as a molecular weight determined by gel permeation chromatography and calibrated with a polystyrene standard.

The ladder-type silsesquioxane [B2-1] may have a weight-average molecular weight (Mw) not critical, but preferably from 100 to 800000, more preferably from 200 to 100000, furthermore preferably from 300 to 10000, particularly preferably from 500 to 9000, and most preferably from 2500 to 7000. The ladder-type silsesquioxane [B2-1], if having a weight-average molecular weight less than 100, may cause the cured product to have inferior heat resistance. In contrast, the ladder-type silsesquioxane [B2-1], if having a weight-average molecular weight greater than 800000, may have inferior compatibility with another component. The weight-average molecular weight may be calculated typically from the molecular weight as determined by gel permeation chromatography and calibrated with a polystyrene standard.

The ladder-type silsesquioxane [B2-1] may have a number-average molecular weight (Mn) not critical, but preferably from 80 to 800000, more preferably from 150 to 100000, furthermore preferably from 250 to 10000, particularly preferably from 400 to 8000, and most preferably from 2000 to 7000. The ladder-type silsesquioxane [B2-1], if having a number-average molecular weight less than 80, may cause the cured product to have inferior heat resistance. In contrast, the ladder-type silsesquioxane [B2-1], if having a number-average molecular weight greater than 800000, may have inferior compatibility with another component. The number-average molecular weight may be calculated typically from the molecular weight as determined by gel permeation chromatography and calibrated with a polystyrene standard.

The ladder-type silsesquioxane [B2-1] is preferably, but not limitatively, liquid at room temperature (about 25° C.). More specifically, the ladder-type silsesquioxane [B2-1] has a viscosity preferably from 100 to 100000 mPa·s, more preferably from 500 to 10000 mPa·s, and furthermore preferably from 1000 to 8000 mPa·s at 23° C. The ladder-type silsesquioxane [B2-1] if having a viscosity less than 100 mPa·s at 23° C., may cause the cured product to have inferior heat resistance. In contrast, the ladder-type silsesquioxane [B2-1], if having a viscosity greater than 100000 mPa·s at 23° C., may cause the curable resin composition to be prepared and/or to be handled difficultly. The viscosity at 23° C. may be measured typically by the procedure as with the viscosity of the ladder-type silsesquioxane [B1-1].

In addition to the ladder-type silsesquioxanes [B1-1] and [B2-1], exemplary ladder-type silsesquioxanes [B] further include ladder-type silsesquioxanes [B1-2] and [B2-2]. The "ladder-type silsesquioxane [B1-2]" refers to a ladder-type silsesquioxane that contains an aliphatic carbon-carbon unsaturated bond and is solid at 25° C. The "ladder-type silsesquioxane [B2-2]" refers to a ladder-type silsesquioxane that contains a hydrosilyl group and is solid at 25° C. The curable resin composition according to the present invention, when including the ladder-type silsesquioxane [B1-2] and/or [B2-2], may particularly readily help the cured product obtained by curing to have better barrier properties against a corrosive gas and to offer better toughness (particularly, better cracking resistance).

The ladder-type silsesquioxane [B1-2] may contain the aliphatic carbon-carbon unsaturated bond in a number not critical, but preferably two or more (e.g., two to fifty), and more preferably from two to thirty in the molecule (per molecule). The ladder-type silsesquioxane [B1-2] may contain the aliphatic carbon-carbon unsaturated bond at any position not critical, such as a position in a side chain and/or at a terminal. The number of the aliphatic carbon-carbon unsaturated bond may be calculated typically by $^1$H-NMR spectrum measurement.

The ladder-type silsesquioxane [B2-2] may contain the hydrosilyl group in a number not critical, but preferably two or more (e.g., two to fifty), and more preferably from two to thirty in the molecule (per molecule). The ladder-type silsesquioxane [B2-2] may contain the hydrosilyl group at any position not critical, such as a position in a side chain and/or at a terminal. The number of the hydrosilyl group may be calculated typically by $^1$H-NMR spectrum measurement.

The ladder-type silsesquioxanes [B1-2] and [B2-2] may each have a weight-average molecular weight (Mw) not critical, but preferably from 2000 to 800000, and more preferably from 6000 to 100000. The ladder-type silsesquioxanes [B1-2] and [B2-2], if having a weight-average molecular weight less than 2000, may cause the cured product to have inferior barrier properties against a corrosive gas. In contrast, the ladder-type silsesquioxanes [B1-2] and [B2-2], if having a molecular weight greater than 800000, may have inferior compatibility with another component. The weight-average molecular weight may be calculated typically from a molecular weight as determined by gel permeation chromatography and calibrated with a polystyrene standard.

The ladder-type silsesquioxanes [B1-2] and [B2-2] may each be produced by a known or customary production method for ladder-type silsesquioxanes, such as a sol-gel method using a trifunctional silane compound as a material.

In addition to the ladder-type silsesquioxanes [B1-1], [B1-2], [B2-1], and [B2-2], exemplary ladder-type silsesquioxanes usable as the ladder-type silsesquioxane [B] further include the material ladder polymer; and the material ladder polymer containing a hydrogen atom or an aliphatic carbon-carbon unsaturated bond as R and having one or more terminal groups (T in Formula (b-L)) being end-capped with a silyl group such as trimethylsilyl group.

The curable resin composition according to the present invention may include each of different ladder-type silsesquioxanes [B] alone or in combination.

The ladder-type silsesquioxane [B] may be present in the curable resin composition in a content (total amount) not critical, but preferably from 0 to less than 100 percent by weight, more preferably from 5 to 95 percent by weight, furthermore preferably from 10 to 90 percent by weight, particularly preferably from 15 to 85 percent by weight, and most preferably from 20 to 80 percent by weight, based on the total amount (100 percent by weight) of the curable resin composition. In an embodiment, the curable resin composition include two or more different ladder-type silsesquioxanes [B] (e.g., both the ladder-type silsesquioxane [B1] and the ladder-type silsesquioxane [B2]). In this embodiment, the term "content" of the ladder-type silsesquioxane [B] refers to a total content of them.

Based on the total amount (100 percent by weight) of the compound(s) containing an aliphatic carbon-carbon unsaturated bond (the compound(s) (U)) in the curable resin composition, the ladder-type silsesquioxane [B1] may be present in a content not critical, but preferably from 0 to less than 100 percent by weight, more preferably from 5 to 95 percent by weight, furthermore preferably from 10 to 90 percent by weight, particularly preferably from 15 to 85 percent by weight, and most preferably from 20 to 80 percent by weight.

Based on the total amount (100 percent by weight) of the compound(s) containing a hydrosilyl group (the compound(s) (H)) in the curable resin composition, the ladder-type silsesquioxane [B2] may be present in a content not critical, but preferably from 0 to less than 100 percent by weight, more preferably from 5 to 95 percent by weight, furthermore preferably from 10 to 90 percent by weight, particularly preferably from 15 to 85 percent by weight, and most preferably from 20 to 80 percent by weight.

Silicone [C]

The silicone [C] for use in the curable resin composition according to the present invention is a polyorganosiloxane composed of a siloxane bond (Si—O—Si) and is a linear or branched silicone (silicone resin; the silicone [C1] and/or the silicone [C2]), containing a hydrosilyl group and/or an aliphatic carbon-carbon unsaturated bond. The silicone [C1] is a silicone [C] containing an aliphatic carbon-carbon unsaturated bond in the molecule; whereas the silicone [C2] is a silicone [C] containing a hydrosilyl group in the molecule, as described above. Particularly, the curable resin composition according to the present invention, when containing the silicone [C] and when cured, may readily give a cured product that exhibits still better thermal shock resistance. The "silicones [C]" do not include polyorganosilsesquioxanes such as the polyorganosilsesquioxanes [A] and the ladder-type silsesquioxanes [B]. Exemplary silicone skeletons constituting the silicones [C1] and [C2] include known or customary silicone skeletons such as phenylsilicone skeleton (polydiphenylsiloxane), a phenylmethylsilicone skeleton (polymethylphenylsiloxane), and a dimethylsilicone skeleton (polydimethylsiloxane).

The silicone [C] may contain the hydrosilyl group or aliphatic carbon-carbon unsaturated bond at any position not critical, such as a position in a side chain and/or at a terminal of the silicone skeleton.

The terminal structure of the silicone [C] is exemplified by, but not limited to, silanol, alkoxysilyl, and trialkylsilyl groups (e.g., trimethylsilyl). The silicone [C] may include an organic group introduced into its terminal, where the organic group is exemplified by a hydrosilyl group or a group containing an aliphatic carbon-carbon unsaturated bond.

The silicone [C] may have a molecular weight not critical, but preferably from 100 to 800000, more preferably from 200 to 100000, furthermore preferably from 300 to 50000, particularly preferably from 1000 to 30000, and most preferably from 2500 to 20000. The silicone [C], if having a molecular weight less than 100, may cause the cured product to have inferior heat resistance. In contrast, the silicone [C], if having a molecular weight greater than 800000, may have inferior compatibility with another component. The molecular weight may be calculated typically as a molecular weight determined by gel permeation chromatography and calibrated with a polystyrene standard.

The silicone [C] may have a weight-average molecular weight (Mw) not critical, but preferably from 100 to 800000, more preferably from 200 to 100000, furthermore preferably from 300 to 50000, particularly preferably from 1000 to 30000, and most preferably from 2500 to 20000. The silicone [C], if having a weight-average molecular weight less than 100, may cause the cured product to have inferior heat resistance. In contrast, the silicone [C], if having a weight-average molecular weight greater than 800000, may have inferior compatibility with another component. The weight-average molecular weight may be calculated typically from the molecular weight as determined by gel permeation chromatography and calibrated with a polystyrene standard.

The silicone [C1] may contain the aliphatic carbon-carbon unsaturated bond in a number not critical, but preferably two or more (e.g., two to fifty), and more preferably from two to thirty in the molecule (per molecule). The number of the aliphatic carbon-carbon unsaturated bond may be calculated typically by $^1$H-NMR spectrum measurement.

The silicone [C2] may contain the hydrosilyl group in a number not critical, but preferably two or more (e.g., two to fifty), and more preferably from two to thirty in the molecule (per molecule). The number of the hydrosilyl group may be calculated typically by $^1$H-NMR spectrum measurement.

The silicone [C] may be produced by a known or customary method such as a method of polycondensing a bifunctional silane corresponding to the structure of the silicone [C]; and appropriately modifying the resulting product according to necessity. The silicone [C] may also be available as commercial products.

The silicone [C] is exemplified by an aryl-free silicone and an aryl-containing silicone. The "aryl-free silicone" refers to a silicon devoid of aryl groups in the molecule. The "aryl-containing silicone" refers to a silicone containing an aryl group in the molecule. Each of the two-types of silicones may be appropriately selected alone or in combination in any formulation (formulation) according to the desired mechanical properties and optical properties (e.g., refractive index) of the cured product.

The aryl-free silicone contains a non-aryl group as a group directly bonded to the silicon atom. The "non-aryl group" refers to a group other than aryl groups. The non-aryl group is exemplified by hydrogen atom, groups containing a Si—H bond, substituted or unsubstituted hydrocarbon groups (excluding aryl groups and aryl-containing groups), hydroxyl, alkoxy, alkenyloxy, acyloxy, mercapto (thiol), alkylthio, alkenylthio, carboxy, alkoxycarbonyl, amino or substituted amino (e.g., mono- or di-(alkyl)amino and acylamino), epoxy, and halogen. The hydrocarbon groups are exemplified by alkyl, alkenyl, cycloalkyl, and cycloalkenyl groups.

Of the alkyl groups, preferred are $C_1$-$C_{10}$ alkyl, and more preferred are $C_1$-$C_4$ alkyl. Of the alkenyl groups, preferred are $C_2$-$C_{10}$ alkenyl, and more preferred are $C_2$-$C_4$ alkenyl. Of the cycloalkyl groups, preferred are $C_3$-$C_{12}$ cycloalkyl. Of the cycloalkenyl groups, preferred are $C_3$-$C_{12}$ cycloalkenyl. Of the alkoxy groups, preferred are $C_1$-$C_6$ alkoxy. Of the alkenyloxy groups, preferred are $C_1$-$C_6$ alkenyloxy. Of the acyloxy groups, preferred are $C_1$-$C_6$ acyloxy. Of the alkylthio groups, preferred are $C_1$-$C_6$ alkylthio. Of the alkenylthio groups, preferred are $C_1$-$C_6$ alkenylthio. Of the alkoxycarbonyl groups, preferred are $C_1$-$C_6$ alkoxycarbonyl.

More specifically, the non-aryl group is exemplified by the non-aryl groups illustrated as $R^{1a}$ to $R^{1f}$ in Formula (a-1).

The aryl-free silicone is substantially devoid of aryl groups in the molecule. Specifically, the aryl-free silicone may contain an aryl group in a content preferably 0.5 percent by weight or less (e.g., from 0 to 0.5 percent by weight), more preferably 0.2 percent by weight or less, and furthermore preferably 0.1 percent by weight or less, based on the total amount (100 percent by weight) of the aryl-free silicone. The aryl-free silicone, if containing the aryl group in a content greater than 0.5 percent by weight, may fail to impart desired properties (e.g., high refractive index) to the cured product.

As the non-aryl group (non-aryl group directly bonded to the silicon atom) of the aryl-free silicone, particularly preferred is at least one group selected from the group consisting of a hydrogen atom, a Si—H-bond-containing group, and, a substituted or unsubstituted hydrocarbon group (preferably an alkyl or alkenyl group). The aryl-free silicone, when having a group containing an aliphatic carbon-carbon unsaturated bond (e.g., an alkenyl group) as the non-aryl group, is usable as the silicone [C1]. In contrast, the aryl-free silicone, when having a Si—H-bond-containing group (e.g., a hydrosilyl group or a group including the same) as the non-aryl group, is usable as the silicone [C2].

The aryl-free silicone may have a number-average molecular weight not critical, but preferably from 500 to 20000, more preferably from 600 to 10000, and furthermore preferably from 700 to 5000. The aryl-free silicone may have a weight-average molecular weight not critical, but preferably from 500 to 50000, more preferably from 1000 to 40000, and furthermore preferably from 2000 to 30000. The number-average and weight-average molecular weights may be calculated typically from a molecular weight as determined by gel permeation chromatography and calibrated with a polystyrene standard.

Each of different aryl-free silicones may be used alone or in combination. Assume that two or more aryl-free silicones are used in combination. In this case, the two or more aryl-free silicones preferably include an aryl-free silicone containing an aliphatic carbon-carbon unsaturated bond (e.g., an alkenyl group) (the silicone [C1]); and an aryl-free silicone having a Si—H-bond-containing group (e.g., a hydrosilyl group or a group including the same) (the silicone [C2]). The aryl-free silicones for use herein are also available as commercial products typically under the trade names of: GD-4012A and GD-1012B (each from Eternal Chemical Co., Ltd.); and KER-2500A and KER-2500B (each from Shin-Etsu Chemical Co., Ltd.).

The aryl-free silicone containing an aliphatic carbon-carbon unsaturated bond may be one further containing a Si—H bond; whereas the aryl-free silicone containing a Si—H bond may be one further containing an aliphatic carbon-carbon unsaturated bond.

The aryl group of the aryl-containing silicone as the silicone [C] is exemplified by $C_6$-$C_{14}$ aryl groups such as phenyl and naphthyl groups, of which $C_6$-$C_{10}$ aryl groups are preferred. The aryl group may also be one directly bonded to a silicon atom constituting the aryl-containing silicone.

The aryl-containing silicone may further include the non-aryl group in addition to the aryl group. The non-aryl group is preferably at least one group selected from the group consisting of hydrogen atoms, groups containing a Si—H bond (hydrosilyl group or a group including the same), and substituted or unsubstituted hydrocarbon groups (excluding the aryl groups and groups including the same). Of the substituted or unsubstituted hydrocarbon groups, alkyl and alkenyl groups are more preferred. The aryl-containing silicone, when having a group containing an aliphatic carbon-carbon unsaturated bond (e.g., an alkenyl group) as the non-aryl group, is usable as the silicone [C1]. In contrast, the aryl-containing silicone, when having a Si—H-bond-containing group (e.g., hydrosilyl group or a group including the same) as the non-aryl group, is usable as the silicone [C2]. The non-aryl group may be one directly bonded to a silicon atom constituting the aryl-containing silicone.

The aryl-containing silicone may contain the aryl group in a content (in terms of phenyl group) not critical, but preferably 35 percent by weight or more, more preferably 40 percent by weight or more, and furthermore preferably 45 percent by weight or more, based on the total amount (100 percent by weight) of the aryl-containing silicone. The aryl-containing silicone, if containing the aryl group in a content less than 35 percent by weight, may cause the resulting cured product to have inferior barrier properties against a corrosive gas such as a $SO_X$. The aryl-containing silicone may contain such aryl groups as all or part of substituents in the principal chain composed of a siloxane bond (Si—O—Si). The aryl content may be calculated typically by $^1$H-NMR spectrum measurement.

The aryl-containing silicone may have a number-average molecular weight (Mn) not critical, but preferably from 500 to 4000, more preferably from 550 to 2800, and furthermore preferably from 600 to 1500. The aryl-containing silicone may have a weight-average molecular weight (Mw) not critical, but preferably from 500 to 20000, more preferably from 600 to 10000, and furthermore preferably from 700 to 6500. The aryl-containing silicone, if having a number-average molecular weight and/or a weight-average molecular weight (either one or both of number-average and weight-average molecular weights) less than 500, may cause the resulting cured product to have inferior heat resistance. In contrast, the aryl-containing silicone, if having a number-average molecular weight greater than 4000 and/or a weight-average molecular weight greater than 20000, may have inferior compatibility with another component, or, upon combination use of two or more different aryl-containing silicones, may have inferior compatibility with one another. The aryl-containing silicone may be a mixture of those having different molecular weights controlled to have an average molecular weight within the range. The number-average and weight-average molecular weights may be calculated typically from a molecular weight determined by gel permeation chromatography and calibrated with a polystyrene standard.

The aryl-containing silicone may have a molecular weight dispersity (Mw/Mn) not critical, but preferably from 0.95 to 4.00, more preferably from 1.00 to 3.80, and furthermore preferably from 1.20 to 3.50. The molecular weight dispersity (Mw/Mn) is calculated from the weight-average molecular weight (Mw) and number-average molecular weight (Mn). The aryl-containing silicone, if having a molecular weight dispersity greater than 4.00, may cause the cured product to be inferior in heat resistance and/or barrier properties against a corrosive gas such as a $SO_X$ gas.

In an embodiment, the aryl-containing silicone may be an aryl-containing silicone containing an aliphatic carbon-carbon unsaturated bond. The aliphatic carbon-carbon unsaturated bond may be one directly bonded to a silicon atom constituting the aryl-containing silicone containing an aliphatic carbon-carbon unsaturated bond. The aliphatic carbon-carbon unsaturated bond may be present at a terminal of the principal chain (straight- and/or branched-chain) of the aryl-containing silicone containing an aliphatic carbon-carbon unsaturated bond, where the principal chain is composed of a siloxane bond (Si—O—Si).

The group containing an aliphatic carbon-carbon unsaturated bond is exemplified by $C_2$-$C_{20}$ alkenyl groups such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl groups, of which preferred are $C_2$-$C_{10}$ alkenyl, and more preferred are $C_2$-$C_4$ alkenyl; $C_3$-$C_{12}$ cycloalkenyl groups such as cyclohexenyl group; $C_4$-$C_{15}$ bridged unsaturated hydrocarbon groups such as bicycloheptenyl group; ($C_2$-$C_4$ alkenyl)-substituted aryl groups such as styryl group; and cinnamyl group. Examples of the group containing an aliphatic carbon-carbon double bond also include groups represented by Formula (b-s) in which at least one of the three occurrences of R' is any of the above groups, such as $C_2$-$C_{20}$ alkenyl, $C_3$-$C_{12}$ cycloalkenyl, $C_4$-$C_{15}$ bridged unsaturated hydrocarbon groups, ($C_2$-$C_4$ alkenyl)-substituted aryl, and cinnamyl. Among them, at least one occurrence of R' is preferably alkenyl, more preferably $C_2$-$C_{20}$ alkenyl, and furthermore preferably vinyl.

The aryl-containing silicone containing an aliphatic carbon-carbon unsaturated bond may include the aliphatic carbon-carbon unsaturated bond in a content (in terms of vinyl group) not critical, but preferably from 1.5 to 15.0 percent by weight, more preferably from 2.0 to 13.0 percent by weight, and furthermore preferably from 3.0 to 12.0 percent by weight, based on the total amount (100 percent by weight) of the aryl-containing silicone. The aryl-containing silicone, when including the aliphatic carbon-carbon unsaturated bond in a content within the range, may readily help the cured product to excel in heat resistance and other properties, cracking resistance, and barrier properties against a corrosive gas. The content of the aliphatic carbon-carbon unsaturated bond may be calculated typically by $^1$H-NMR spectrum measurement.

In another embodiment, the aryl-containing silicone may be an aryl-containing silicone containing a Si—H bond. The Si—H bond may be one possessed by a substituent bonded to a silicon atom constituting the aryl-containing silicone containing the Si—H bond. The Si—H bond may be present at a terminal of the principal chain (straight- and/or branched-chain) of the aryl-containing silicone containing the Si—H bond, where the principal chain is composed of a siloxane bond (Si—O—Si).

The group containing the Si—H bond is exemplified by groups represented by Formula (b-s) in which at least one of the three occurrences of R' is a hydrogen atom.

The aryl-containing silicone containing the Si—H bond may contain the Si—H bond in a content not critical, but preferably from 0.01 to 0.50 percent by weight, more preferably from 0.05 to 0.30 percent by weight, and furthermore preferably from 0.08 to 0.20 percent by weight, in terms of the weight of H (hydride) in the Si—H bond (in terms of hydrido), based on the total amount (100 percent by weight) of the aryl-containing silicone containing the Si—H bond. The aryl-containing silicone, when containing the Si—H bond in a content within the range, may readily help the cured product to excel in heat resistance and other properties, cracking resistance, and barrier properties against a corrosive gas. The Si—H bond content may be calculated typically by $^1$H-NMR spectrum measurement.

Each of different aryl-containing silicones may be used alone or in combination. In an embodiment, the curable resin composition include two or more aryl-containing silicones in combination. In this embodiment, the curable resin composition preferably includes, for example, both the aryl-containing silicone group containing an aliphatic carbon-carbon unsaturated bond (e.g., an alkenyl group) (the silicone [C1]) and the aryl-containing silicone having a Si—H-bond-containing group (e.g., a hydrosilyl group or a group including the same) (the silicone [C2]). The aryl-containing silicone for use herein is also available as commercial products typically under the trade names of: GD-1130A and GD-1130B (each from Eternal Chemical Co., Ltd.); OE-6630A and OE-6630B (each from Dow Corning Toray Co., Ltd.); and ASP-1120A and ASP-1120B (each from Shin-Etsu Chemical Co., Ltd.).

The aryl-containing silicone containing an aliphatic carbon-carbon unsaturated bond may also be one further containing a Si—H bond; whereas the aryl-containing silicone containing a Si—H bond may also be one containing an aliphatic carbon-carbon unsaturated bond.

More specifically, the silicone [C] for use in the curable resin composition according to the present invention is exemplified by a silicone [C-1]. The "silicon [C-1]" refers to a silicone having a structure represented by Formula (c-1):

[Chem. 33]

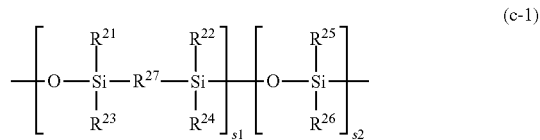

In Formula (c-1), $R^{21}$ to $R^{26}$ are, in each occurrence independently, selected from a hydrogen atom, a monovalent hydrocarbon group, and a monovalent heterocyclic group, where at least one occurrence of at least one of $R^{21}$ to $R^{26}$ is selected from a hydrogen atom and a monovalent group containing an aliphatic carbon-carbon unsaturated bond. The monovalent hydrocarbon group and the monovalent heterocyclic group is exemplified by the groups illustrated as $R^{1a}$ to $R^{1f}$ in Formula (a-1). The monovalent group containing an aliphatic carbon-carbon unsaturated bond is exemplified by the groups illustrated as $R^{3e}$ in Formula (a-3). $R^{21}$ to $R^{26}$, in each occurrence, may be identical or different.

Formula (c-1) in which at least one occurrence of at least one of $R^{21}$ to $R^{26}$ is a monovalent group containing an aliphatic carbon-carbon unsaturated bond is also referred to as Formula (c-1a). Likewise, Formula (c-1) in which at least one occurrence of at least one of $R^{21}$ to $R^{26}$ is a hydrogen atom is also referred to as Formula (c-1b). Specifically, the silicone [C1] may be a silicone including a structure represented by Formula (c-1a); whereas the silicone [C2] may be a silicone including a structure represented by Formula (c-1b).

In Formula (c-1), $R^{27}$ represents, in each occurrence independently, a divalent hydrocarbon group. The divalent hydrocarbon group is exemplified by linear or branched alkylene groups such as groups represented by —[$CH_2$]$_t$—, where t represents an integer of 1 or more; and divalent alicyclic hydrocarbon groups. The linear or branched alkylene groups are exemplified by $C_1$-$C_{18}$ linear or branched alkylene groups such as methylene, methylmethylene, dimethylmethylene, ethylene, propylene, and trimethylene groups. The divalent alicyclic hydrocarbon groups are exemplified by divalent cycloalkylene groups (including cycloalkylidene groups), such as 1,2-cyclopentylene, 1,3-cyclopentylene, cyclopentylidene, 1,2-cyclohexylene, 1,3-cyclohexylene, 1,4-cyclohexylene, and cyclohexylidene groups.

In Formula (c-1), s1 represents an integer of 1 or more. When s1 is an integer of 2 or more, the structure in the parentheses with s1, in plural occurrences, may be identical or different. Two or more structures, when included as the structure in the parentheses with s1, may be added to each other in any form not limited, such as a random form or block form.

In Formula (c-1), s2 represents an integer of 1 or more. When s2 is an integer of 2 or more, the structure in the parentheses with s2, in plural occurrences, may be identical or different. Two or more structures, when included as the structure in the parentheses with s2, may be added to each other in any form not limited, such as a random form or block form.

In Formula (c-1), the structure in the parentheses with s1 and the structure in the parentheses with s2 may be added to each other in any form not limited, such as a random form or block form.

The terminal structure of the silicone [C-1] is exemplified by, but not limited to, silanol, alkoxysilyl, and trialkylsilyl groups (e.g., trimethylsilyl). The silicone [C-1] may include an organic group introduced into its terminal, where the organic group is exemplified by hydrosilyl group and a group containing an aliphatic carbon-carbon unsaturated bond. More specifically, the silicone [C-1] is exemplified by a silicone represented by the structural formula:

[Chem. 34]

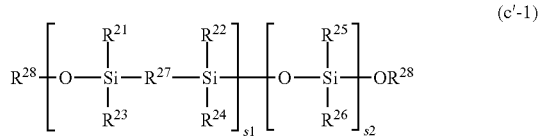

(c'-1)

wherein $R^{21}$ to $R^{27}$, s1, and s2 are as defined above; and $R^{28}$ is, in each occurrence independently, selected from a hydrogen atom, a monovalent hydrocarbon group, and a monovalent group represented by the formula:

[Chem. 35]

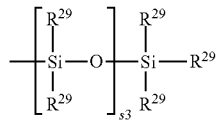

wherein $R^{29}$ is, in each occurrence identically or differently, selected from a hydrogen atom and a monovalent hydrocarbon group; and s3 represents an integer of 0 or more.

The silicone [C] may be present in a content (total amount) not critical, but preferably from 0 to less than 100 percent by weight, more preferably from 0.01 to 95 percent by weight, furthermore preferably from 0.1 to 90 percent by weight, particularly preferably from 1 to 80 percent by weight, and most preferably from 3 to 70 percent by weight, based on the total amount (100 percent by weight) of the curable resin composition. In an embodiment, the curable resin composition includes two or more silicones [C] (e.g., including both the silicone [C1] and the silicone [C2]). In this embodiment, the "content" of the silicones [C] refers to a total content of them.

The silicone [C1] may be present in a content not critical, but preferably from 0 to less than 100 percent by weight, more preferably from 0.01 to 95 percent by weight, furthermore preferably from 0.1 to 90 percent by weight, particularly preferably from 1 to 80 percent by weight, and most preferably from 3 to 70 percent by weight, based on the total amount (100 percent by weight) of the compound(s) containing an aliphatic carbon-carbon unsaturated bond (the compound(s) (U)) in the curable resin composition.

The silicone [C2] may be present in a content not critical, but preferably from 0 to less than 100 percent by weight, more preferably from 0.01 to 95 percent by weight, furthermore preferably from 0.1 to 90 percent by weight, particularly preferably from 1 to 80 percent by weight, and most preferably from 3 to 70 percent by weight, based on the total amount (100 percent by weight) of the compound(s) containing a hydrosilyl group (the compound(s) (H)) in the curable resin composition.

Isocyanuric Acid Compound [D]

The curable resin composition according to the present invention may contain an isocyanuric acid compound [D]. The "isocyanuric acid compound [D]" refers to a compound represented by Formula (d-1) (isocyanuric acid derivative).

In Formula (d-1), $R^{31}$ represents, in each occurrence, a monovalent organic group having a carbon atom at a bonding site with the nitrogen atom indicated in the formula. $R^{31}$ in plural occurrences may be identical or different. The monovalent organic group is exemplified by the monovalent organic groups illustrated as R in the ladder-type silsesquioxane [B1]. Among them, the isocyanuric acid compound [D] preferably has at least a monovalent group containing an aliphatic carbon-carbon unsaturated bond (of which an alkenyl group is more preferred) as the monovalent organic group ($R^{31}$ in Formula (d-1)).

Among them, the isocyanuric acid compound [D] is preferably one containing an aliphatic carbon-carbon unsaturated bond so as to be incorporated into the cured product. Specifically, preferred isocyanuric acid compounds [D] include compounds represented by Formulae (d-2), (d-3), and (d-4) respectively.

In Formula (d-2), $R^{32}$ represents a monovalent group containing an aliphatic carbon-carbon unsaturated bond. The monovalent group containing an aliphatic carbon-carbon unsaturated bond is exemplified by alkenyl groups such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl groups; alkynyl groups such as ethynyl and propynyl groups; cycloalkenyl groups such as cyclohexenyl group; and groups having any of the alkenyl, alkynyl, and cycloalkenyl groups. $R^{33}$ is, in each occurrence independently, selected from a hydrogen atom and a $C_1$-$C_8$ linear or branched alkyl group. The $C_1$-$C_8$ linear or branched alkyl group is exemplified by methyl, ethyl, propyl, isopropyl, butyl, isobutyl, s-butyl, pentyl, hexyl, heptyl, octyl, and ethylhexyl groups. Of the alkyl groups, preferred are $C_1$-$C_3$ linear or branched alkyl groups such as methyl, ethyl, propyl, and isopropyl groups. $R^{33}$ in plural occurrences may be identical or different. In particular, $R^{33}$ in Formula (d-2) is preferably a hydrogen atom at every occurrence.

The compound represented by Formula (d-2) usable herein may also be modified before use by allowing the compound to react with a compound (e.g., an alcohol or acid anhydride) reactive with an epoxy group.

The compound represented by Formula (d-2) may also be allowed to react (be hydrosilylated) with a compound containing a hydrosilyl group before use. Typically, the compound represented by Formula (d-2) may be allowed to react with the ladder-type silsesquioxane [B2] in the presence of a hydrosilylation catalyst to give a product, and the product may be used as a component to constitute the curable resin composition according to the present invention. Alternatively but not limitatively, the compound represented by Formula (d-2) may be allowed to react with the aftermentioned cyclic siloxane [E2] in the presence of a hydrosilylation catalyst to give a product, and the product may be used as a component to constitute the curable resin composition according to the present invention. The hydrosilylation catalyst is exemplified as in the ladder type silsesquioxane [B2] production method. Hydrosilylation reaction conditions to be applied may be appropriately selected from known or customary hydrosilylation reaction conditions.

The compound represented by Formula (d-2) may be mixed with a silane coupling agent before blending with another component, as described later. This is performed from the viewpoint of providing better compatibility with the other component.

The compound represented by Formula (d-2) may be present in a content not critical, but preferably from 0.01 to 10 percent by weight, more preferably from 0.05 to 5 percent by weight, and furthermore preferably from 0.1 to 3 percent by weight, based on the total amount (100 percent by weight) of the curable resin composition. The compound represented by Formula (d-2), if present in a content less than 0.01 percent by weight, may fail to help the cured product to have satisfactory barrier properties against a corrosive gas and/or satisfactory adhesion to an adherend. In contrast, the compound represented by Formula (d-2), if present in a content greater than 10 percent by weight, may cause solid precipitation in the curable resin composition or may cause the cured product to become cloudy.

In Formula (d-3), $R^{34}$ represents, in each occurrence, a monovalent group containing an aliphatic carbon-carbon unsaturated bond. The monovalent group containing an aliphatic carbon-carbon unsaturated bond is exemplified by the groups as in Formula (d-2). $R^{34}$ in plural occurrences may be identical or different. $R^{35}$ is selected from a hydrogen atom and a $C_1$-$C_8$ linear or branched alkyl group, and the $C_1$-$C_8$ linear or branched alkyl group is exemplified by the groups illustrated as $R^{33}$. $R^{35}$ in Formula (d-3) is particularly preferably a hydrogen atom.

The compound represented by Formula (d-3) may be modified before use by allowing the compound to react with a compound (e.g., an alcohol or acid anhydride) reactive with an epoxy group, as with the compound represented by Formula (d-2).

The compound represented by Formula (d-3) may also be allowed to react (be hydrosilylated) with a compound containing a hydrosilyl group before use, as with the compound represented by Formula (d-2). Specifically, the compound represented by Formula (d-3) may be allowed to react typically with the ladder-type silsesquioxane [B2] or the cyclic siloxane [E2] to give a product, and the product may be used as a component to constitute the curable resin composition according to the present invention.

From the viewpoint of providing better compatibility with another component, the compound represented by Formula (d-3) may be mixed with the silane coupling agent before blending with the other component.

The compound represented by Formula (d-3) may be present in a content not critical, but preferably from 0.01 to 10 percent by weight, more preferably from 0.05 to 5 percent by weight, and furthermore preferably from 0.1 to 3 percent by weight, based on the total amount (100 percent by weight) of the curable resin composition. The compound, represented by Formula (d-3), if present in a content less than 0.01 percent by weight, may fail to help the cured product to have satisfactory barrier properties against a corrosive gas and/or satisfactory adhesion to an adherend. In contrast, the compound represented by Formula (d-3), if present in a content greater than 10 percent by weight, may cause solid precipitation in the curable resin composition or may cause the cured product to become cloudy.

In Formula (d-4), $R^{36}$ represents, in each occurrence independently, a monovalent group containing an aliphatic carbon-carbon unsaturated bond. The monovalent group containing an aliphatic carbon-carbon unsaturated bond is exemplified by the groups as in Formula (d-2). $R^{36}$ in plural occurrences may be identical or different.

The compound represented by Formula (d-4) may be allowed to react (be hydrosilylated) with a compound containing a hydrosilyl group before use, as with the compound represented by Formula (d-2). Specifically, the compound may be allowed to react typically with the ladder-type silsesquioxane [B2] or the cyclic siloxane [E2] to give a product, and the product may be used as a component to constitute the curable resin composition according to the present invention.

From the viewpoint of providing better compatibility with another component, the compound represented by Formula (d-4) may be mixed with the silane coupling agent before blending with the other component.

The compound represented by Formula (d-4) may be present in a content not critical, but preferably from 0.01 to 10 percent by weight, more preferably from 0.05 to 5 percent by weight, and furthermore preferably from 0.1 to 3 percent by weight, based on the total amount (100 percent by weight) of the curable resin composition. The compound represented by Formula (d-4), if present in a content less than 0.01 percent by weight, may fail to help the cured product to have satisfactory barrier properties against a corrosive gas and/or satisfactory adhesion to an adherend. In contrast, the compound represented by Formula (d-4), if present in a content greater than 10 percent by weight, may cause solid precipitation in the curable resin composition or may cause the cured product to become cloudy.

Examples of the isocyanuric acid compound [D] usable herein further include, in addition to the compounds represented by Formulae (d-2) to (d-4), compounds represented by Formula (d-5):

[Chem. 36]

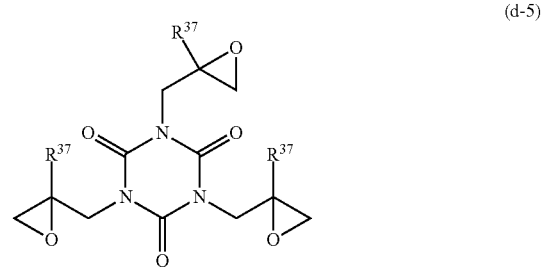

(d-5)

In Formula (d-5), $R^{37}$ is, in each occurrence independently, selected from a hydrogen atom and a $C_1$-$C_8$ linear or branched alkyl group. $R^{37}$ is exemplified by the groups illustrated as $R^{33}$. $R^{37}$ in plural occurrences may be identical or different. $R^{37}$ in Formula (d-5) is, in each occurrence, preferably a hydrogen atom.

Examples of the isocyanuric acid compound [D] usable herein further include compounds (e.g., compounds containing an alicyclic epoxy group) represented by Formulae (d-6) to (d-8):

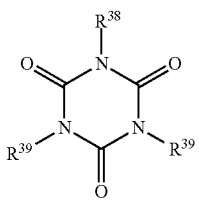

(d-6)

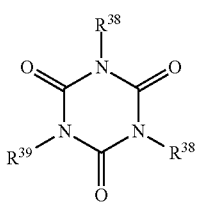

(d-7)

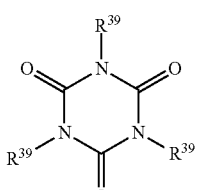

(d-8)

In Formulae (d-6) and (d-7), $R^{38}$ represents, in each occurrence independently, an alkyl group (linear or branched alkyl group). Among them, $R^{38}$ is, in each occurrence, preferably $C_1$-$C_{10}$ alkyl, and more preferably $C_1$-$C_4$ alkyl. $R^{38}$ in Formula (d-7) in two occurrences may be identical or different. In Formulae (d-6) to (d-8), $R^{39}$ represents, in each occurrence independently, a monovalent group represented by Formula (d') expressed below. In Formula (d'), Z represents a linkage group (divalent group having one or more atoms) having a carbon atom at the bonding site with the nitrogen atom indicated in Formulae (d-6) to (d-8). The linkage group is exemplified by divalent hydrocarbon groups including $C_1$-$C_{30}$ alkylene groups such as methylene and ethylene groups, and cycloalkylene groups; and groups including one or more divalent hydrocarbon groups linked to one or more heteroatom-containing divalent groups that are exemplified by carbonyl, ether, thioether, ester, carbonate, and amido groups. $R^{39}$ in plural occurrences respectively in Formulae (d-6) and (d-8) may be identical or different.

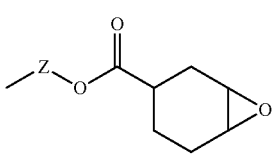

(d')

More specifically, the isocyanuric acid compound [D] is exemplified by monoallyl diglycidyl isocyanurate, 1-allyl-3,5-bis(2-methylepoxypropyl)-isocyanurate, 1-(2-methylpropenyl)-3,5-diglycidyl-isocyanurate, 1-(2-methylpropenyl)-3,5-bis(2-methylepoxypropyl)-isocyanurate, diallyl monoglycidyl isocyanurate, 1,3-diallyl-5-(2-methylepoxypropyl)-isocyanurate, 1,3-bis(2-methylpropenyl)-5-glycidyl-isocyanurate, 1,3-bis(2-methylpropenyl)-5-(2-methylepoxypropyl)-isocyanurate, triallyl isocyanurate, tris(2-methylpropenyl) isocyanurate, triglycidyl isocyanurate, dimethyl allyl isocyanurate, methyl diallyl isocyanurate, ethyl diallyl isocyanurate, propyl diallyl isocyanurate, butyl diallyl isocyanurate, phenyl diallyl isocyanurate, and the compound represented by Formula (d-9). The curable resin composition according to the present invention may employ each of different isocyanuric acid compounds [D] alone or in combination.

The isocyanuric acid compound [D] may be present in a content (total amount) not critical, but preferably from 0.01 to 10 percent by weight, more preferably from 0.05 to 5 percent by weight, and furthermore preferably from 0.1 to 3 percent by weight, based on the total amount (100 percent by weight) of the curable resin composition. The isocyanuric acid compound [D], if present in a content less than 0.01 percent by weight, may fail to help the cured product to have satisfactory barrier properties against a corrosive gas and/or satisfactory adhesion to an adherend. In contrast, the isocyanuric acid compound [D], if present in a content greater than 10 percent by weight, may adversely affect the curability, may cause solid precipitation in the curable resin composition, or may cause the cured product to become cloudy. When the curable resin composition includes two or more isocyanuric acid compounds [D], the "content" of the isocyanuric acid compounds [D] refers to a total content of them.

Cyclic Siloxane [E]

The cyclic siloxane [E] for use in the curable resin composition according to the present invention is a compound (the cyclic siloxane [E1] and/or the cyclic siloxane [E2]) having a cyclic structure composed of a Si—O bond. The cyclic siloxane [E1] is a cyclic siloxane [E] containing an aliphatic carbon-carbon unsaturated bond in the molecule; whereas the cyclic siloxane [E2] is a cyclic siloxane [E] containing a hydrosilyl group in the molecule, as described above.

The cyclic siloxane [E1] is not limited, as long as being a siloxane compound containing an aliphatic carbon-carbon unsaturated bond (of which an aliphatic carbon-carbon double bond is preferred) in the molecule and having a cyclic structure composed of a Si—O bond. The cyclic siloxane [E1] is exemplified by a compound represented by Formula (e-1) and having a group containing an aliphatic carbon-carbon unsaturated bond. The cyclic siloxanes [E1] do not include silsesquioxanes (e.g., the polyorganosilsesquioxanes [A] and the ladder-type silsesquioxanes [B]) having a cyclic structure.

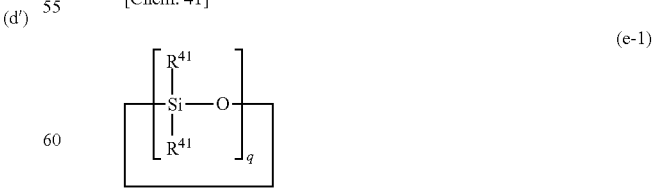

(e-1)

In Formula (e-1), $R^{41}$ represents, in each occurrence independently, a monovalent organic group and is exemplified as with the monovalent organic groups illustrated as R. At least one occurrence of $R^{41}$ is a group containing an aliphatic carbon-carbon unsaturated bond. $R^{41}$ in plural occurrences may be identical or different. Preferably, two or more of $R^{41}$ in the compound represented by Formula (e-1) are independently a group containing an aliphatic carbon-carbon unsaturated bond (of which an aliphatic carbon-carbon double bond is preferred). The group containing an aliphatic carbon-carbon unsaturated bond is exemplified by the groups illustrated as $R^{3e}$ in Formula (a-3). Among them, alkenyl groups are preferred, and vinyl group is more preferred as the group containing an aliphatic carbon-carbon unsaturated bond. In Formula (e-1), q represents an integer of 3 or more (e.g., an integer from 3 to 10) and is preferably an integer from 3 to 7, and more preferably 4.

Specifically, the cyclic siloxane [E1] is exemplified by 1,3,5,7-tetramethyl-1,3,5,7-tetravinylcyclotetrasiloxane, 1,3,5,7-tetramethyl-1,3,5,7-tetrahexenylcyclotetrasiloxane, 1-propyl-3,5,7-trivinyl-1,3,5,7-tetramethylcyclotetrasiloxane, 1,5-divinyl-3,7-dihexyl-1,3,5,7-tetramethylcyclotetrasiloxane, 1,3,5-trivinyl-1,3,5-trimethylcyclotrisiloxane, 1,3,5,7,9-pentavinyl-1,3,5,7,9-pentamethylcyclopentasiloxane, and 1,3,5,7,9,11-hexavinyl-1,3,5,7,9,11-hexamethylcyclohexasiloxane. Each of different cyclic siloxanes [E1] may be used alone or in combination. Among them, 1,3,5,7-tetramethyl-1,3,5,7-tetravinylcyclotetrasiloxane is preferred as the cyclic siloxane [E1]. This is because the compound readily effectively helps the curable resin composition to have a lower initial viscosity and help the cured product to have better barrier properties against a corrosive gas.

The cyclic siloxane [E1] may be one further containing two or more hydrosilyl groups per molecule. In this case, the cyclic siloxane [E1] may be usable also as the cyclic siloxane [E2].

The cyclic siloxane [E1] may be present in the curable resin composition according to the present invention in a content (total amount) not critical, but preferably from 0.01 to 20 percent by weight, more preferably from 0.1 to 10 percent by weight, and furthermore preferably from 0.5 to 5 percent by weight, based on the total amount (100 percent by weight) of the curable resin composition. The cyclic siloxane [E1], if present in a content less than 0.01 percent by weight, may fail to help the cured product to have sufficient barrier properties against a corrosive gas or may cause the curable resin composition to have an excessively high viscosity. In contrast, the cyclic siloxane [E1], if present in a content greater than 20 percent by weight, may cause the cured product to have excessively high hardness, to be susceptible to cracking, or to be readily peeled off (detached) from an adherend.

The cyclic siloxane [E2] is not limited, as long as being a siloxane compound containing a hydrosilyl group in the molecule and having a cyclic structure composed of a Si—O bond, but is exemplified by a compound represented by Formula (e-2) below. However, the cyclic siloxanes [E2] do not include silsesquioxanes (e.g., the polyorganosilsesquioxane [A] and the ladder-type silsesquioxane [B]) having a cyclic structure.

In Formula (e-2), $R^{42}$ is, in each occurrence independently, selected from a hydrogen atom and a monovalent organic group. The monovalent organic group is exemplified by the monovalent organic groups illustrated as R. At least one occurrence of $R^{42}$ is a hydrogen atom. However, at least two occurrences of $R^{42}$ in the compound represented by Formula (e-2) are preferably hydrogen atoms. $R^{42}$ in plural occurrences may be identical or different. In Formula (e-2), r represents an integer of 3 or more (e.g., an integer from 3 to 10) and is preferably an integer from 3 to 7, and more preferably 4.

Specifically, the cyclic siloxane [E2] is exemplified by cyclic siloxanes containing six hydrosilyl groups per molecule, such as cyclotrisiloxane and hexamethylcyclohexasiloxanes (e.g., 1,3,5,7,9,11-hexamethylcyclohexasiloxane); cyclic siloxanes containing five hydrosilyl groups per molecule, such as pentamethylcyclopentasiloxanes (e.g., 1,3,5,7,9-pentamethylcyclopentasiloxane); cyclic siloxanes containing four hydrosilyl groups per molecule, such as tetramethylcyclotetrasiloxanes (e.g., 1,3,5,7-tetramethylcyclotetrasiloxane); cyclic siloxanes containing three hydrosilyl groups per molecule, such as 1-propyl-1,3,5,7-tetramethylcyclotetrasiloxane, trimethylcyclotrisiloxanes (e.g., 1,3,5-trimethylcyclotrisiloxane), pentamethylcycletetrasiloxanes (e.g., 1,1,3,5,7-pentamethylcyclotetrasiloxane), and heptamethylcyclopentasiloxanes (e.g., 1,1,3,5,5,7,9-heptamethylcyclopentasiloxane); and cyclic siloxanes containing two hydrosilyl groups per molecule, such as dihexyltetramethylcyclotetrasiloxanes (e.g., 3,7-dihexyl-1,3,5,7-tetramethylcyclotetrasiloxane) and hexamethylcyclotetrasiloxanes (e.g., 1,1,3,5,5,7-hexamethylcyclotetrasiloxane). Each of different cyclic siloxanes [E2] may be used alone or in combination. Among them, 1,3,5,7-tetramethylcyclotetrasiloxane is particularly preferred. This is because the compound readily effectively helps the curable resin composition to have a lower initial viscosity and helps the cured product to have better barrier properties against a corrosive gas.

The cyclic siloxane [E2] may also be one containing two or more aliphatic carbon-carbon unsaturated bonds per molecule. The cyclic siloxane [E2] in this case may be usable also as the cyclic siloxane [E1].

The cyclic siloxane [E2] may be present in the curable resin composition according to the present invention in a content (total amount) not critical, but preferably from 0.01 to 30 percent by weight, more preferably from 0.1 to 20 percent by weight, and furthermore preferably from 0.5 to 10 percent by weight, based on the total amount (100 percent by weight) of the curable resin composition. The cyclic siloxane [E2], if present in a content less than 0.01 percent by weight, may fail to help the cured product to have satisfactory barrier properties against a corrosive gas. In contrast, the cyclic siloxane [E2], if present in a content greater than 30 percent by weight, may cause the cured product to have excessively high hardness and to be susceptible to cracking.

Condensation Compound [F]

The curable resin composition according to the present invention may contain a condensation compound [F]. The condensation compound [F] refers to a condensation compound of a compound represented by Formula (f-1) (trifunctional silane compound) with a compound represented by Formula (f-2) (bifunctional silane compound).

In Formula (f-1), $R^{51}$ represents a monovalent hydrocarbon group. The monovalent hydrocarbon group is exemplified by the groups illustrated as $R^{1a}$ to $R^{1f}$ in Formula (a-1). $R^{52}$ represents, in each occurrence independently, a mon-

[Chem. 42]

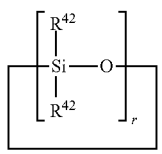

(e-2)

ovalent hydrocarbon group. The monovalent hydrocarbon group is exemplified by the groups illustrated as $R^{1a}$ to $R^{1f}$ in Formula (a-1).

In (f-2), $R^{53}$ and $R^{54}$ represent, in each occurrence independently, a monovalent hydrocarbon group. $R^{53}$ in two occurrences may be identical or different. The monovalent hydrocarbon group is exemplified by the groups illustrated as $R^{1a}$ to $R^{1f}$ in Formula (a-1). $R^{55}$ represents a monovalent group containing an aliphatic carbon-carbon unsaturated bond. The monovalent group containing an aliphatic carbon-carbon unsaturated bond is exemplified by the groups illustrated as $R^{3e}$ in Formula (a-3).

The condensation compound [F] may be produced by subjecting both the compounds represented by Formulae (f-1) and (f-2) to condensation (hydrolysis and condensation reactions). Each of different compounds represented by Formula (f-1) may be used alone or in combination as materials to form the condensation compound [F]. Likewise, each of different compounds represented by Formula (f-2) may be used alone or in combination to form the condensation compound [F].

A way to condensate the compound represented by Formula (f-1) and the compound represented by Formula (f-2) is not limited and may employ a known or customary process of subjecting an alkoxysilane compound to a condensation reaction. Specifically, the process may be performed typically under conditions as with the condensation (silanol-condensation) of the trifunctional silane compound represented by Formula (b-i).

The ratio (in weight ratio) of the compound represented by Formula (f-1) to the compound represented by Formula (f-2) to constitute the condensation compound [F] is not critical, but preferably from 1:99 to 99:1, and more preferably from 10:90 to 90:10.

The condensation compound [F] may be a condensation compound obtained by condensing the compound represented by Formula (f-1) and the compound represented by Formula (f-2), with a tetrafunctional silane compound. Specifically, the condensation compound [F] may be a condensation compound (condensate) of the compound represented by Formula (f-1) (trifunctional silane compound), the compound represented by Formula (f-2) (bifunctional silane compound), with the tetrafunctional silane compound. The tetrafunctional silane compound is represented typically by $Si(OR^{56})_4$ wherein $R^{56}$ represents, in each occurrence independently, a monovalent hydrocarbon group and is exemplified by the groups illustrated as $R^{1a}$ to $R^{1f}$ in Formula (a-1).

The condensation compound [F] may be present in the curable resin composition according to the present invention in a content (total amount) not critical, but preferably from 0 to 80 percent by weight, and more preferably from 0.1 to 50 percent by weight, based on the total amount (100 percent by weight) of the curable resin composition. The condensation compound [F], if present in a content greater than 80 percent by weight, may cause the resulting resin (cured product) to be fragile due to a high crosslinking density.

Hydrosilylation Catalyst

The curable resin composition according to the present invention may further contain a hydrosilylation catalyst. The hydrosilylation catalyst is exemplified by well-known catalysts for hydrosilylation reactions, such as platinum-based catalysts, rhodium-based catalysts, and palladium-based catalysts. Specifically, the hydrosilylation catalyst is exemplified by platinum-based catalysts including platinum fine powders, platinum black, platinum supported on silica fine powders, platinum supported on activated carbon, chloroplatinic acid, complexes of chloroplatinic acid typically with an alcohol, aldehyde, or ketone, platinum-olefin complexes, platinum-carbonyl complexes (e.g., platinum-carbonyl vinyl methyl complex), platinum-vinylmethylsiloxane complexes (e.g., platinum-divinyltetramethyldisiloxane complex and platinum-cyclovinylmethylsiloxane complex), platinum-phosphine complexes, and platinum-phosphite complexes; and palladium-based catalysts and rhodium-based catalysts corresponding to the platinum-based catalysts, except for containing a palladium atom and a rhodium atom, respectively, instead of the platinum atom. Each of different hydrosilylation catalysts may be used alone or in combination. Among them, preferred are platinum-vinylmethylsiloxane complex, platinum-carbonyl vinyl methyl complex, and complexes of chloroplatinic acid with an alcohol or aldehyde. These are preferred for good reaction rates.

The hydrosilylation catalyst may be present in a content (blending amount) not critical, but preferably from $1\times10^{-8}$ to $1\times10^{-2}$ mole, and more preferably from $1.0\times10^{-6}$ to $1.0\times10^{-3}$ mole, per 1 mole of the total amount of aliphatic carbon-carbon unsaturated bonds in compounds containing an aliphatic carbon-carbon unsaturated bond and contained in the curable resin composition. The hydrosilylation catalyst, if used in an amount of less than $1\times10^{-8}$ mole, may fail to help the reaction to proceed sufficiently. In contrast, the hydrosilylation catalyst, if used in an amount greater than $1\times10^{-2}$ mole, may cause the cured product to readily undergo coloring.

Silane Coupling Agent

The curable resin composition according to the present invention may further contain a silane coupling agent. Particularly, the curable resin composition, when containing the silane coupling agent, may readily help the cured product to have better adhesion to an adherend. In addition, the silane coupling agent has good compatibility typically with the isocyanuric acid compound [D] (particularly, a monoallyl diglycidyl isocyanurate compound) and the ladder-type silsesquioxane [B2]. The silane coupling agent therefore typically helps the isocyanuric acid compound [D] to have better compatibility with another component. Specifically typically, the isocyanuric acid compound [D] upon use may be mixed with the silane coupling agent to give a composition (composite) before blending with other components. This readily gives a homogeneous resin composition.

The silane coupling agent may be any of known or customary silane coupling agents without limitation. The silane coupling agent is exemplified by epoxy-containing silane coupling agents such as 3-glycidoxypropyltrimethoxysilane, 2-(3,4-epoxycyclohexyl)ethyltrimethoxysilane, 3-glycidoxypropylmethyldiethoxysilane, and 3-glycidoxypropyltriethoxysilane; amino-containing silane coupling agents such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, and N-(β-aminoethyl)-γ-aminopropylmethyldiethoxysilane; and other silane coupling agents such as tetramethoxysilane, tetraethoxysilane, methyltriethoxysilane, dimethyldiethoxysilane, methyltriethoxysilane, vinyltriethoxysilane, vinyltrimethoxysilane, vinyltris(methoxyethoxy)silane, phenyltrimethoxysilane, diphenyldimethoxysilane, vinyltriacetoxysilane, γ-(meth)acryloyloxypropyltriethoxysilane, γ-(meth)acryloyloxypropyltrimethoxysilane, γ-(meth)acryloyloxypropylmethyldimethoxysilane, γ-(meth)acryloyloxypropylmethyldiethoxysilane, mercaptopropylenetrimethoxysilane, and mercaptopropylenetriethoxysilane. Among them, epoxy-containing silane coupling agents are preferred, and 3-glycidoxypropyltrimethoxysilane is more preferred to be used. Each of different silane coupling agents may be used alone or in combination.

The silane coupling agent may be present in a content (blending amount) not critical, but preferably from 0.01 to 15 percent by weight, more preferably from 0.1 to 10 percent by weight, and furthermore preferably from 0.5 to 5 percent by weight, based on the total amount (100 percent by weight) of the curable resin composition. The silane coupling agent, if present in a content less than 0.01 percent by weight, may fail to help the cured product to offer sufficient adhesion to an adherend and may fail to sufficiently effectively help the isocyanuric acid compound [D] (particularly a monoallyl diglycidyl isocyanurate compound) to be miscible (compatible) with another component. In contrast, the silane coupling agent, if present in a content greater than 15 percent by weight, may cause insufficient curing and may cause the cured product to be inferior in toughness, heat resistance, and/or barrier properties.

Hydrosilylation Inhibitor

The curable resin composition according to the present invention may include a hydrosilylation inhibitor so as to adjust the rate of the curing reaction (hydrosilylation). The hydrosilylation inhibitor is exemplified by alkyne alcohols such as 3-methyl-1-Butyn-3-ol, 3,5-dimethyl-1-hexyn-3-ol, and phenylbutynol; ene-yne compounds such as 3-methyl-3-penten-1-yne and 3,5-dimethyl-3-hexen-1-yne; and thiazole, benzothiazole, and benzotriazole. Each of different hydrosilylation inhibitors may be used alone or in combination. The content of the hydrosilylation inhibitor may vary depending on crosslinking conditions of the curable resin composition, is not critical, but is practically preferably in the range from 0.00001 to 5 percent by weight as a content in the curable resin composition.

Solvent

The curable resin composition according to the present invention may include a solvent. The solvent is exemplified by conventionally known solvents such as toluene, hexane, isopropanol, methyl isobutyl ketone, cyclopentanone, and propylene glycol monomethyl ether acetate. Each of different solvents may be used alone or in combination.

Other Silane Compound

The curable resin composition according to the present invention may include another silane compound (e.g., a compound containing a hydrosilyl group). The other silane compound is exemplified by linear or branched siloxanes containing a SiH group, such as methyltris(dimethylsiloxy)silane, tetrakis(dimethylsiloxy)silane, 1,1,3,3-tetramethyldisiloxane, 1,1,3,3,5,5-hexamethyltrisiloxane, 1,1,1,3,5,5,5-heptamethyltrisiloxane, 1,1,3,3,5,5,7,7-octamethyltetrasiloxane, 1,1,1,3,5,5,7,7,7-nonamethyltetrasiloxane, 1,1,3,3,5,5,7,7,9,9-decamethylpentasiloxane, and 1,1,3,3,5,5,7,7,9,9-undecamethylpentasiloxane. Of the silane compounds, those containing two or more SiH groups per molecule are preferred. Each of different silane compounds may be used alone or in combination. The silane compound may be present in a content not critical, but preferably 5 percent by weight or less (e.g., from 0 to 5 percent by weight), and more preferably 1.5 percent by weight or less, based on the total amount (100 percent by weight) of the curable resin composition.

Additives

The curable resin composition according to the present invention may include one or more customary additives as other optional components. The additives are exemplified by fillers; solvents; stabilizers such as antioxidants, ultraviolet absorbers, photostabilizers, and thermal stabilizers; flame retardants such as phosphorus flame retardants, halogen flame retardants, and inorganic flame retardants; flame retardant promoters; reinforcing materials such as fillers other than those specified below; nucleating agents; coupling agents; lubricants; waxes; plasticizers; releasing agents; impact modifiers; hue modifiers; flow improvers; colorants such as dyestuffs and pigments; dispersing agents; antifoaming agents; defoaming agents; antimicrobial agents; antiseptic agents; viscosity modifiers; and thickeners. The fillers are exemplified by inorganic fillers such as precipitated silica, hydrous silica (wet silica), fumed silica, pyrogenic silica, titanium oxide, alumina, glass, quartz, aluminosilicate, iron oxide, zinc oxide, calcium carbonate, carbon black, silicon carbide, silicon nitride, and boron nitride, as well as inorganic fillers obtained by treating these fillers with any of organic silicon compounds such as organohalosilanes, organoalkoxysilanes, and organosilazanes; fine powders of silicone resins, epoxy resins, fluorocarbon resins, and other organic resins excluding those mentioned above; and electroconductive powders of metals such as silver and copper. Each of different additives may be used alone or in combination.

The curable resin composition according to the present invention may have preferably, but not limitatively, such a formulation (compounding formulation) that aliphatic carbon-carbon unsaturated bonds (particularly, aliphatic carbon-carbon double bonds) are present in an amount from 0.2 to 4 moles, more preferably from 0.5 to 1.5 moles, and furthermore preferably from 0.8 to 1.2 moles, per 1 mole of hydrosilyl groups present in the curable resin composition. Control of the ratio between the hydrosilyl group and the aliphatic carbon-carbon unsaturated bond within the range may readily help the cured product to have still better heat resistance, transparency, flexibility, reflow resistance, and barrier properties against a corrosive gas.

The curable resin composition according to the present invention may be prepared typically, but not limitatively, by stirring and mixing the components at room temperature. The curable resin composition according to the present invention may be used as a one-part composition or a multi-part (e.g., two-part) composition. The one-part composition is prepared by mixing respective components in advance and is used as intact. The multi-part composition is prepared typically by storing two or more components separately, and mixing the two or more components in predetermined proportions before use.

The curable resin composition according to the present invention is preferably, but not limitatively, liquid at room temperature (about 25° C.) More specifically, the curable resin composition according to the present invention has a viscosity preferably from 300 to 20000 mPa·s, more preferably from 500 to 10000 mPa·s, and furthermore preferably from 1000 to 8000 mPa·s at 23° C. The curable resin composition, if having a viscosity less than 300 mPa·s at 23° C., may cause the cured product to have inferior heat resistance. In contrast, the curable resin composition, if having a viscosity greater than 20000 mPa·s at 23° C., may be prepared and handled in a difficult manner and may cause the cured product to readily include bubbles as remaining. The viscosity of the curable resin composition may be measured typically by the procedure for the viscosity of the polyorganosilsesquioxane [A].

Cured Product

The curable resin composition according to the present invention can be cured by allowing a hydrosilylation reaction to proceed therein and give a cured product. The resulting cured product is also referred to as a "cured product according to the present invention". Curing (hydrosilylation) conditions are not limited and may be appropriately selected from among customarily known conditions. However, from the viewpoint typically of reaction rate, the curing may be performed at a temperature (curing temperature) of preferably from 25° C. to 180° C., and more preferably from 60° C. to 150° C. for a time (curing time) of preferably from 5 to 720 minutes. The cured product according to the present invention excels in various properties such as heat resistance, transparency, and flexibility and, above all, excels in barrier properties against a corrosive gas such as a $SO_X$ gas.

Encapsulating Agent and Optical Semiconductor Device

The curable resin composition according to the present invention is preferably usable as a resin composition for optical semiconductor encapsulation. Specifically, an encapsulating agent according to the present invention includes the curable resin composition according to the present invention as an essential component and is preferably usable as an encapsulating agent for an optical semiconductor element (light-emitting diode). The encapsulating agent according to the present invention upon curing gives an encapsulant (cured product) that excels in various properties such as heat resistance, transparency, and flexibility and, above all, excels in barrier properties against a corrosive gas. The encapsulating agent according to the present invention is preferably usable particularly as an encapsulating agent for a high-brightness, short-wavelength optical semiconductor element. Encapsulation of an optical semiconductor element with the encapsulating agent according to the present invention can give an optical semiconductor device. The optical semiconductor element encapsulation may be performed by pouring the encapsulating agent according to the present invention into a predetermined forming die; and heating and curing the encapsulating agent under predetermined conditions. The curing temperature and time may be set within ranges as with the preparation of the cured product.

The curable resin composition according to the present invention is preferably usable not only for the encapsulating agent use (particularly for optical semiconductor element encapsulation use), but also for optical-related and semiconductor-related uses such as functional coating agents, heat-resistant plastic lenses, transparent appliances, adhesives (e.g., heat-resistant transparent adhesives), optical semiconductor encapsulants (encapsulating agents), electrical insulating materials (e.g., insulating films), laminated sheets, coatings, inks, coating materials, sealants, resists, composite materials, transparent substrates, transparent sheets, transparent films, optical elements, optical lenses, optical members, stereolithographic materials, electronic papers, touch-screen panels, solar cell substrates, optical waveguides, light guide panels, and holographic memories.

Among them, the curable resin composition according to the present invention is preferably usable in uses typically as encapsulants to cover (encapsulate) optical semiconductor elements in high-brightness and short-wavelength optical semiconductor devices; and as encapsulants to encapsulate semiconductor elements in high heat-resistant and high-breakdown-voltage semiconductor devices (e.g., power semiconductor devices), where conventional resin materials are hardly applicable to these uses.

EXAMPLES

The present invention will be illustrated in further detail with reference to several examples below. It should be noted, however, that the examples are by no means intended to limit the scope of the invention. Reaction products were identified by $^1$H-NMR spectrum measurement with JEOL ECA500 (500 MHz). The weight-average molecular weights of the reaction products were measured with Alliance HPLC System 2695 (supplied by Warters Corporation) and Refractive Index Detector 2414 (supplied by Warters Corporation) using two Tskgel $GMH_{HR}$-M columns (supplied by Tosoh Corporation), one guard column Tskgel guard column $H_{HR}L$ (supplied by Tosoh Corporation), a column oven COLUMN HEATER U-620 (supplied by Sugai Chemie, Inc.), and THE as a solvent, at a measurement temperature of 40° C.

Silicones [C] used in the examples are given as follows:

GD-1012A: Product supplied by Eternal Chemical Co., Ltd., having a vinyl content of 1.33 percent by weight, a phenyl content of 0 percent by weight, a SiH content (in terms of hydrido) of 0 percent by weight, a number-average molecular weight of 5108, and a weight-average molecular weight of 23385;

GD-1012B: Product supplied by Eternal Chemical Co., Ltd., having a vinyl content of 1.65 percent by weight, a phenyl content of 0 percent by weight, a SiH content (in terms of hydrido) of 0.19 percent by weight, a number-average molecular weight of 4563, and a weight-average molecular weight of 21873;

KER-2500A: Product supplied by Shin-Etsu Chemical Co., Ltd., having a vinyl content of 1.53 percent by weight, a phenyl content of 0 percent by weight, a SiH content (in terms of hydrido) of 0.03 percent by weight, a number-average molecular weight of 4453, and a weight-average molecular weight of 19355;

KER-2500B: Product supplied by Shin-Etsu Chemical Co., Ltd., having a vinyl content of 1.08 percent by weight, a phenyl content of 0 percent by weight, a SiH content (in terms of hydrido) of 0.13 percent by weight, a number-average molecular weight of 4636, and a weight-average molecular weight of 18814;

GD-1130A: Product supplied by Eternal Chemical Co., Ltd., having a vinyl content of 4.32 percent by weight, a phenyl content of 44.18 percent by weight, a SiH content (in terms of hydrido) of 0 percent by weight, a number-average molecular weight of 1107, and a weight-average molecular weight of 6099;

GD-1130B: Product supplied by Eternal Chemical Co., Ltd., having a vinyl content of 3.45 percent by weight, a phenyl content of 50.96 percent by weight, a SiH content (in terms of hydrido) of 0.17 percent by weight, a number-average molecular weight of 631, and a weight-average molecular weight of 1305;

OE-6630A: Product supplied by Dow Corning Toray Co., Ltd., having a vinyl content of 2.17 percent by weight, a phenyl content of 51.94 percent by weight, a SiH content (in terms of hydrido) of 0 percent by weight, a number-average molecular weight of 2532, and a weight-average molecular weight of 4490;

OE-6630B: Product supplied by Dow Corning Toray Co., Ltd., having a vinyl content of 3.87 percent by weight, a phenyl content of 50.11 percent by weight, a SiH content (in terms of hydrido) of 0.17 percent by weight, a number-average molecular weight of 783, and a weight-average molecular weight of 1330;

ASP-1120A: Product supplied by Shin-Etsu Chemical Co., Ltd., having a vinyl content of 5.94 percent by weight, a phenyl content of 64.61 percent by weight, a SiH content (in terms of hydrido) of 0 percent by weight, a number-average molecular weight of 590, and a weight-average molecular weight of 780;

ASP-1120B: Product supplied by Shin-Etsu Chemical Co., Ltd., having a vinyl content of 3.31 percent by weight, a phenyl content of 49.08 percent by weight, a SiH content (in terms of hydrido) of 0.30 percent by weight, a number-average molecular weight of 680, and a weight-average molecular weight of 1320;

OE-6665A: Product supplied by Dow Corning Toray Co., Ltd., having a vinyl content of 11.97 percent by weight, a phenyl content of 21.39 percent by weight, a SiH content (in terms of hydrido) of 0 percent by weight, a number-average molecular weight of 831, and a weight-average molecular weight of 1455; and OE-6665B: Product supplied by Dow Corning Toray Co., Ltd., having a vinyl content of 3.76 percent by weight, a phenyl content of 48.58 percent by weight, a SiH content (in terms of hydrido) of 0.16 percent by weight, a number-average molecular weight of 744, and a weight-average molecular weight of 1274.

Production Example 1

Figure 2:
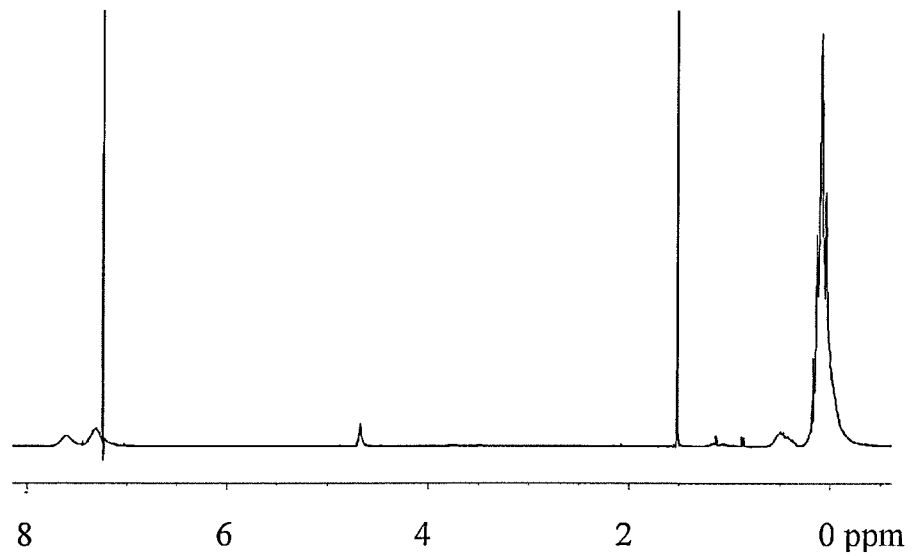
FIG. 2 depicts a $^1$H-NMR spectrum chart of the ladder-type silsesquioxane containing a terminal SiH-containing group and a terminal TMS group, produced in Production Example 1.

Production of Ladder-Type Silsesquioxane (Prepolymer) Containing Terminal SiH-Containing Group and Terminal TMS Group In a 50-ml four-necked flask, were charged 12 g of a ladder-type phenylmethylvinylsilsesquioxane containing a vinyl group and a terminal trimethylsilyl group (TMS group) (having a weight-average molecular weight Mw of 3400 and a ratio (molar ratio) of phenyl:methyl:vinyl of 17:68:15), 24 g of 1,1,3,3-tetramethyldisiloxane (supplied by Tokyo Chemical Industry Co., Ltd.), and 10 µl of a 2.0% platinum-cyclovinylsiloxane complex vinylcyclosiloxane solution (supplied by Wako Pure Chemical Industries, Ltd.). Next, the mixture was heated at 70° C. for 8 hours, and the reaction was completed. The reaction mixture was then concentrated on an evaporator and subjected to decompression (evacuation) at 0.2 torr for 3 hours by a vacuum pump. This gave 14.4 g of a ladder-type silsesquioxane containing a terminal SiH-containing group and a terminal TMS group. The ladder-type silsesquioxane had a weight-average molecular weight Mw of 3700 and an (average) SiH content per molecule of 0.11 percent by weight (in terms of hydride weight). FIG. 2 depicts the $^1$H-NMR spectrum of the ladder-type silsesquioxane containing a terminal SiH-containing group and a terminal TMS group.

$^1$H-NMR spectrum of ladder-type silsesquioxane containing terminal SIB-containing group and terminal TMS group
$^1$H-NMR (JEOL ECA (500 MHz, CDCl$_3$)) δ: −0.3-0.3 (br), 4.7 (s), 7.1-7.7 (br)

The above-prepared ladder-type silsesquioxane containing a terminal SiH-containing group and a terminal TMS group corresponds to the "ladder-type silsesquioxane [B2-1]".

Production Example 2

Production of Vinyl-Containing Polyorganosilsesquioxane

In a nitrogen stream, 65 mmol (9.64 g) of vinyltrimethoxysilane, 195 mmol (38.67 g) of phenyltrimethoxysilane, and 8.31 g of methyl isobutyl ketone (MIBK) were charged in a 100-ml flask (reactor) equipped with a thermometer, a stirrer, a reflux condenser, and a nitrogen inlet tube, followed by cooling the mixture down to 10° C. The mixture was combined with 360 mmol (6.48 g) of water and 0.24 g (1.2 mmol in terms of hydrogen chloride) of 5 N hydrochloric acid both added dropwise concurrently over one hour. After the completion of dropwise addition, the mixture (reaction mixture) was held at 10° C. for one hour to allow a hydrolysis-condensation reaction to proceed. The reaction mixture was then diluted with 40 g of MIBK.

Next, the reactor inside temperature was raised to 70° C. At the time point when the temperature reached 70° C., the reaction mixture was combined with 520 mmol (9.36 g) of water, followed by polycondensation reaction in a nitrogen stream for 6 hours.

The reaction mixture after the polycondensation reaction was combined with 130 mmol (21.11 g) of hexamethyldisiloxane, followed by silylation reaction at 70° C. for 3 hours. The reaction mixture was then cooled, washed with water until a lower-layer liquid became neutral, and an upper-layer liquid was separated therefrom. Distilling off of the solvent from the upper-layer liquid at 40° C. and 1 mmHg gave a colorless, transparent liquid product (38.6 g; a vinyl-containing polyorganosilsesquioxane).

Figure 3:
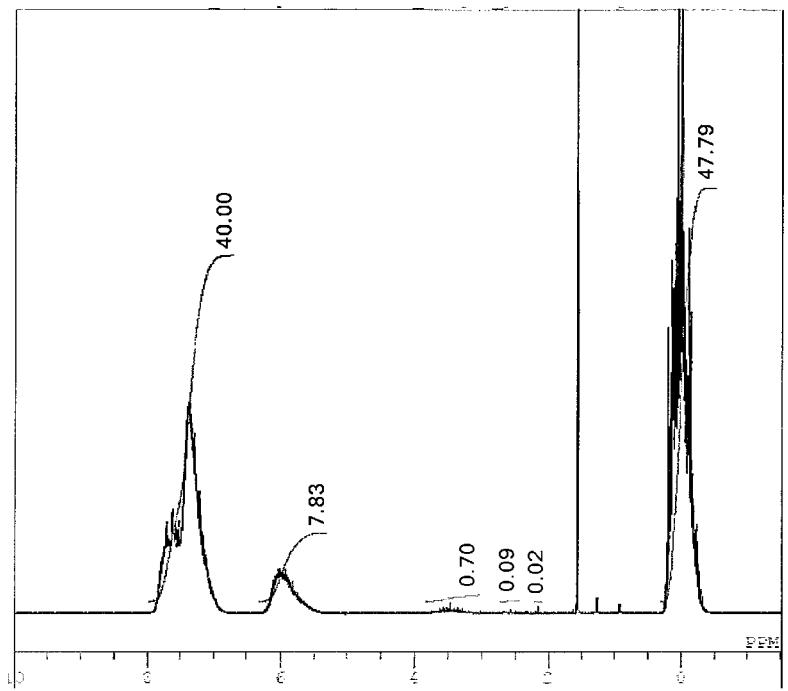
FIG. 3 depicts a $^1$H-NMR spectrum chart of a vinyl-containing polyorganosilsesquioxane produced in Production Example 2.

The product (product after the silylation reaction) had a number-average molecular weight of 1280 and a molecular weight dispersity of 1.13. FIG. 3 depicts the $^1$H-NMR spectrum chart of the product.

The product (product after the silylation reaction) corresponds to the "ladder-type silsesquioxane [A1]".

Production Example 3

Production of Hydrosilyl-Containing Polyorganosilsesquioxane

In a nitrogen stream, 240 mmol (47.59 g) of phenyltrimethoxysilane and 18.48 g of methyl isobutyl ketone (MIBK) were charged in a 100-ml flask (reactor) equipped with a thermometer, a stirrer, a reflux condenser, and a nitrogen inlet tube, followed by cooling the mixture down to 10° C. The mixture was combined with 720 mmol (12.96 g) of water and 0.48 g (2.4 mmol in terms of hydrogen chloride) of 5 N hydrochloric acid both added dropwise concurrently over one hour. After the completion of dropwise addition, the mixture (reaction mixture) was held at 10° C. for one hour to allow a hydrolysis-condensation reaction to proceed. The reaction mixture was then diluted with 80.02 g of MIBK.

Next, the reactor inside temperature was raised to 70° C. At the time point when the temperature reached 70° C., the reaction mixture was combined with 4.81 g (25 mmol in term of hydrogen chloride) of 5 N hydrochloric acid, followed by polycondensation reaction in a nitrogen stream for 5 hours.

The reaction mixture after the polycondensation reaction was combined with 60 mmol (98.06 g) of tetramethyldisiloxane, followed by silylation reaction at 70° C. for 3 hours. The reaction mixture was then cooled, washed with water until a lower-layer liquid became neutral, and an upper-layer liquid was separated therefrom. Distilling off of the solvent from the upper-layer liquid at 40° C. and 1 mmHg gave a colorless, transparent liquid product (35.0 g; a hydrosilyl-containing polyorganosilsesquioxane).

Figure 4:
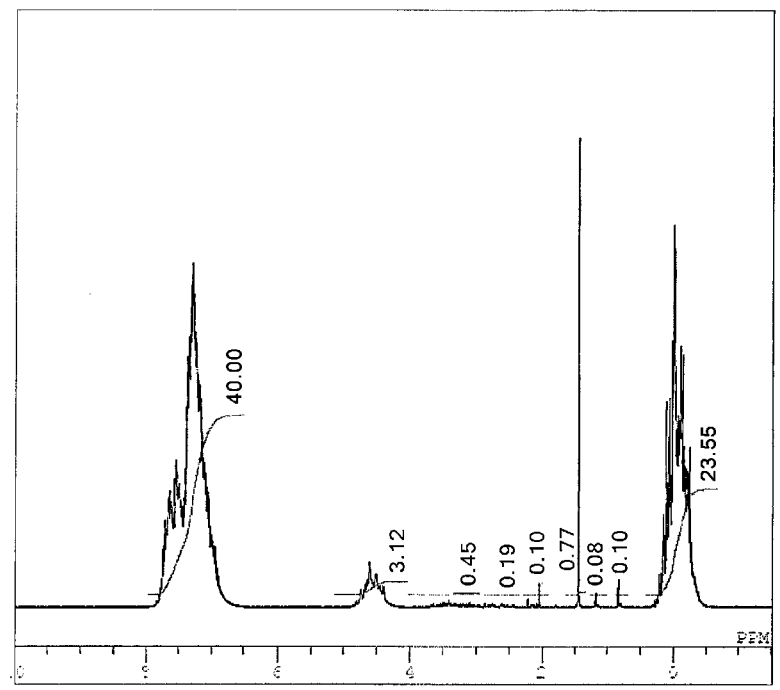
FIG. 4 depicts a $^1$H-NMR spectrum chart of a hydrosilyl-containing polyorganosilsesquioxane produced in Production Example 3.

The product (product after the silylation reaction) had a number-average molecular weight of 813 and a molecular weight dispersity of 1.11. FIG. 4 depicts the ¹H-NMR spectrum chart of the product.

The product (product after the silylation reaction) corresponds to the "ladder-type silsesquioxane [A2]".

Production Example 4

Production of Ladder-Type Silsesquioxane Containing Terminal Vinyl and Trimethylsilyl (TMS) Groups In a 200-ml four-necked flask, were charged 34.07 g of methyltriethoxysilane (supplied by Shin-Etsu Chemical Co., Ltd.), 11.49 g of phenyltriethoxysilane (supplied by Shin-Etsu Chemical Co., Ltd.), and 17.69 g of methyl isobutyl ketone (MIBK), followed by cooling the mixture of them down to 10° C. The mixture was combined with 240 mmol (4.33 g) of water and 0.48 g (2.4 mmol in term of hydrogen chloride) of 5 N hydrochloric acid both added dropwise concurrently over one hour. After the completion of dropwise addition, the mixture was held at 10° C. for one hour. The reaction mixture was then diluted with 80.0 g of MIBK.

Next, the reactor inside temperature was raised to 70° C. At the time point when the temperature reached 70° C., the reaction mixture was combined with 606 mmol (10.91 g) of water, followed by polycondensation reaction in a nitrogen atmosphere for 9 hours. The reaction mixture was further combined with 6.25 g of vinyltriethoxysilane, followed by reaction (aging) for 3 hours.

Subsequently, the reaction mixture was combined with 15.0 g of hexamethyldisiloxane, followed by silylation reaction at 70° C. for 3 hours. The reaction mixture was then cooled, washed with water until a lower-layer liquid became neutral, and an upper-layer liquid was separated therefrom. Subsequent distilling off of the solvent from the upper-layer liquid at 60° C. and 1 mmHg gave 21.0 g of a colorless, transparent liquid product. This was a ladder-type silsesquioxane containing terminal vinyl and TMS groups. The ladder-type silsesquioxane containing terminal vinyl and TMS groups had a weight-average molecular weight (Mw) of 3400, a vinyl content (average content) per molecule of 3.96 percent by weight, and a ratio (molar ratio) of phenyl:methyl:vinyl of 17:68:15.

¹H-NMR spectrum of ladder-type silsesquioxane containing terminal vinyl and TMS groups ¹H-NMR (JEOL ECA500 (500 MHz, CDCl₃)) δ: −0.3-0.3 ppm (br), 5.7-6.2 ppm (br), 7.1-7.7 ppm (br)

The above-prepared ladder-type silsesquioxane containing terminal vinyl and TMS groups corresponds to the "ladder-type silsesquioxane [B1-1]".

Production Example 5

Production of Terminal-Vinyl-Containing Polyorganosilsesquioxane

In a nitrogen stream, 80 mmol (15.86 g) of phenyltrimethoxysilane and 6.16 g of methyl isobutyl ketone (MIBK) were charged in a 100-ml flask (reactor) equipped with a thermometer, a stirrer, a reflux condenser, and a nitrogen inlet tube, followed by cooling the mixture down to 10° C. The mixture was combined with 240 mmol (4.32 g) of water and 0.16 g (2.4 mmol in term of hydrogen chloride) of 5 N hydrochloric acid both added dropwise concurrently over one hour. After the completion of dropwise addition, the mixture (reaction mixture) was held at 10° C. for one hour to allow a hydrolysis-condensation reaction to proceed. The reaction mixture was then diluted with 26.67 g of MIBK.

Next, the reactor inside temperature was raised to 70° C. At the time point when the temperature reached 70° C., the reaction mixture was combined with 0.16 g (25 mmol in term of hydrogen chloride) of 5 N hydrochloric acid, followed by polycondensation reaction in a nitrogen stream for 4 hours.

The reaction mixture after the polycondensation reaction was combined with 60 mmol (11.18 g) of divinyltetramethyldisiloxane and 20 mmol (3.25 g) of hexamethyldisiloxane, followed by silylation reaction at 70° C. for 4 hours. The reaction mixture was then cooled, washed with water until a lower-layer liquid became neutral, and an upper-layer liquid was separated therefrom. Distilling off of the solvent from the upper-layer liquid at 40° C. and 1 mmHg gave a colorless, transparent liquid product (13.0 g; a terminal-vinyl-containing polyorganosilsesquioxane).

The product (product after the silylation reaction) had a number-average molecular weight of 840 and a molecular weight dispersity of 1.06.

The above-prepared terminal-vinyl-containing polyorganosilsesquioxane corresponds to the "ladder-type silsesquioxane [A1]".

Production Example 6

Production of Terminal-Vinyl-Containing Polyorganosilsesquioxane

In a nitrogen stream, 100 mmol (13.72 g) of methyltrimethoxysilane, 5.3 mmol (1.05 g) of phenyltrimethoxysilane, and 41.06 g of methyl isobutyl ketone (MIBK) were charged in a 100-ml flask (reactor) equipped with a thermometer, a stirrer, a reflux condenser, and a nitrogen inlet tube, followed by cooling the mixture down to 10° C. The mixture was combined with 106 mmol (1.91 g) of water and 0.10 g (0.5 mmol in term of hydrogen chloride) of 5 N hydrochloric acid both added dropwise concurrently over one hour. After the completion of dropwise addition, the mixture (reaction mixture) was held at 10° C. for one hour to allow hydrolysis-condensation reaction to proceed.

Next, the reactor inside temperature was raised to 50° C. At the time point when the temperature reached 50° C., the reaction mixture was combined with 0.95 g (53 mmol) of water, followed by polycondensation reaction in a nitrogen stream for 6 hours.

The reaction mixture after the polycondensation reaction was combined with 26.5 mmol (4.94 g) of divinyltetramethyldisiloxane, followed by silylation reaction at 50° C. for 3 hours. The reaction mixture was then cooled, washed with water until a lower-layer liquid became neutral, and an upper-layer liquid was separated therefrom. Distilling off of the solvent from the upper-layer liquid at 40° C. and 1 mmHg gave a colorless, transparent liquid product (10.2 g; a terminal-vinyl-containing polyorganosilsesquioxane).

The product (product after the silylation reaction) had a number-average molecular weight of 874 and a molecular weight dispersity of 1.31.

The above-prepared terminal-vinyl-containing polyorganosilsesquioxane corresponds to the "ladder-type silsesquioxane [A1]".

Example 1

Production of Curable Resin Composition 1 and Cured Product 1

Materials were weighed in a 30-ml screw-capped vial, stirred at room temperature for 2 hours, and yielded a transparent homogeneous solution with good compatibility among individual components. The materials were 2.51 g of the hydrosilyl-containing polyorganosilsesquioxane obtained in Production Example 3; 1.90 g of a ladder-type phenylmethylsilsesquioxane containing a vinyl group and a terminal TMS group (having a weight-average molecular weight Mw of 3400 and a ratio (molar ratio) of phenyl: methyl:vinyl of 17:68:15); 1.90 g of a powdered ladder-type phenylmethylvinylsilsesquioxane (having a weight-average molecular weight Mw of 7000 and a ratio (molar ratio) of phenyl:methyl:vinyl of 17:68:15); 0.189 g of 2,4,6,8-tetravinyl-2,4,6,8-tetramethylcyclotetrasiloxane; and a material prepared by dissolving 0.063 g of allyl diglycidyl isocyanurate (monoallyl diglycidyl isocyanurate; supplied by SHIKOKU CHEMICALS CORPORATION, hereinafter the same) in 0.252 g of 3-glycidyloxypropyltrimethoxysilane.

The solution was combined with 7.4 µl of a 2.0% platinum-cyclovinylsiloxane complex vinylcyclosiloxane solution (supplied by Sigma-Aldrich Co., LLC.), stirred for further 30 minutes, and yielded a curable resin composition 1.

The curable resin composition 1 was applied to a glass plate, heated in an oven at 90° C. for one hour, subsequently heated at 150° C. for 5 hours, and yielded a colorless, transparent cured product 1.

Example 2

Production of Curable Resin Composition 2 and Cured Product 2

Materials were weighed in a 30-ml screw-capped vial, stirred at room temperature for 2 hours, and yielded a transparent homogeneous solution with good compatibility among individual components. The materials were 3.72 g of the ladder-type silsesquioxane containing a terminal SiH-containing group and a terminal TMS group obtained in Production Example 1; 1.30 g of the vinyl-containing polyorganosilsesquioxane obtained in Production Example 2; 1.30 g of a powdered ladder-type phenylmethylvinylsilsesquioxane (having a weight-average molecular weight Mw of 7000 and a ratio (molar ratio) of phenyl:methyl:vinyl of 17:68:15); 0.189 g of 2,4,6,8-tetravinyl-2,4,6,8-tetramethylcyclotetrasiloxane; and a material prepared by dissolving 0.063 g of the allyl diglycidyl isocyanurate in 0.252 g of 3-glycidyloxypropyltrimethoxysilane.

The solution was combined with 1.3 µl of a 2.0% platinum-cyclovinylsiloxane complex vinylcyclosiloxane solution (supplied by Wako Pure Chemical Industries, Ltd.), stirred for further 30 minutes, and yielded a curable resin composition 2.

The curable resin composition 2 was applied to a glass plate, heated in an oven at 90° C. for one hour, subsequently heated at 150° C. for 5 hours, and yielded a colorless, transparent cured product 2.

Example 3

Production of Curable Resin Composition 3 and Cured Product 3

Materials were weighed in a 30-ml screw-capped vial, stirred at room temperature for 2 hours, and yielded a transparent homogeneous solution with good compatibility among individual components. The materials were 2.5 g of the hydrosilyl-containing polyorganosilsesquioxane obtained in Production Example 3; 3.6 g of the vinyl-containing polyorganosilsesquioxane obtained in Production Example 2; 0.184 g of 2,4,6,8-tetravinyl-2,4,6,8-tetramethylcyclotetrasiloxane; and a material prepared by dissolving 0.061 g of the allyl diglycidyl isocyanurate in 0.245 g of 3-glycidyloxypropyltrimethoxysilane.

The solution was combined with 1.3 µl of a 2.0% platinum-cyclovinylsiloxane complex vinylcyclosiloxane solution (supplied by Wako Pure Chemical Industries, Ltd.), stirred for further 30 minutes, and yielded a curable resin composition 3.

The curable resin composition 3 was applied to a glass plate, heated in an oven at 90° C. for one hour, subsequently heated at 150° C. for 5 hours, and yielded a colorless, transparent cured product 3.

Comparative Example 1

Materials were weighed in 30-ml screw-capped vial, stirred for 30 minutes, and yielded a curable resin composition. The materials were 0.100 g of OE-6665A (trade name, supplied by Dow Corning Toray Co., Ltd.) and 2.00 g of OE-6665B (trade name, supplied by Dow Corning Toray Co., Ltd.).

Example 4

Production of Curable Resin Composition 4 and Cured Product 4

Materials were weighed in a 30-ml screw-capped vial, stirred for 30 minutes, and yielded a curable resin composition 4. The materials were 1.327 g of the ladder-type silsesquioxane obtained in Production Example 1; 0.600 g of the polyorganosilsesquioxane obtained in Production Example 5; and 0.2 µl of a 2.0% platinum-cyclovinylsiloxane complex vinylcyclosiloxane solution (supplied by Wako Pure Chemical Industries, Ltd.).

The curable resin composition 4 was applied to a glass plate, heated at 150° C. for 5 hours, and yielded a colorless, transparent cured product 4.

Example 5

Production of Curable Resin Composition 5 and Cured Product 5

Materials were weighed in a 30-ml screw-capped vial, stirred for 30 minutes, and yielded a curable resin composition 5. The materials were 0.856 g of the polyorganosilsesquioxane obtained in Production Example 5; 1.000 g of the polyorganosilsesquioxane obtained in Production Example 3; and 0.2 µl of a 2.0% platinum-cyclovinylsiloxane complex vinylcyclosiloxane solution (supplied by Wako Pure Chemical Industries, Ltd.).

The curable resin composition 5 was applied to a glass plate, heated at 150° C. for 5 hours, and yielded a colorless, transparent cured product 5.

Example 6

Production of Curable Resin Composition 6 and Cured Product 6

Materials were weighed in a 30-ml screw-capped vial, stirred for 30 minutes, and yielded a curable resin composition 6. The materials were 1.327 g of the ladder-type silsesquioxane obtained in Production Example 1; 0.600 g of the polyorganosilsesquioxane obtained in Production Example 5; 0.4 µl of a 2.0% platinum-cyclovinylsiloxane complex vinylcyclosiloxane solution (supplied by Wako Pure Chemical Industries, Ltd.); and a material prepared by dissolving 0.004 g of the monoallyl diglycidyl isocyanurate in 0.015 g of 3-glycidyloxypropyltrimethoxysilane.

The curable resin composition 6 was applied to a glass plate, heated at 150° C. for 5 hours, and yielded a colorless, transparent cured product 6.

Example 7

Production of Curable Resin Composition 7 and Cured Product 7

Materials were weighed in a 30-ml screw-capped vial, stirred for 30 minutes, and yielded a curable resin composition 7. The materials were 0.525 g of the polyorganosilsesquioxane obtained in Production Example 3; 1.200 g of the ladder-type silsesquioxane obtained in Production Example 4; 0.4 µl of a 2.0% platinum-cyclovinylsiloxane complex vinylcyclosiloxane solution (supplied by Wako Pure Chemical Industries, Ltd.); and a material prepared by dissolving 0.003 g of the monoallyl diglycidyl isocyanurate in 0.013 g of 3-glycidyloxypropyltrimethoxysilane.

The curable resin composition 7 was applied to a glass plate, heated at 150° C. for 5 hours, and yielded a colorless, transparent cured product 7.

Example 8

Production of Curable Resin Composition 8 and Cured Product 8

Materials were weighed in a 30-ml screw-capped vial, stirred for 30 minutes, and yielded a curable resin composition 8. The materials were 0.856 g of the polyorganosilsesquioxane obtained in Production Example 5; 1.000 g of the polyorganosilsesquioxane obtained in Production Example 3; 0.2 µl of a 2.0% platinum-cyclovinylsiloxane complex vinylcyclosiloxane solution (supplied by Wako Pure Chemical Industries, Ltd.); and a material prepared by dissolving 0.004 g of the monoallyl diglycidyl isocyanurate in 0.014 g of 3-glycidyloxypropyltrimethoxysilane.

The curable resin composition 8 was applied to a glass plate, heated at 150° C. for 5 hours, and yielded a colorless, transparent cured product 8.

Example 9

Production of Curable Resin Composition 9 and Cured Product 9

Materials were weighed in a 30-ml screw-capped vial, stirred for 30 minutes, and yielded a curable resin composition 9. The materials were 0.90 g of GD1012A (trade name, supplied by Eternal Chemical Co., Ltd.); 1.00 g of GD1012B (trade name, supplied by Eternal Chemical Co., Ltd.); and 0.10 g of the polyorganosilsesquioxane obtained in Production Example 6.

The curable resin composition 9 was applied to a glass plate, heated at 100° C. for one hour, subsequently heated at 150° C. for 4 hours, and yielded a colorless, transparent cured product 9.

Example 10

Production of Curable Resin Composition 10 and Cured Product 10

Materials were weighed in a 30-ml screw-capped vial, stirred for 30 minutes, and yielded a curable resin composition 10. The materials were 0.90 g of GD1012A (trade name, supplied by Eternal Chemical Co., Ltd.); 1.00 g of GD1012B (trade name, supplied by Eternal Chemical Co., Ltd.); 0.02 g of a material prepared by completely dissolving the monoallyl diglycidyl isocyanurate in 3-glycidyloxypropyltrimethoxysilane in a weight ratio (the former to the latter) of 1:4; and 0.10 g of the polyorganosilsesquioxane obtained in Production Example 6.

The curable resin composition 10 was applied to a glass plate, heated at 100° C. for one hour, subsequently heated at 150° C. for 4 hours, and yielded a colorless, transparent cured product 10.

Example 11

Production of Curable Resin Composition 11 and Cured Product 11

Materials were weighed in a 30-ml screw-capped vial, stirred for 30 minutes, and yielded a curable resin composition 11. The materials were 0.90 g of KER2500A (trade name, supplied by Shin-Etsu Chemical Co., Ltd.); 1.00 g of KER2500B (trade name, supplied by Shin-Etsu Chemical Co., Ltd.); and 0.10 g of the polyorganosilsesquioxane obtained in Production Example 6.

The curable resin composition 11 was applied to a glass plate, heated at 100° C. for one hour, subsequently heated at 150° C. for 4 hours, and yielded a colorless, transparent cured product 11.

Example 12

Production of Curable Resin Composition 12 and Cured Product 12

Materials were weighed in a 30-ml screw-capped vial, stirred for 30 minutes, and yielded a curable resin composition 12. The materials were 0.90 g of KER2500A (trade name, supplied by Shin-Etsu Chemical Co., Ltd.); 1.00 g of KER2500B (trade name, supplied by Shin-Etsu Chemical Co., Ltd.); 0.02 g of a material prepared by completely dissolving the monoallyl diglycidyl isocyanurate in 3-glycidyloxypropyltrimethoxysilane in a weight ratio (the former to the latter) of 1:4; and 0.10 g of the polyorganosilsesquioxane obtained in Production Example 6.

The curable resin composition 12 was applied to a glass plate, heated at 100° C. for one hour, subsequently heated at 150° C. for 4 hours, and yielded a colorless, transparent cured product 12.

Example 13

Production of Curable Resin Composition 13 and Cured Product 13

Materials were weighed in a 30-ml screw-capped vial, stirred for 30 minutes, and yielded a curable resin composition 13. The materials were 0.35 g of GD1130A (trade name, supplied by Eternal Chemical Co., Ltd.); 2.00 g of GD1130B (trade name, supplied by Eternal Chemical Co., Ltd.); and 0.15 g of the polyorganosilsesquioxane obtained in Production Example 5.

The curable resin composition 13 was applied to a glass plate, heated at 80° C. for one hour, subsequently heated at 150° C. for 4 hours, and yielded a colorless, transparent cured product 13.

Example 14

Production of Curable Resin Composition 14 and Cured Product 14

Materials were weighed in a 30-ml screw-capped vial, stirred for 30 minutes, and yielded a curable resin composition 14. The materials were 0.35 g of GD1130A (trade name, supplied by Eternal Chemical Co., Ltd.); 2.00 g of GD1130B (trade name, supplied by Eternal Chemical Co., Ltd.); 0.15 g of the polyorganosilsesquioxane obtained in Production Example 5; and 0.013 g of a material prepared by completely dissolving the monoallyl diglycidyl isocyanurate in 3-glycidyloxypropyltrimethoxysilane in a weight ratio (the former to the latter) of 1:4.

The curable resin composition 14 was applied to a glass plate, heated at 80° C. for one hour, subsequently heated at 150° C. for 4 hours, and yielded a colorless, transparent cured product 14.

Example 15

Production of Curable Resin Composition 15 and Cured Product 15

Materials were weighed in a 30-ml screw-capped vial, stirred for 30 minutes, and yielded a curable resin composition 15. The materials were 0.350 g of OE-6630A (trade name, supplied by Dow Corning Toray Co., Ltd.); 2.000 g of OE-6630B (trade name, supplied by Dow Corning Toray Co., Ltd.); and 0.150 g of the polyorganosilsesquioxane obtained in Production Example 5.

The curable resin composition 15 was applied to a glass plate, heated at 150° C. for 2 hours, and yielded a colorless, transparent cured product 15.

Example 16

Production of Curable Resin Composition 16 and Cured Product 16

Materials were weighed in a 30-ml screw-capped vial, stirred for 30 minutes, and yielded a curable resin composition 16. The materials were 0.500 g of OE-6630A (trade name, supplied by Dow Corning Toray Co., Ltd.); 2.000 g of OE-6630B (trade name, supplied by Dow Corning Toray Co., Ltd.); 0.100 g of the polyorganosilsesquioxane obtained in Production Example 5; and 0.025 g of a material prepared by completely dissolving the monoallyl diglycidyl isocyanurate in 3-glycidyloxypropyltrimethoxysilane in a weight ratio (the former to the latter) of 1:4.

The curable resin composition 16 was applied to a glass plate, heated at 150° C. for 2 hours, and yielded a colorless, transparent cured product 16.

Example 17

Production of Curable Resin Composition 17 and Cured Product 17

Materials were weighed in a 30-ml screw-capped vial, stirred for 30 minutes, and yielded a curable resin composition 17. The materials were 0.900 g of ASP-1120A (trade name, supplied by Shin-Etsu Chemical Co., Ltd.); 1.000 g of ASP-1120B (trade name, supplied by Shin-Etsu Chemical Co., Ltd.); and 0.100 g of the polyorganosilsesquioxane obtained in Production Example 5.

The curable resin composition 17 was applied to a glass plate, heated at 100° C. for one hour, subsequently heated at 150° C. for 4 hours, and yielded a colorless, transparent cured product 17.

Example 18

Production of Curable Resin Composition 18 and Cured Product 18

Materials were weighed in a 30-ml screw-capped vial, stirred for 30 minutes, and yielded a curable resin composition 18. The materials were 0.900 g of ASP-1120A (trade name, supplied by Shin-Etsu Chemical Co., Ltd.); 1.000 g of ASP-1120B (trade name, supplied by Shin-Etsu Chemical Co., Ltd.); 0.100 g of the polyorganosilsesquioxane obtained in Production Example 5; and 0.020 g of a material prepared by completely dissolving the monoallyl diglycidyl isocyanurate in 3-glycidyloxypropyltrimethoxysilane in a weight ratio (the former to the latter) of 1:4.

The curable resin composition 18 was applied to a glass plate, heated at 100° C. for one hour, subsequently heated at 150° C. for 4 hours, and yielded a colorless, transparent cured product 18.

Comparative Example 2

Materials were weighed in a 30-ml screw-capped vial, stirred for 30 minutes, and yielded a curable resin composition. The materials were 1.00 g of GD1012A (trade name, supplied by Eternal Chemical Co., Ltd.) and 1.00 g of GD1012B (trade name, supplied by Eternal Chemical Co., Ltd.).

Comparative Example 3

Materials were weighed in a 30-ml screw-capped vial, stirred for 30 minutes, and yielded a curable resin composition. The materials were 1.00 g of KER2500A (trade name, supplied by Shin-Etsu Chemical Co., Ltd.) and 1.00 g of KER2500B (trade name, supplied by Shin-Etsu Chemical Co., Ltd.).

Comparative Example 4

Materials were weighed in a 30-ml screw-capped vial, stirred for 30 minutes, and yielded a curable resin composition. The materials were 0.500 g of GD1130A (trade name, supplied by Eternal Chemical Co., Ltd.) and 2.00 g of GD1130B (trade name, supplied by Eternal Chemical Co., Ltd.).

Comparative Example 5

Materials were weighed in a 30-ml screw-capped vial, stirred for 30 minutes, and yielded a curable resin composition. The materials were 0.500 g of OE-6630A (trade name, supplied by Dow Corning Toray Co., Ltd.) and 2.000 g of OE-6630B (trade name, supplied by Dow Corning Toray Co., Ltd.).

Comparative Example 6

Materials were weighed in a 30-ml screw-capped vial, stirred for 30 minutes, and yielded a curable resin composition. The materials were 1.000 g of ASP-1120A (trade name, supplied by Shin-Etsu Chemical Co., Ltd.) and 1.000 g of ASP-1120B (trade name, supplied by Shin-Etsu Chemical Co., Ltd.).

Comparative Example 7

Materials were weighed in a 30-ml screw-capped vial, stirred for 30 minutes, and yielded a curable resin composition. The materials were 1.00 g of GD1012A (trade name, supplied by Eternal Chemical Co., Ltd.); 1.00 g of GD1012B (trade name, supplied by Eternal Chemical Co., Ltd.); and 0.02 g of a material prepared by completely dissolving the monoallyl diglycidyl isocyanurate in 3-glycidyloxypropyltrimethoxysilane in a weight ratio (the former to the latter) of 1:4.

Comparative Example 8

Materials were weighed in a 30-ml screw-capped vial, stirred for 30 minutes, and yielded a curable resin composition. The materials were 1.00 g of KER2500A (trade name, supplied by Shin-Etsu Chemical Co., Ltd.); 1.00 g of KER2500B (trade name, supplied by Shin-Etsu Chemical Co., Ltd.); and 0.02 g of a material prepared by completely dissolving the monoallyl diglycidyl isocyanurate in 3-glycidyloxypropyltrimethoxysilane in a weight ratio (the former to the latter) of 1:4.

The curable resin compositions obtained in the examples and comparative examples were each subjected to evaluations as follows.

Evaluation: Sulfur Corrosion Test

The curable resin compositions obtained in the examples and comparative examples were each poured into an LED package (TOP LED OP-3, 35 mm by 28 mm, without element), heated for a predetermined time to be thermally cured, and yielded specimens. Heating conditions herein were as in the cured product formation, but the curable resin composition obtained in Comparative Example 1 was heated at 150° C. for 2 hours.

Next, each of the specimens and 0.3 g of a sulfur powder (supplied by KISHIDA CHEMICAL Co., Ltd.) were placed in a 450-ml glass bottle, and the glass bottle was further placed in an aluminum case. The aluminum case was placed in an oven (supplied by Yamato Scientific Co., Ltd., model number DN-64) whose internal temperature was set at 80° C., and whether and how a silver electrode in the LED package were corroded with time from the start of heating (after zero hour) was examined.

Figure 5:
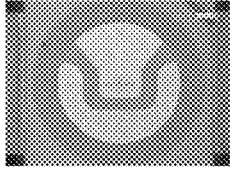
FIG. 5 depicts samples of exemplary electrode appearances corresponding to grades A to D of barrier properties against a corrosive gas.
Figure 5:
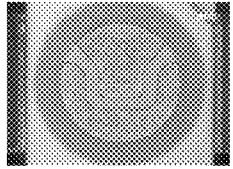
Figure 5:
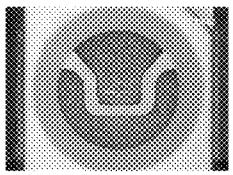
Figure 5:
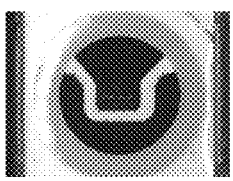

The barrier properties against a corrosive gas of the cured products were evaluated by the four-point scale of A, B, C, and D according to the degree of corrosion of the electrode. The criteria are as follows: A (very excellent barrier properties): the electrode did not change in color; B (excellent barrier properties): the electrode very slightly changed in color; C (good barrier properties): the electrode slightly changed in color; and D (poor barrier properties): the electrode changed in color. FIG. 5 depicts samples of electrode appearances (models) corresponding to grades A to D, respectively, of the barrier properties against a corrosive gas. The results are indicated in Tables 1 to 3. Tables 1 to 3 demonstrate that the cured products (the examples) of curable resin compositions meeting the conditions specified in the present invention (curable resin compositions according to the present invention) had more excellent barrier properties against sulfur gas (corrosive gas) and less caused the corrosion of the silver electrode than the cured products (the comparative examples) of curable resin compositions not meeting the conditions specified in the present invention.

Evaluation: Heat Cycle Test

Each of the curable resin compositions obtained in Examples 9 to 18 and Comparative Examples 2 to 8 was poured into an LED package (TOP LED OP-3, 35 mm by 28 mm, without element), heated for a predetermined time to be thermally cured, and yielded ten specimens per curable resin composition. Heating conditions herein were as in the cured product formation.

To the specimens were applied 1000 cycles of a thermal shock in a thermal shock tester (Compact Thermal Shock Chamber TSE-11A supplied by ESPEC Corporation). In one cycle, each specimen was exposed to an atmosphere at −40° C. for 30 minutes and subsequently exposed to an atmosphere at 100° C. for 30 minutes. The thermal shock resistance of the cured product in each of the specimens was evaluated according to criteria as follows.

Evaluation results are indicated in Tables 2 and 3.

A (very excellent thermal shock resistance): Zero out of the ten specimens suffered from cracking in the cured product;

B (excellent thermal shock resistance): One to four out of the ten specimens suffered from cracking in the cured product; and C (standard-level thermal shock resistance): Five to ten out of the ten specimens suffered from cracking in the cured product.

TABLE 1

| | Sulfur corrosion test | |
|---|---|---|
| | 24 hrs into heating | 48 hrs into heating |
| Example 1 | A | A |
| Example 2 | A | B |
| Example 3 | A | A |
| Comparative Example 1 | C | D |
| Example 4 | B | C |
| Example 5 | A | A |
| Example 6 | A | A |
| Example 7 | B | B |
| Example 8 | A | A |

TABLE 2

| | Sulfur corrosion test 24 hrs into heating | Thermal shock resistance |
|---|---|---|
| Example 9 | A | A |
| Example 10 | B | A |
| Comparative Example 2 | D | A |
| Comparative Example 7 | D | A |
| Example 11 | C | A |
| Example 12 | C | A |
| Comparative Example 3 | D | A |
| Comparative Example 8 | D | A |

TABLE 3

| | Sulfur corrosion test | | |
|---|---|---|---|
| | 24 hrs into heating | 48 hrs into heating | Thermal shock resistance |
| Example 13 | B | C | A |
| Example 14 | A | B | A |
| Comparative Example 4 | A | D | A |
| Example 15 | B | — | B |

TABLE 3-continued

| | Sulfur corrosion test | | Thermal shock resistance |
| --- | --- | --- | --- |
| | 24 hrs into heating | 48 hrs into heating | |
| Example 16 | A | — | B |
| Comparative Example 5 | D | — | B |
| Example 17 | B | — | C |
| Example 18 | A | — | C |
| Comparative Example 6 | C | — | C |

Tables 1 to 3 demonstrate that cured products (the examples) of curable resin compositions meeting the conditions specified in the present invention offered better barrier properties against a corrosive gas than cured products (the comparative examples) not including the polyorganosilsesquioxane [A].

More specifically, comparisons in data in Table 1 between Examples 1 to 8 and Comparative Example 1 verify that the systems including a polyorganosilsesquioxane [A] gave cured products that exhibited remarkably excellent gas barrier properties (barrier properties against a corrosive gas). Comparisons in data in Table 1 between Example 4 and Example 7 demonstrate that the addition of an isocyanuric acid compound [D] contributed to still better gas barrier properties of the cured product.

Examples 9 to 12 and Comparative Example 3, 7, and 8 in Table 2 were systems each including a silicone [C] containing a side-chain methyl group. These systems each offered excellent thermal shock resistance, but, upon the absence of the polyorganosilsesquioxanes [A], had poor gas barrier properties. In contrast, the data demonstrate that the systems (Examples 9 to 12) each including the polyorganosilsesquioxane [A] and the silicone [C] containing a side-chain methyl group offered much better gas barrier properties of the cured products; and that, among them, the systems of Examples 9 and 10 effectively offered still much better gas barrier properties.

Examples 13 to 18 and Comparative Examples 4 to 6 in Table 3 were systems each including a silicone [C] containing a side-chain phenyl group. The data demonstrate that, among them, the systems including a polyorganosilsesquioxane [A] in addition to the silicone [C] containing a side-chain phenyl group, and the systems further including an isocyanuric acid compound [D] offered much better improved gas barrier properties of the cured products. In particular, the systems of Examples 13 and 14 excelled both in thermal shock resistance and gas barrier properties of the cured products. Comparisons of them with the system of Comparative Example 4 demonstrate that the addition of the polyorganosilsesquioxane [A] retarded the time to electrode corrosion and offered much better gas barrier properties; and that the addition of the isocyanuric acid compound [D] helped the effect to be still outstanding.

INDUSTRIAL APPLICABILITY

The curable resin composition according to the present invention is preferably usable as a resin composition for optical semiconductor encapsulation. The curable resin compositions according to the present invention is also preferably usable in optical-related and semiconductor-related uses such as functional coating agents, heat-resistant plastic lenses, transparent appliances, adhesives (e.g., heat-resistant transparent adhesives), optical semiconductor encapsulants (encapsulating agents), electrical insulating materials (e.g., insulating films), laminated sheets, coatings, inks, coating materials, sealants, resists, composite materials, transparent substrates, transparent sheets, transparent films, optical elements, optical lenses, optical members, stereolithographic materials, electronic papers, touch-screen panels, solar cell substrates, optical waveguides, light guide panels, and holographic memories.

The invention claimed is:

1. A curable resin composition comprising:
 a compound (U) containing an aliphatic carbon-carbon unsaturated bond; and
 a compound (H) containing a hydrosilyl group;
 the compound (U) being at least one ladder-type silsesquioxane [A1] containing an aliphatic carbon-carbon unsaturated bond and having a number-average molecular weight from 500 to 1500 and a molecular weight dispersity (Mw/Mn) from 1.00 to 1.40 as determined by gel permeation chromatography and calibrated with a polystyrene standard; and optionally further comprising at least one compound selected from the group consisting of:
   a ladder-type silsesquioxane [B1] containing an aliphatic carbon-carbon unsaturated bond, other than the ladder-type silsesquioxane [A1];
   a linear or branched silicone [C1] containing an aliphatic carbon-carbon unsaturated bond; and
   a cyclic siloxane [E1] containing an aliphatic carbon-carbon unsaturated bond;
 the compound (H) being at least one ladder-type silsesquioxane [A2] containing a hydrosilyl group and having a number-average molecular weight from 500 to 1500 and a molecular weight dispersity (Mw/Mn) from 1.00 to 1.40 as determined by gel permeation chromatography and calibrated with a polystyrene standard; and optionally further comprising at least one compound selected from the group consisting of:
   a ladder-type silsesquioxane [B2] containing a hydrosilyl group, other than the ladder-type silsesquioxane [A2];
   a linear or branched silicone [C2] containing a hydrosilyl group; and
   a cyclic siloxane [E2] containing a hydrosilyl group;
 the curable resin composition further comprising an isocyanuric acid compound [D] represented by Formula (d-2):

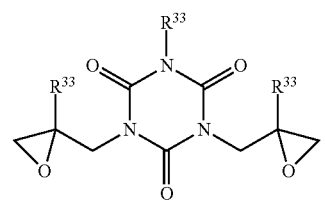

(d-2)

wherein $R^{32}$ represents a monovalent group containing an aliphatic carbon-carbon unsaturated bond; and $R^{33}$ is, in each occurrence identically or differently, selected from a hydrogen atom and a $C_1$-$C_8$ linear or branched alkyl group.

2. A curable resin composition comprising:
 a compound (U) containing an aliphatic carbon-carbon unsaturated bond; and
 a compound (H) containing a hydrosilyl group;
 the compound (U) being at least one ladder-type silsesquioxane [A1] containing an aliphatic carbon-carbon unsaturated bond and having a number-average molecular weight from 500 to 1500 and a molecular weight dispersity (Mw/Mn) from 1.00 to 1.40 as determined by gel permeation chromatography and calibrated with a polystyrene standard; and optionally further comprising at least one compound selected from the group consisting of:
- a ladder-type silsesquioxane [B1] containing an aliphatic carbon-carbon unsaturated bond, other than the ladder-type silsesquioxane [A1];
- a linear or branched silicone [C1] containing an aliphatic carbon-carbon unsaturated bond; and
- a cyclic siloxane [E1] containing an aliphatic carbon-carbon unsaturated bond;

the compound (H) being at least one ladder-type silsesquioxane [A2] containing a hydrosilyl group and having a number-average molecular weight from 500 to 1500 and a molecular weight dispersity (Mw/Mn) from 1.00 to 1.40 as determined by gel permeation chromatography and calibrated with a polystyrene standard; and optionally further comprising at least one compound selected from the group consisting of:
- a ladder-type silsesquioxane [B2] containing a hydrosilyl group, other than the ladder-type silsesquioxane [A2];
- a linear or branched silicone [C2] containing a hydrosilyl group; and
- a cyclic siloxane [E2] containing a hydrosilyl group; and the curable resin composition comprising at least one ladder-type silsesquioxane selected from the group consisting of ladder-type silsesquioxane [B1] and ladder-type silsesquioxane [B2], wherein the ladder-type silsesquioxane [B1] is a ladder-type silsesquioxane comprising a polyorganosilsesquioxane residue in part or all of molecular chain terminals of the ladder-type silsesquioxane, the polyorganosilsesquioxane residue comprising a unit structure represented by Formula (b-1) and a unit structure represented by Formula (b-2):

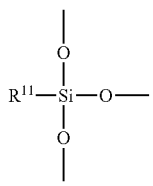

(b-1)

wherein $R^{11}$ represents a monovalent group containing an aliphatic carbon-carbon double bond;

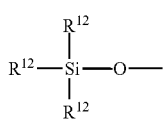

(b-2)

wherein $R^{12}$ represents, in each occurrence identically or differently, a monovalent hydrocarbon group, and wherein the ladder-type silsesquioxane [B2] is a ladder-type silsesquioxane comprising a polyorganosilsesquioxane residue in part or all of molecular chain terminals of the ladder-type silsesquioxane, the polyorganosilsesquioxane residue comprising a unit structure represented by Formula (b-3) and a unit structure represented by Formula (b-4):

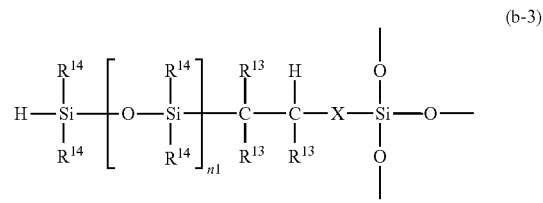

(b-3)

wherein X is selected from a single bond and a linkage group; $R^{13}$ is, in each occurrence identically or differently, selected from a hydrogen atom, a halogen atom, a monovalent organic group, a monovalent oxygen-containing group, a monovalent nitrogen-containing group, and a monovalent sulfur-containing group; $R^{14}$ is, in each occurrence identically or differently, selected from a hydrogen atom, a halogen atom, a monovalent organic group, a monovalent oxygen-containing group, a monovalent nitrogen-containing group, and a monovalent sulfur-containing group; and n1 represents an integer from 1 to 100:

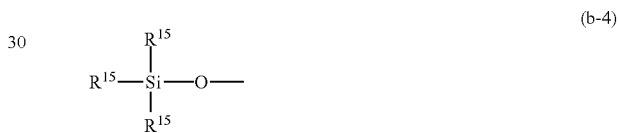

(b-4)

wherein $R^{15}$ represents, in each occurrence identically or differently, a monovalent hydrocarbon group.

3. The curable resin composition according to claim 2, further comprising an isocyanuric acid compound [D] represented by Formula (d-1):

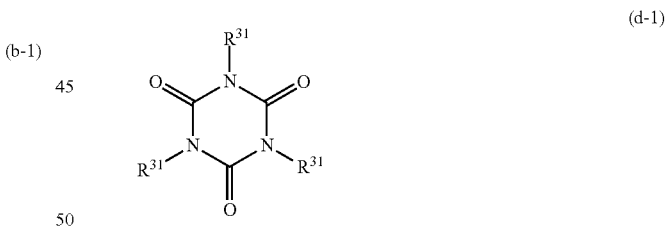

(d-1)

wherein $R^{31}$ represents, in each occurrence identically or differently, a monovalent organic group having a carbon atom at a bonding site with the nitrogen atom indicated in the formula, where at least one occurrence of $R^{31}$ is a monovalent group containing an aliphatic carbon-carbon unsaturated bond.

4. The curable resin composition according to claim 1 or 2, wherein:
the curable resin composition comprises the ladder-type silsesquioxane [B1]; and
the ladder-type silsesquioxane [B1] is a ladder-type silsesquioxane comprising a polyorganosilsesquioxane residue in part or all of molecular chain terminals of the ladder-type silsesquioxane, the polyorganosilsesquioxane residue comprising a unit structure represented by Formula (b-1) and a unit structure represented by Formula (b-2):

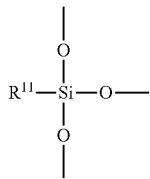

(b-1)

wherein $R^{11}$ represents a monovalent group containing an aliphatic carbon-carbon double bond;

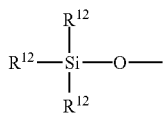

(b-2)

wherein $R^{12}$ represents, in each occurrence identically or differently, a monovalent hydrocarbon group.

5. The curable resin composition according to claim 1 or 2, wherein:
the curable resin composition comprises the ladder-type silsesquioxane [B2]; and
the ladder-type silsesquioxane [B2] is a ladder-type silsesquioxane comprising a polyorganosilsesquioxane residue in part or all of molecular chain terminals of the ladder-type silsesquioxane, the polyorganosilsesquioxane residue comprising a unit structure represented by Formula (b-3) and a unit structure represented by Formula (b-4):

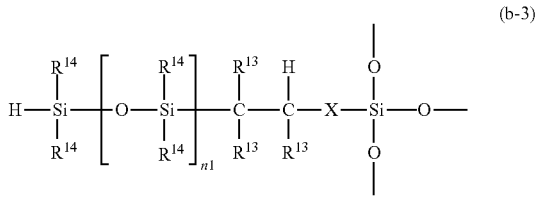

(b-3)

wherein X is selected from a single bond and a linkage group; $R^{13}$ is, in each occurrence identically or differently, selected from a hydrogen atom, a halogen atom, a monovalent organic group, a monovalent oxygen-containing group, a monovalent nitrogen-containing group, and a monovalent sulfur-containing group; $R^{14}$ is, in each occurrence identically or differently, selected from a hydrogen atom, a halogen atom, a monovalent organic group, a monovalent oxygen-containing group, a monovalent nitrogen-containing group, and a monovalent sulfur-containing group; and n1 represents an integer from 1 to 100;

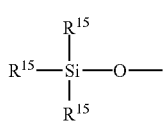

(b-4)

wherein $R^{15}$ represents, in each occurrence identically or differently, a monovalent hydrocarbon group.

6. The curable resin composition according to claim 1 or 2, wherein:
the curable resin composition comprises the silicone [C1]; and
the silicone [C1] is a silicone comprising a structure represented by Formula (c-1a):

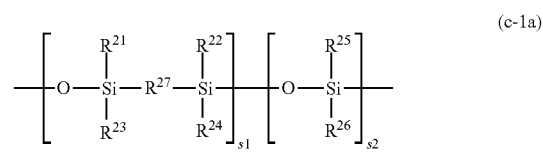

(c-1a)

wherein $R^{21}$ to $R^{26}$ are, in each occurrence identically or differently, selected from a hydrogen atom, a monovalent hydrocarbon group, and a monovalent heterocyclic group, where at least one occurrence of at least one of $R^{21}$ to $R^{26}$ is a monovalent group containing an aliphatic carbon-carbon unsaturated bond; $R^{27}$ represents, in each occurrence independently, a divalent hydrocarbon group; and s1 and s2 independently represent an integer of 1 or more.

7. The curable resin composition according to claim 6, wherein $R^{21}$ to $R^{26}$ in Formula (c-1a) are, in each occurrence identically or differently, selected from a methyl group and a monovalent group containing an aliphatic carbon-carbon unsaturated bond.

8. The curable resin composition according to claim 6, wherein $R^{21}$ to $R^{26}$ in Formula (c-1a) are, in each occurrence identically or differently, selected from a phenyl group and a monovalent group containing an aliphatic carbon-carbon unsaturated bond.

9. The curable resin composition according to claim 1 or 2, wherein:
the curable resin composition comprises the silicone [C2]; and
the silicone [C2] is a silicone comprising a structure represented by Formula (c-1b):

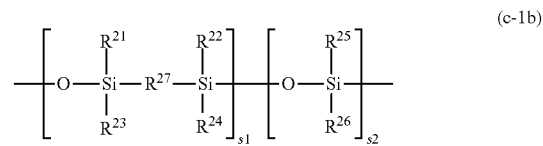

(c-1b)

wherein $R^{21}$ to $R^{26}$ are, in each occurrence identically or differently, selected from a hydrogen atom, a monovalent hydrocarbon group, and a monovalent heterocyclic group, where at least one occurrence of at least one of $R^{21}$ to $R^{26}$ is a hydrogen atom; $R^{27}$ represents, in each occurrence independently, a divalent hydrocarbon group; and s1 and s2 independently represent an integer of 1 or more.

10. The curable resin composition according to claim 9, wherein $R^{21}$ to $R^{26}$ in Formula (c-1b) are, in each occurrence identically or differently, selected from a hydrogen atom, a methyl group, and a monovalent group containing an aliphatic carbon-carbon unsaturated bond.

11. The curable resin composition according to claim 9, wherein $R^{21}$ to $R^{26}$ in Formula (c-1b) are, in each occurrence identically or differently, selected from a hydrogen atom, a phenyl group, and a monovalent group containing an aliphatic carbon-carbon unsaturated bond.

12. The curable resin composition according to claim 9, wherein the curable resin composition comprises both the silicone comprising the structure represented by Formula (c-1a) and the silicone comprising the structure represented by Formula (c-1 b):

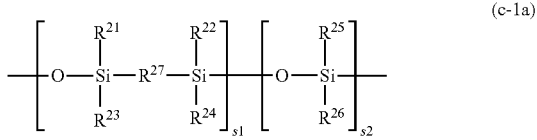

(c-1a)

wherein $R^{21}$ to $R^{26}$ are, in each occurrence identically or differently, selected from a hydrogen atom, a monovalent hydrocarbon group, and a monovalent heterocyclic group, where at least one occurrence of at least one of $R^{21}$ to $R^{26}$ is a monovalent group containing an aliphatic carbon-carbon unsaturated bond; $R^{27}$ represents, in each occurrence independently, a divalent hydrocarbon group; and s1 and s2 independently represent an integer of 1 or more.

13. The curable resin composition according to claim 1 or 2, further comprising a condensation compound [F] of a compound represented by Formula (f-1) with a compound represented by Formula (f-2):

(f-1)

wherein $R^{51}$ and $R^{52}$ represent, in each occurrence identically or differently, a monovalent hydrocarbon group;

(f-2)

wherein $R^{53}$ and $R^{54}$ represent, in each occurrence identically or differently, a monovalent hydrocarbon group; and $R^{55}$ represents a monovalent group containing an aliphatic carbon-carbon unsaturated bond.

14. The curable resin composition according to claim 1 or 2, further comprising a hydrosilylation catalyst.

15. The curable resin composition according to claim 3, wherein the isocyanuric acid compound [D] is at least one compound selected from the group consisting of:

compounds represented by Formula (d-2):

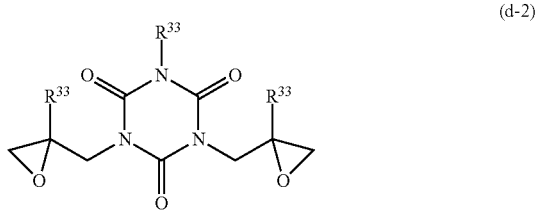

(d-2)

wherein $R^{32}$ represents a monovalent group containing an aliphatic carbon-carbon unsaturated bond; and $R^{33}$ is, in each occurrence identically or differently, selected from a hydrogen atom and a $C_1$-$C_8$ linear or branched alkyl group;

compounds represented by Formula (d-3):

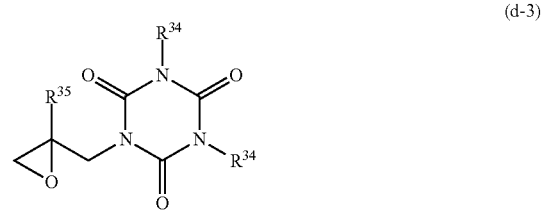

(d-3)

wherein $R^{34}$ represents, in each occurrence identically or differently, a monovalent group containing an aliphatic carbon-carbon unsaturated bond; and $R^{35}$ is selected from a hydrogen atom and a $C_1$-$C_8$ linear or branched alkyl group; and compounds represented by Formula (d-4):

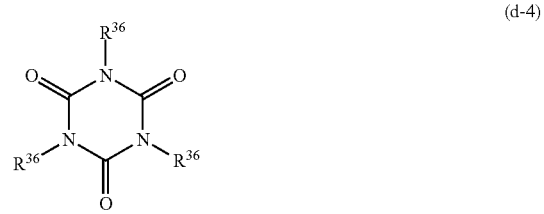

(d-4)

wherein $R^{36}$ represents, in each occurrence identically or differently, a monovalent group containing an aliphatic carbon-carbon unsaturated bond.

16. The curable resin composition according to claim 1, wherein the isocyanuric acid compound [D] is at least one compound selected from the group consisting of: monoallyl diglycidyl isocyanurate, 1-allyl-3,5-bis(2-methylepoxypropyl)-isocyanurate, 1-(2-methylpropenyl)-3,5-diglycidyl-isocyanurate, and 1-(2-methylpropenyl)-3,5-bis(2-methylepoxypropyl)-isocyanurate.

17. The curable resin composition according to claim 1 or 2, further comprising a silane coupling agent.

18. The curable resin composition according to claim 1 or 2, as a resin composition for optical semiconductor encapsulation.

19. A cured product of the curable resin composition of claim 1 or 2.

20. An encapsulating agent comprising the curable resin composition of claim 1 or 2.

21. An optical semiconductor device comprising an optical semiconductor element encapsulated with the encapsulating agent of claim 20.

22. A curable resin composition comprising:
a compound (U) containing an aliphatic carbon-carbon unsaturated bond; and
a compound (H) containing a hydrosilyl group;
the compound (U) being at least one ladder-type silsesquioxane [A1] containing an aliphatic carbon-carbon unsaturated bond and having a number-average molecular weight from 500 to 1500 and a molecular weight dispersity (Mw/Mn) from 1.00 to 1.40 as determined by gel permeation chromatography and calibrated with a polystyrene standard;

and optionally further comprising at least one compound selected from the group consisting of:
  a ladder-type silsesquioxane [B1] containing an aliphatic carbon-carbon unsaturated bond, other than the ladder-type silsesquioxane [A1];
  a linear or branched silicone [C1] containing an aliphatic carbon-carbon unsaturated bond; and
  a cyclic siloxane [E1] containing an aliphatic carbon-carbon unsaturated bond;
the compound (H) being at least one ladder-type silsesquioxane [A2] containing a hydrosilyl group and having a number-average molecular weight from 500 to 1500 and a molecular weight dispersity (Mw/Mn) from 1.00 to 1.40 as determined by gel permeation chromatography and calibrated with a polystyrene standard;
and optionally further comprising at least one compound selected from the group consisting of:
  a ladder-type silsesquioxane [B2] containing a hydrosilyl group, other than ladder-type silsesquioxane [A2];
  a linear or branched silicone [C2] containing a hydrosilyl group; and
  a cyclic siloxane [E2] containing a hydrosilyl group;
the curable resin composition comprising
at least one silicone selected from the group consisting of the silicone [C1] and the silicone [C2]; and
the curable resin composition further comprising an isocyanuric acid compound [D] represented by Formula (d-1):

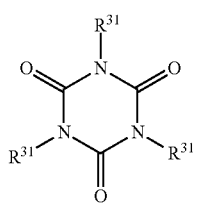

(d-1)

wherein $R^{31}$ represents, in each occurrence identically or differently, a monovalent organic group having a carbon atom at a bonding site with the nitrogen atom indicated in the formula, where at least one occurrence of $R^{31}$ is a monovalent group containing an aliphatic carbon-carbon unsaturated bond,
wherein the silicone [C1] is a silicone comprising a structure represented by Formula (c-1a):

[Chem. 5]

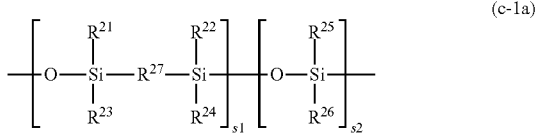

(c-1a)

wherein $R^{21}$ to $R^{26}$ are, in each occurrence identically or differently, selected from a hydrogen atom, a monovalent hydrocarbon group, and a monovalent heterocyclic group, where at least one occurrence of at least one of $R^{21}$ to $R^{26}$ is a monovalent group containing an aliphatic carbon-carbon unsaturated bond; $R^{27}$ represents, in each occurrence independently, a divalent hydrocarbon group; and s1 and s2 independently represent an integer of 1 or more, and
wherein the silicone [C2] is a silicone comprising a structure represented by Formula (c-1b):

[Chem. 6]

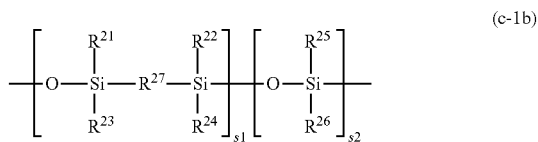

(c-1b)

wherein $R^{21}$ to $R^{26}$ are, in each occurrence identically or differently, selected from a hydrogen atom, a monovalent hydrocarbon group, and a monovalent heterocyclic group, where at least one occurrence of at least one of $R^{21}$ to $R^{26}$ is a hydrogen atom; $R^{27}$ represents, in each occurrence independently, a divalent hydrocarbon group; and s1 and s2 independently represent an integer of 1 or more.

23. A curable resin composition comprising:
  a compound (U) containing an aliphatic carbon-carbon unsaturated bond; and
  a compound (H) containing a hydrosilyl group;
  the compound (U) being at least one ladder-type silsesquioxane [A1] containing an aliphatic carbon-carbon unsaturated bond and having a number-average molecular weight from 500 to 1500 and a molecular weight dispersity (Mw/Mn) from 1.00 to 1.40 as determined by gel permeation chromatography and calibrated with a polystyrene standard;
  and optionally further comprising at least one compound selected from the group consisting of:
    a ladder-type silsesquioxane [B1] containing an aliphatic carbon-carbon unsaturated bond, other than the ladder-type silsesquioxane [A1];
    a linear or branched silicone [C1] containing an aliphatic carbon-carbon unsaturated bond; and
    a cyclic siloxane [E1] containing an aliphatic carbon-carbon unsaturated bond;
  the compound (H) being at least one ladder-type silsesquioxane [A2] containing a hydrosilyl group and having a number-average molecular weight from 500 to 1500 and a molecular weight dispersity (Mw/Mn) from 1.00 to 1.40 as determined by gel permeation chromatography and calibrated with a polystyrene standard;
  and optionally further comprising at least one compound selected from the group consisting of:
    a ladder-type silsesquioxane [B2] containing a hydrosilyl group, other than the ladder-type silsesquioxane [A2];
    a linear or branched silicone [C2] containing a hydrosilyl group; and
    a cyclic siloxane [E2] containing a hydrosilyl group; and the curable resin composition comprising at least one silicone selected from the group consisting of the silicone [C1] and the silicone [C2], wherein the silicone [C1] is a silicone comprising a structure represented by Formula (c-1a):

[Chem. 5]

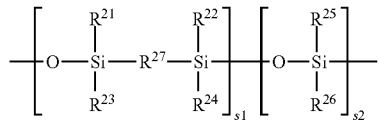
(c-1a)

wherein $R^{21}$ to $R^{26}$ are, in each occurrence identically or differently, selected from a hydrogen atom, a monovalent hydrocarbon group, and a monovalent heterocyclic group, where at least one occurrence of at least one of $R^{21}$ to $R^{26}$ is a monovalent group containing an aliphatic carbon-carbon unsaturated bond; $R^{27}$ represents, in each occurrence independently, a divalent hydrocarbon group; and s1 and s2 independently represent an integer of 1 or more, and wherein the silicone [C2] is a silicone comprising a structure represented by Formula (c-1b):

[Chem. 6]

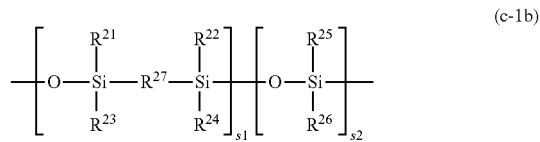
(c-1b)

wherein $R^{21}$ to $R^{26}$ are, in each occurrence identically or differently, selected from a hydrogen atom, a monovalent hydrocarbon group, and a monovalent heterocyclic group, where at least one occurrence of at least one of $R^{21}$ to $R^{26}$ is a hydrogen atom; $R^{27}$ represents, in each occurrence independently, a divalent hydrocarbon group; and s1 and s2 independently represent an integer of 1 or more.

* * * * *